(12) United States Patent
Kato

(10) Patent No.: US 9,496,044 B2
(45) Date of Patent: Nov. 15, 2016

(54) SEMICONDUCTOR DEVICE

(71) Applicant: Renesas Electronics Corporation, Tokyo (JP)

(72) Inventor: Tamiyu Kato, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 14/909,965

(22) PCT Filed: Aug. 15, 2013

(86) PCT No.: PCT/JP2013/071955
§ 371 (c)(1),
(2) Date: Feb. 3, 2016

(87) PCT Pub. No.: WO2015/022742
PCT Pub. Date: Feb. 19, 2015

(65) Prior Publication Data
US 2016/0180941 A1 Jun. 23, 2016

(51) Int. Cl.
*G11C 7/00* (2006.01)
*G11C 16/14* (2006.01)
*G11C 16/06* (2006.01)
(Continued)

(52) U.S. Cl.
CPC ............ *G11C 16/14* (2013.01); *G11C 16/0408* (2013.01); *G11C 16/06* (2013.01); *G11C 16/24* (2013.01)

(58) Field of Classification Search
CPC ..... G11C 16/0441; G11C 16/28; G11C 7/04; G11C 16/04; G11C 16/26; G11C 13/0007; G11C 13/0069; G11C 13/0097; G11C 16/0483; G11C 16/24; G11C 16/344; G11C 16/3445
See application file for complete search history.

(56) References Cited

U.S. PATENT DOCUMENTS

| 6,507,522 B2 | 1/2003 | Lee et al. |
| 6,717,860 B1 | 4/2004 | Fujiwara |
| 6,870,765 B2 | 3/2005 | Fujiwara |

(Continued)

FOREIGN PATENT DOCUMENTS

| JP | 2001-085546 A | 3/2001 |
| JP | 2001-307492 A | 11/2001 |

(Continued)

OTHER PUBLICATIONS

International Search Report (ISR) (PCT Form PCT/ISA/210), in PCT/JP2013/071955, dated Oct. 15, 2013.

*Primary Examiner* — Hien Nguyen
(74) *Attorney, Agent, or Firm* — McGinn IP Law Group, PLLC

(57) ABSTRACT

A memory array (101) includes a plurality of twin cells (104), each of which is composed of a first memory element (102) and a second memory element (103) which are each electrically rewritable and configured to memorize binary data according to a difference in threshold voltages therebetween. A power supply control circuit (105), upon receiving a request for erasing data in a twin cell, increases both the threshold voltage of the first memory element (102) and the threshold voltage of the second memory element (103) during the pre-writing, and after the pre-writing, differentiates the voltage of a first bit line (BL) which is connected to the first memory element (102) and the voltage of a second bit line (/BL) which is connected to the second memory element (103) during the application of erase pulse.

12 Claims, 39 Drawing Sheets

(51) Int. Cl.
*G11C 16/04* (2006.01)
*G11C 16/24* (2006.01)

(56) References Cited

U.S. PATENT DOCUMENTS

| | | |
|---|---|---|
| 2001/0043492 A1 | 11/2001 | Lee et al. |
| 2004/0156240 A1 | 8/2004 | Fujiwara |
| 2008/0089146 A1 | 4/2008 | Fujito et al. |
| 2010/0080058 A1 | 4/2010 | Fujito et al. |
| 2011/0208904 A1 | 8/2011 | Fujito et al. |
| 2012/0033495 A1* | 2/2012 | Kato .................... G11C 16/344 365/185.05 |

FOREIGN PATENT DOCUMENTS

| | | |
|---|---|---|
| JP | 2008-117510 A | 5/2008 |
| JP | 2013-073640 A | 4/2013 |

* cited by examiner

FIG.5
(a)
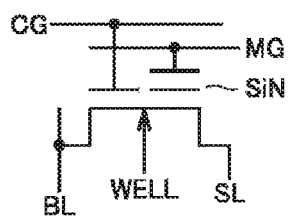
| | BL | CG | MG | SL | WELL | |
|---|---|---|---|---|---|---|
| READ | 1.5V | 1.5V | 0V | 0V | 0V | |
| INCREASE Vth | 0V | 1.5V | 10V | 6V | 0V | (FOR EACH BIT) |
| DECREASE Vth | VF/VS | 0V | -10V | 6V | 0V | (BATCH) |
(b)
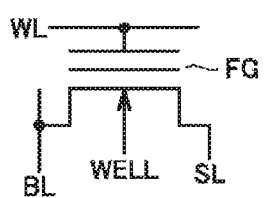
| | BL | WL | SL | WELL | |
|---|---|---|---|---|---|
| READ | 1.5V | 1.5V | 0V | 0V | |
| INCREASE Vth | 6V | 10V | 0V | 0V | (FOR EACH BIT) |
| DECREASE Vth | 10V | -10V | 10V | 10V | (BATCH) |
(c)
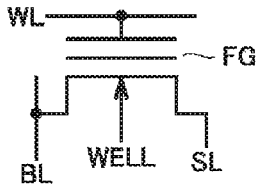
| | BL | WL | SL | WELL | |
|---|---|---|---|---|---|
| READ | 1.5V | 1.5V | 0V | 0V | |
| INCREASE Vth | -10V | 10V | -10V | -10V | (BATCH) |
| DECREASE Vth | 10V | -10V | 0V | 0V | (FOR EACH BIT) |

FIG.7
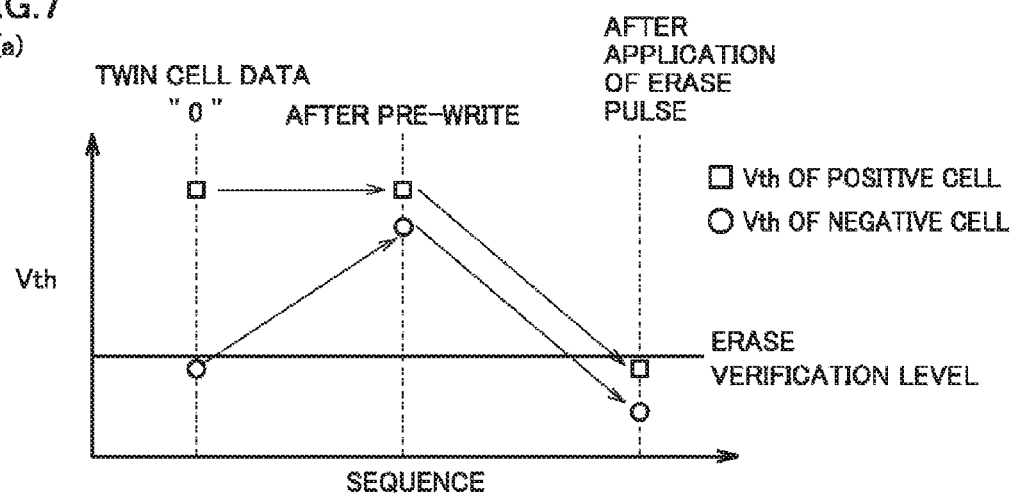
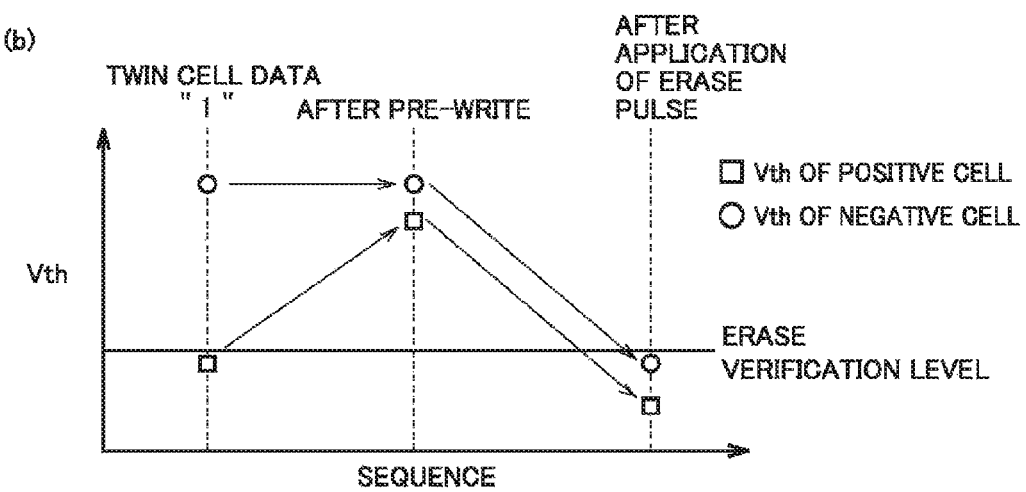

FIG.9
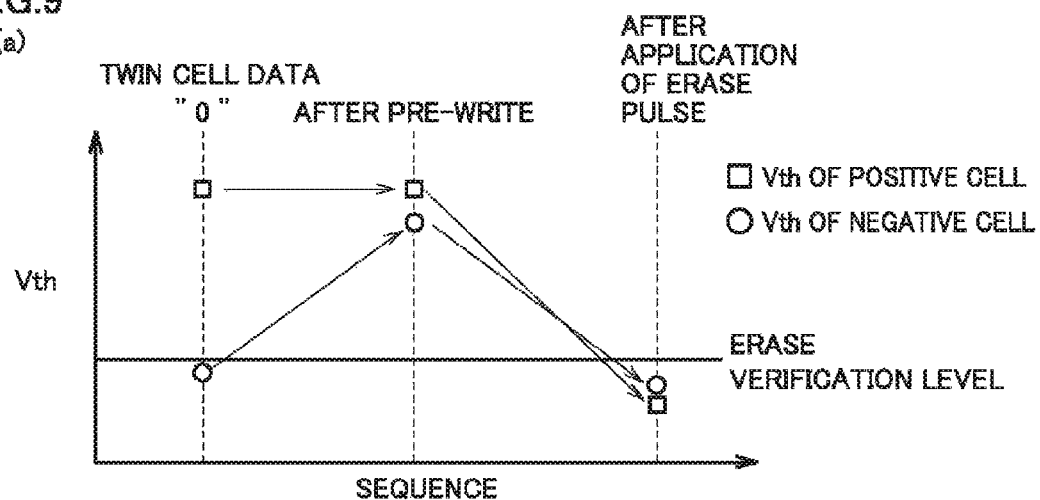
(a)
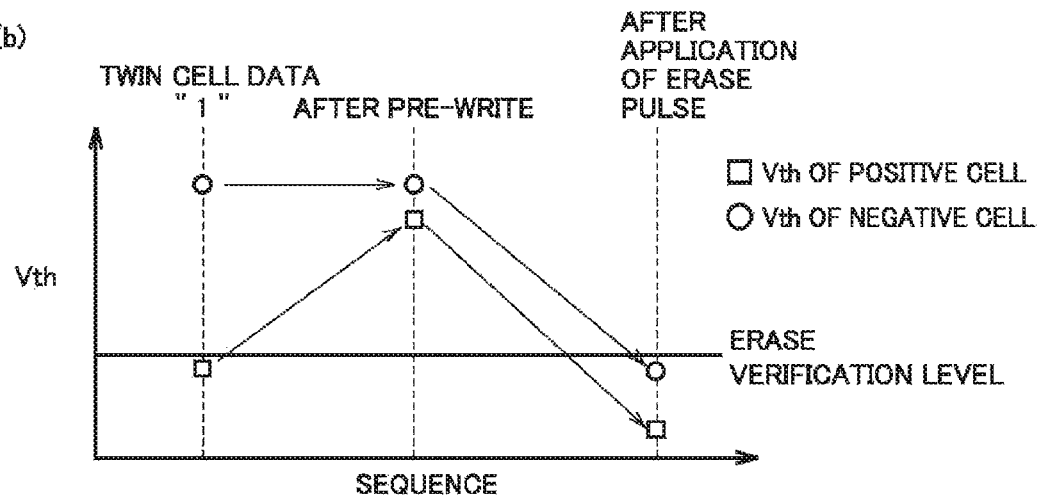
(b)

FIG.39
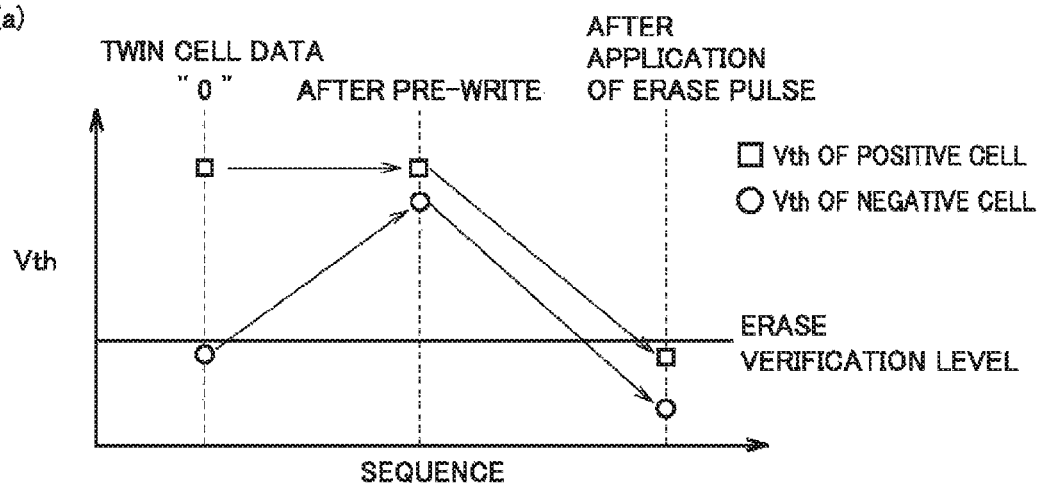
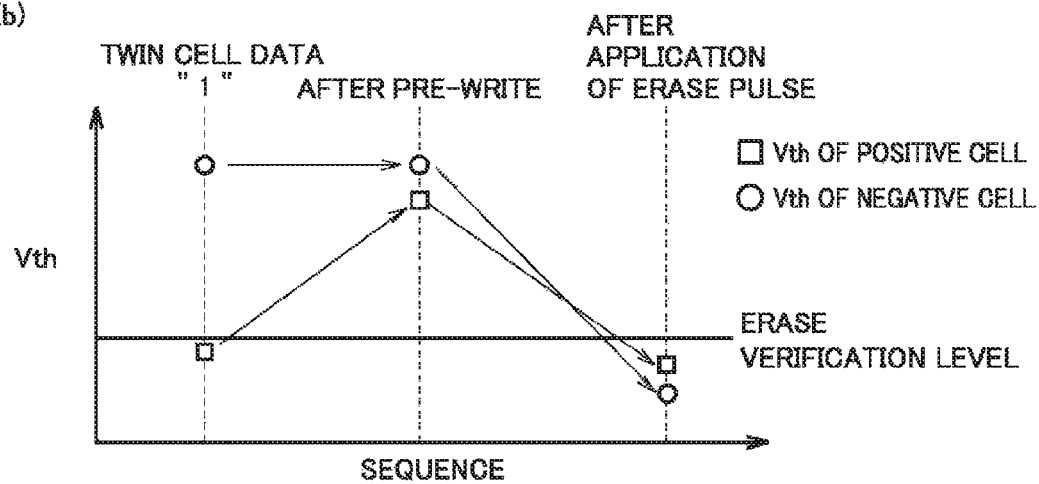

SEMICONDUCTOR DEVICE

TECHNICAL FIELD

The present invention relates to a semiconductor device such as one including two non-volatile memory cells for memorizing complementary data.

BACKGROUND ART

In two non-volatile memory cells (MC1, MC2) for memorizing complementary data, after the data therein is erased, the threshold voltage of both of the two non-volatile memory cells (MC1, MC2) will drop. However, it is assumed that the threshold voltage difference between the two non-volatile memory cells in a writing state before erasure of the data may remain after the data is erased. Therefore, even though the data is erased, the data written in before erasure may be read out again, leading to a security problem.

To solve this problem, conventionally, there is known such a technique that uniformizes the threshold voltage of each of the nonvolatile memory cells after they are erased.

For example, the erasing method disclosed in Japanese Patent Laying-Open No. 2001-307492 (PTD 1) determines whether all cell transistors in a sector have a threshold voltage higher than the lower limit in a first threshold voltage distribution corresponding to a programmed state. If the determination result is true, all cell transistors in the sector are erased simultaneously. Then, among the erased cell transistors, those cell transistors which have a threshold voltage lower than a detection voltage which is present between the upper limit of a second threshold voltage distribution corresponding to the erased state and the lower limit of the first threshold voltage distribution are detected. After the detected cell transistors are programmed individually, all cell transistors in the sector are erased simultaneously.

CITATION LIST

Patent Document

PTD 1: Japanese Patent Laying-Open No. 2001-307492

SUMMARY OF INVENTION

Technical Problem

However, the erasing method disclosed in Japanese Patent Laying-Open No. 2001-307492 is not configured for the purpose of ensuring security. In other words, the method cannot solve the problem that even though the data is erased, the written data before erasure may be read out again.

Other objects and novel features will be apparent with reference to the description and the accompanying drawings.

Solution to Problem

According to one embodiment of the present invention, a power supply control circuit is configured to increase, upon receiving a request for erasing data in a twin cell, both the threshold voltage of a first memory element and the threshold voltage of a second memory element during the pre-writing, and after the pre-writing, differentiate the voltage of a first bit line which is connected to the first memory element and the voltage of a second bit line which is connected to the second memory element during the application of erase pulse.

Advantageous Effects of Invention

According to one embodiment of the present invention, it is possible to prevent the written data before erasure from being read out after the data is erased.

BRIEF DESCRIPTION OF DRAWINGS

FIG. 5(a) is a diagram illustrating an example where a bias voltage is applied to a split gate type flash memory element. FIG. 5(b) is a diagram illustrating an example where a bias voltage is applied to a stacked gate type flash memory element in which writing is performed by hot carriers. FIG. 5(c) is a diagram illustrating an example where a bias voltage is applied to a stacked gate type flash memory element in which writing is performed by FN tunneling.

FIG. 7(a) is a diagram illustrating a sequence of erasing the twin cell data "0". FIG. 7(b) is a diagram illustrating a sequence of erasing the twin cell data "1".

FIG. 9(a) is a diagram illustrating a sequence of erasing the twin cell data "0" when the voltage applied to a bit line BL which is connected to a positive cell MC1 is lower than the voltage of a bit line BL which is connected to a negative cell MC2. FIG. 9(b) is a diagram illustrating a sequence of erasing the twin cell data "1" when the voltage applied to a bit line BL which is connected to a positive cell MC1 is lower than the voltage of a bit line BL which is connected to a negative cell MC2.

FIG. 39($a$) is a diagram illustrating a sequence of erasing the twin cell data "0" when the voltage applied to a bit line BL which is connected to a positive cell MC1 is higher than the voltage of a bit line BL which is connected to a negative cell MC2.

FIG. 39($b$) is a diagram illustrating a sequence of erasing the twin cell data "1" when the voltage applied to the bit line BL which is connected to a positive cell MC1 is higher than the voltage of the bit line BL which is connected to a negative cell MC2.

DESCRIPTION OF EMBODIMENTS

Hereinafter, embodiments of the present invention will be described with reference to the accompanying drawings.

First Embodiment

Figure 1:
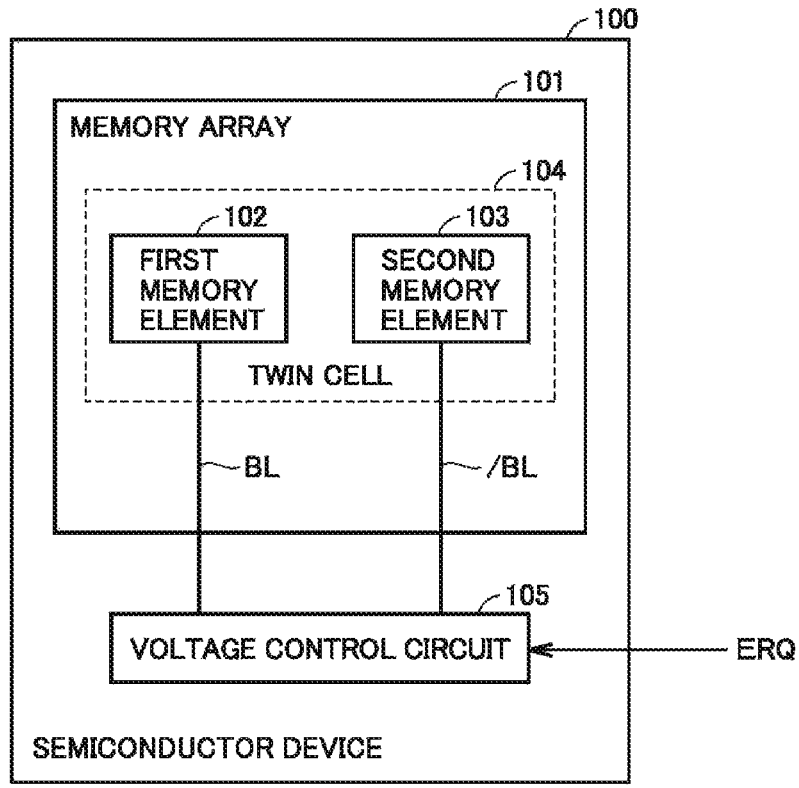
FIG. 1 is a diagram illustrating the configuration of a semiconductor device according to a first embodiment.

FIG. 1 is a diagram illustrating the configuration of a semiconductor device according to a first embodiment.

The semiconductor device assigned with a reference number 100 includes a memory array 101 and a voltage control circuit 105.

Memory array 101 includes a plurality of twin cells 104. Each twin cell 104 is composed of a first memory element 102 and a second memory element 103 which are each electrically rewritable and configured to memorize binary data (twin cell data) according to a difference in a threshold voltage Vth therebetween.

A voltage control circuit 105 is configured to increase, upon receiving a request for erasing data in twin cell 104, both the threshold voltage of first memory element 102 and the threshold voltage of second memory element 103 during the pre-writing, and after the pre-writing, differentiate the voltage of a first bit line BL which is connected to first memory element 102 and the voltage of a second bit line /BL which is connected to second memory element 103 during the application of erase pulse.

Figure 2:
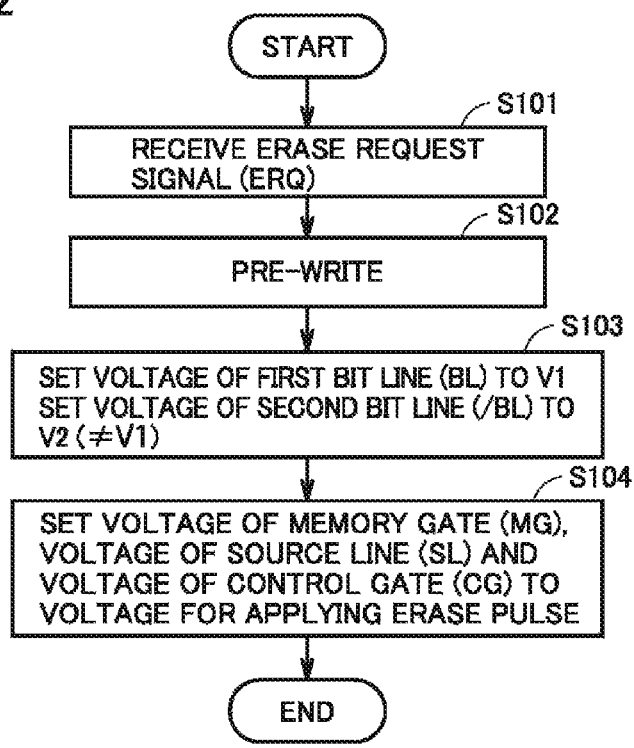
FIG. 2 is a flowchart illustrating a procedure of erasing twin cell data from a memory array in the semiconductor device according to the first embodiment.

FIG. 2 is a flowchart illustrating a procedure of erasing twin cell data from memory array 101 in the semiconductor device according to the first embodiment.

First, voltage control circuit 105 receives an erase request signal ERQ (step S101).

Next, voltage control circuit 105 performs a voltage control to increase both the threshold voltage of first memory element 102 and the threshold voltage of second memory element 103 during the pre-writing (step S102).

Subsequently, voltage control circuit 105 sets the voltage of first bit line BL which is connected to first memory element 102 to V1 and the voltage of second bit line /BL which is connected to second memory element 103 to V2 different from V1 (step S103).

Then, voltage control circuit 105 sets a the voltage of memory gate MG, the voltage of control gate CG and the voltage of a source line SL, which are predetermined and common in first memory element 102 and second memory element 103, to the voltage for applying an erase pulse (step S104).

As described above, by differentiating the voltage of the bit line connected to the first memory element and the voltage of the bit line connected to the second memory element during the application of erase pulse to the twin cell data, it is possible to prevent the magnitude relation between the threshold voltage of the first memory element and the threshold voltage of the second memory element from being maintained after erasure of twin cell data. Furthermore, different from the erasure of twin cell data as described in PTD 1, there is no need to program particular memory cells, which makes it possible to shorten the time required for erasing.

Second Embodiment

The semiconductor device according to the present embodiment is a microcomputer.

(Microcomputer)

Figure 3:
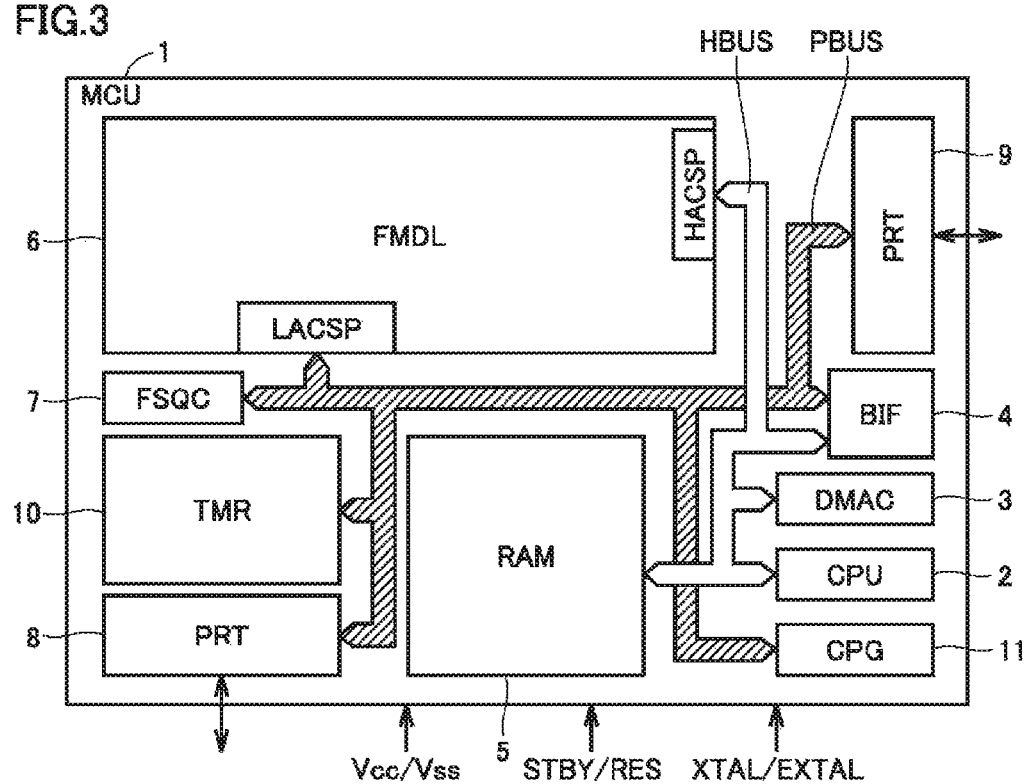
FIG. 3 is a diagram illustrating the configuration of a microcomputer according to a third embodiment.

FIG. 3 is a diagram illustrating the configuration of a microcomputer 1 according to the second embodiment.

The microcomputer (MCU) 1 illustrated in FIG. 3 is formed into a single piece of semiconductor chip such as a single crystal silicon by using for example a technique for fabricating a complementary MOS integrated circuit.

Microcomputer 1 may include a high-speed bus HBUS and a peripheral bus PBUS without any particular limitation. High-speed bus HBUS and peripheral bus PBUS each may include a data bus, an address bus and a control bus without any particular limitation. By providing the high-speed bus and the peripheral bus as two individual buses, compared with the case where all circuits are connected to a common bus, it is possible to reduce the load of each bus, making it possible to ensure high-speed access operation.

High-speed bus HBUS is connected with a central processing unit (CPU) 2 which is provided with a command control unit and an execution unit and is configured to execute commands, a direct memory access controller (DMAC) 3, and a bus interface circuit (BIF) 4 which is configured to perform a bus interface control or a bus bridge control on high-speed bus HBUS and peripheral bus PBUS.

High-speed bus HBUS is further connected with a random access memory (RAM) 5 used in such as a work area of central processing unit 2 and a flash memory module (FMDL) 6 serving as a non-volatile memory module for storing data and programs.

Peripheral bus PBUS is connected with a flash sequencer (FSQC) 7 which performs a command access control on flash memory module (FMDL) 6, external I/O ports (PRT) 8 and 9, a timer (TMR) 10, and a clock pulse generator (CPG) 11 configured to generate an internal clock CLK for controlling microcomputer 1.

Further, microcomputer 1 is provided with a clock terminal which is connected to an oscillator at XTAL/EXTAL or to which an external clock is supplied, an external hardware standby terminal STB for providing a standby state command, an external reset terminal RES for providing a reset command, an external power supply terminal Vcc, and an external ground terminal Vss.

In FIG. 3, flash sequencer 7 serving as a logic circuit and flash memory module 6 serving as an array component are designed by using different CAD tools and thereby illustrated as separate circuit blocks for convenience, both units may be combined to constitute a single flash memory. Flash memory module 6 is connected to high-speed bus HBUS through the intermediary of a read-only high-speed access port (HACSP). CPU 2 or DMAC 3 can have a read access to flash memory module 6 from high-speed bus HBUS through the intermediary of the high-speed access port. In the case of performing a write access or an initialization access to flash memory module 6, CPU 2 or DMAC 3 issues a command to bus interface 4 and then to flash sequencer 7 through the intermediary of peripheral bus PBUS, and thereby, flash sequencer 7 can perform initialization operation or writing operation control on the flash memory module through the intermediary of peripheral bus PBUS and a low-speed access port (LACSP).

(Flash Memory Module)

Figure 4:
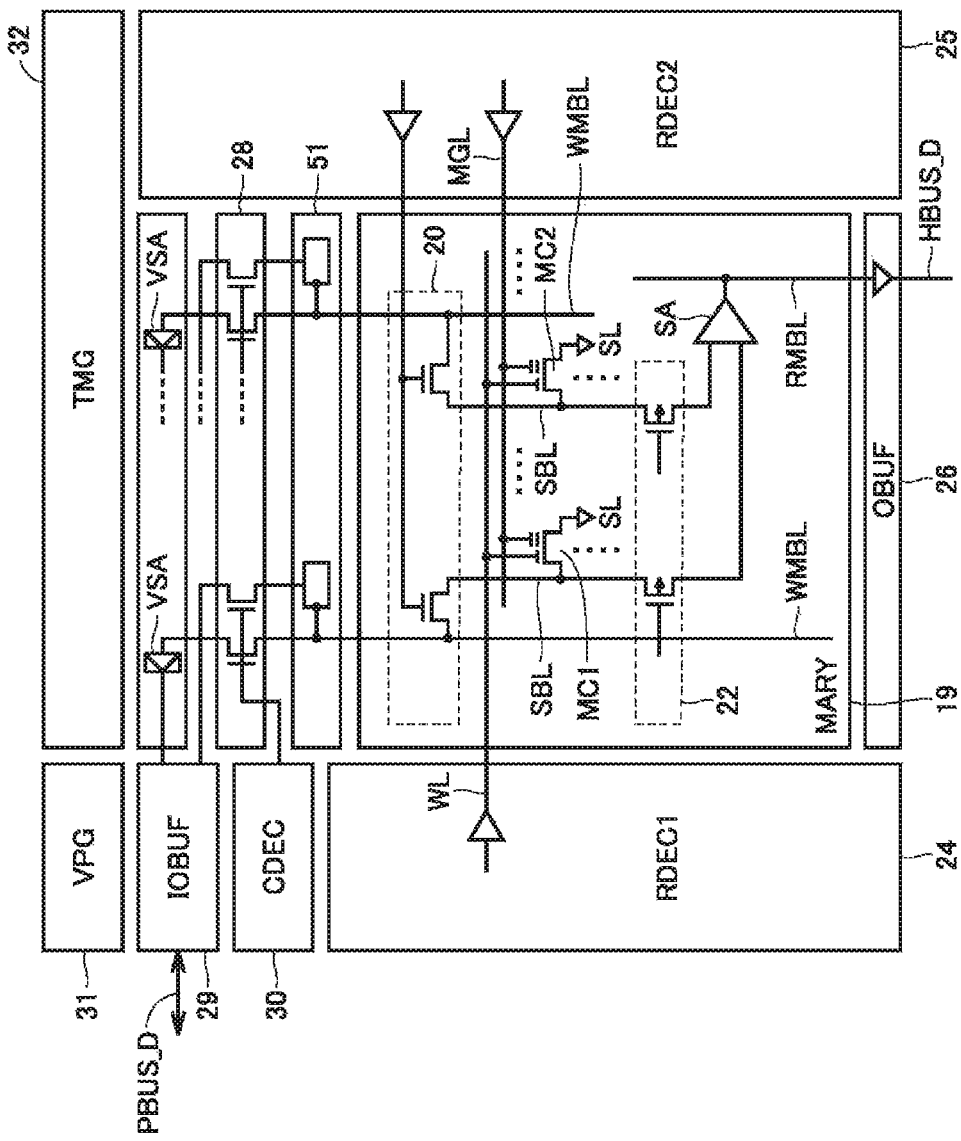
FIG. 4 is a diagram illustrating the configuration of a flash memory module.

FIG. 4 is a diagram illustrating the configuration of flash memory module 6.

Flash memory module 6 uses two non-volatile memory cells to store 1-bit information. In other words, a memory array (MARY) 19 is provided with a plural pairs of rewritable non-volatile memory cells MC1 and MC2, and each pair serves as an 1-bit twin cell. In FIG. 4, only one pair is illustrated representatively. In the specification, memory cell MC1 is named as a positive cell, and memory cell MC2 is named as a negative cell.

Volatile memory cells MC1 and MC2 each may be a split gate type flash memory element as illustrated in FIG. 5($a$), for example. Such memory element includes a control gate CG and a memory gate MG disposed through the interposition of a gate insulating film on a channel forming region between a source region and a drain region. A charge trapping region formed from silicon nitride (SiN) for example is disposed between memory gate MG and the gate insulating film. The source region or the drain region on the select gate side is connected to bit line BL, and the source region or the drain region on the memory gate side is connected to source line SL.

In order to decrease threshold voltage Vth of a memory cell, the following conditions are satisfied that BL=VF (for faster erasing speed) or VS (for slower erasing speed), CG=0V, MG=−10V, SL=6V and WELL=0V, and thereby, electrons are drawn out from the charge trapping region (SiN) into the well region (WELL) by a strong electric field between the well region (WELL) and memory gate MG. The processing unit includes a multiple memory cells that share the memory gate. In the present embodiment, VF and VS are set to satisfy VF<VS, and the reason therefor will be described hereinafter.

In order to increase threshold voltage Vth of a memory cell, the following conditions are satisfied that BL=0V, CG=1.5V, MG=10V, SL=6, WELL=0V and a writing current is made to flow from source line SL to the bit line, and thereby, hot electrons generated at the boundary between the control gate and the memory gate are injected into the charge trapping region (SiN). The injection of electrons is determined by the flowing of the bit line current, and thereby this process is controlled on bit unit.

The read-out is performed under such conditions that BL=1.5V, CG=1.5V, MG=0V, SL=0V, and WELL=0V. The memory cell is brought into the ON state as threshold voltage Vth thereof is decreased, and is brought into the OFF state as threshold voltage Vth thereof is increased.

The memory element is not limited to the split gate type flash memory element, it may be a stacked-gate type flash memory element as illustrated in FIG. 5 ($b$) and FIG. 5 ($c$). The memory element is formed by stacking a floating gate FG and a control gate WL through the intermediary of a gate insulating film on a channel forming region between the source region and the drain region. In FIG. 5 ($b$), threshold voltage Vth is increased so as to perform hot carrier writing, and threshold voltage Vth is decreased so as to release electrons into well region WELL. In FIG. 5 ($c$), threshold voltage Vth is increased so as to perform FN tunneling write, and threshold voltage Vth is decreased so as to release electrons into bit line BL.

The voltage supplied to memory gate MG, control gate CG, source line SL, WELL and bit line BL is generated in a power supply circuit (VPG) 31 under the control of flash sequencer 7.

In the following, the description is carried out by taking the memory element as a split gate type flash memory element.

The memorization of information in one twin cell composed of non-volatile memory cells MC1 and MC2 is performed by storing complementary data in nonvolatile memory cells MC1 and MC2.

In other words, each of memory cells MC1 and MC2 can hold cell data "1" (lower threshold voltage state or a state where the threshold voltage is lower than an erase verification level) or cell data "0" (higher threshold voltage state or a state where the threshold voltage is equal to or higher than the erase verification level).

Figure 6:
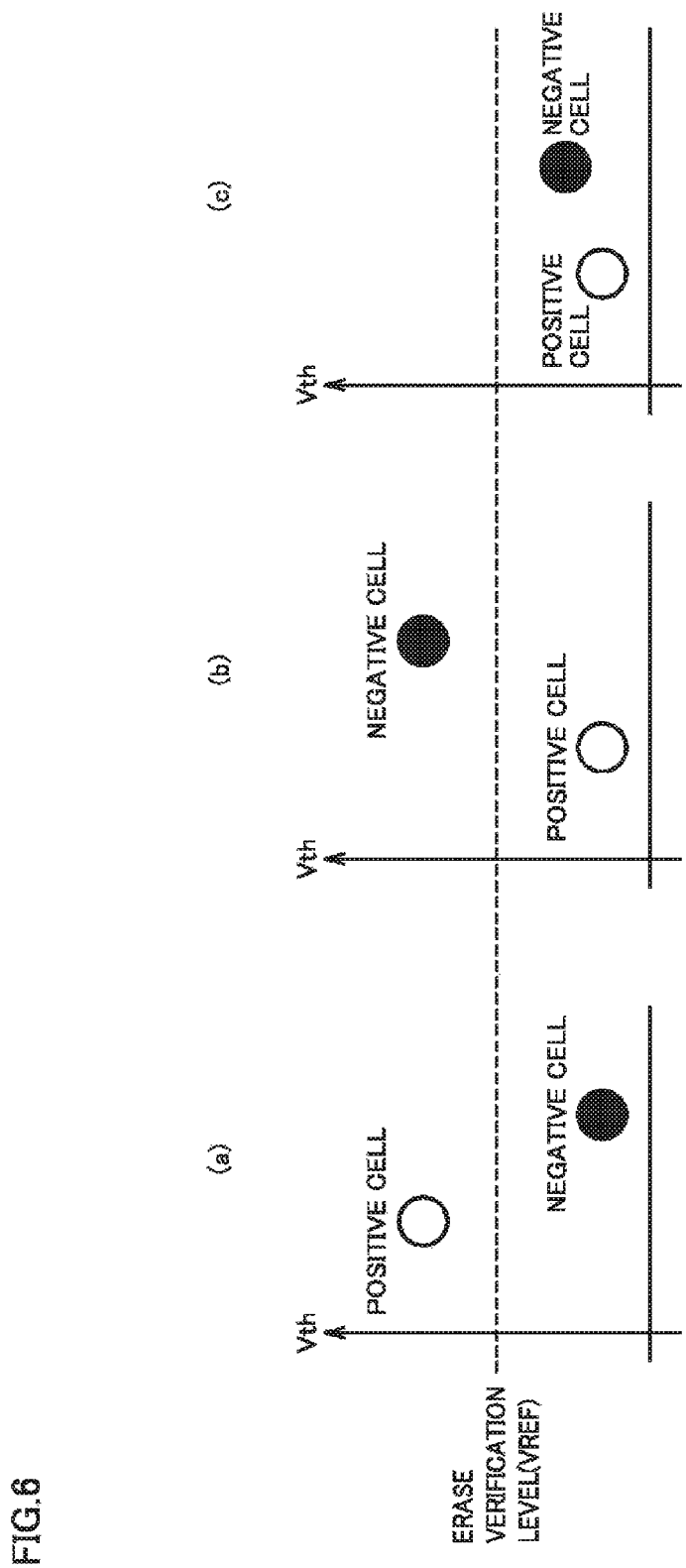
FIG. 6(a) is a diagram illustrating a state where the twin cell data "0" is being memorized.
FIG. 6(b) is a diagram illustrating a state where the twin cell data "1" is being memorized.
FIG. 6(c) is a diagram illustrating an initialization state of the twin cell data.

As illustrated in FIG. 6(a), in the case where positive cell MC1 holds the cell data "0" and negative cell MC2 holds the cell data "1", the twin cell data is "0". As illustrated in FIG. 6 (b), in the case where positive cell MC1 holds the cell data "1" and negative cell MC2 holds the cell data "0", the twin cell data is "1". As illustrated in FIG. 6 (c), in the case where positive cell MC1 and negative cell MC2 in the twin cell both hold the cell data "1", the twin cell is in the initialization state where the twin cell data is variable.

Turning the state of twin cell data "0" and the state of twin cell data "1" to the initialization state is called the erasure of twin cell data. In the erasure of twin cell data, after a process (called pre-writing) is performed to make the data in both positive cell MC1 and negative cell MC2 to "0", another process is performed by applying an erase pulse to make the data in both cells to "1". The pre-writing means that a weak writing (where the threshold value is increased to some extent) is performed on both positive cell MC1 and negative cell MC2. The purpose of performing the pre-writing is to reduce the irregular variations of erasure stress present between positive cell MC1 and negative cell MC2 so as to prevent the retention characteristics from being deteriorated. In order to prevent the stress originated from the pre-writing from becoming greater than the stress originated from a normal writing, the pre-writing is performed under a voltage lower than the voltage used to perform the normal writing (under an increased Vth) as illustrated in FIG. 5.

FIG. 7(a) is a diagram illustrating a sequence of erasing the twin cell data "0".

As illustrated in FIG. 7(a), during the erasure of the twin cell data "0", both cells are turned into the initialization state where both cells hold the cell data "1", however, since threshold voltage Vth of positive cell MC1 is higher than threshold voltage Vth of negative cell MC2 before erasure, it is assumed that the magnitude relationship may remain after the erasure. If a read-out is performed under this condition, even though positive cell MC1 and negative cell MC2 are turned into the initialization state, there is a difference in threshold voltage Vth between positive cell MC1 and negative cell MC2, and thereby, the data may be read out as "0" which is substantially equal to the previously existed twin cell data "0" rather than as a variable value.

FIG. 7(b) is a diagram illustrating a sequence of erasing the twin cell data "1".

As illustrated in FIG. 7(b), during the erasure of the twin cell data "1", both cells are turned into the initialization state where both cells hold the cell data "1", however, since threshold voltage Vth of negative cell MC2 is higher than threshold voltage Vth of positive cell MC1 before erasure, it is assumed that the magnitude relationship may remain after the erasure. If a read-out is performed under this condition, even though positive cell MC1 and negative cell MC2 are turned into the initialization state, there is a difference in threshold voltage Vth between positive cell MC1 and negative cell MC2, and thereby, the data may be read out as "1" which is substantially equal to the previously existed twin cell data "1" rather than as a variable value.

As mentioned above, despite that the data has been erased, each read-out may obtain data which is equal to the previously existed twin cell data at a high possibility but not a variable value defining uncertain data, which leads to a security problem. For the purpose of solving such security problem, the inventors of the present application carried out experiments to investigate the relationship between the voltage applied to bit line BL during the application of erase pulse (by decreasing threshold voltage Vth), and found out that threshold voltage Vth decreases at different rates depending on the voltage applied to bit line BL. The inventors presume that this phenomenon comes from the affects of the electric field of the drain side on the electric field below memory gate MG along with the miniaturization of data cells.

Figure 8:
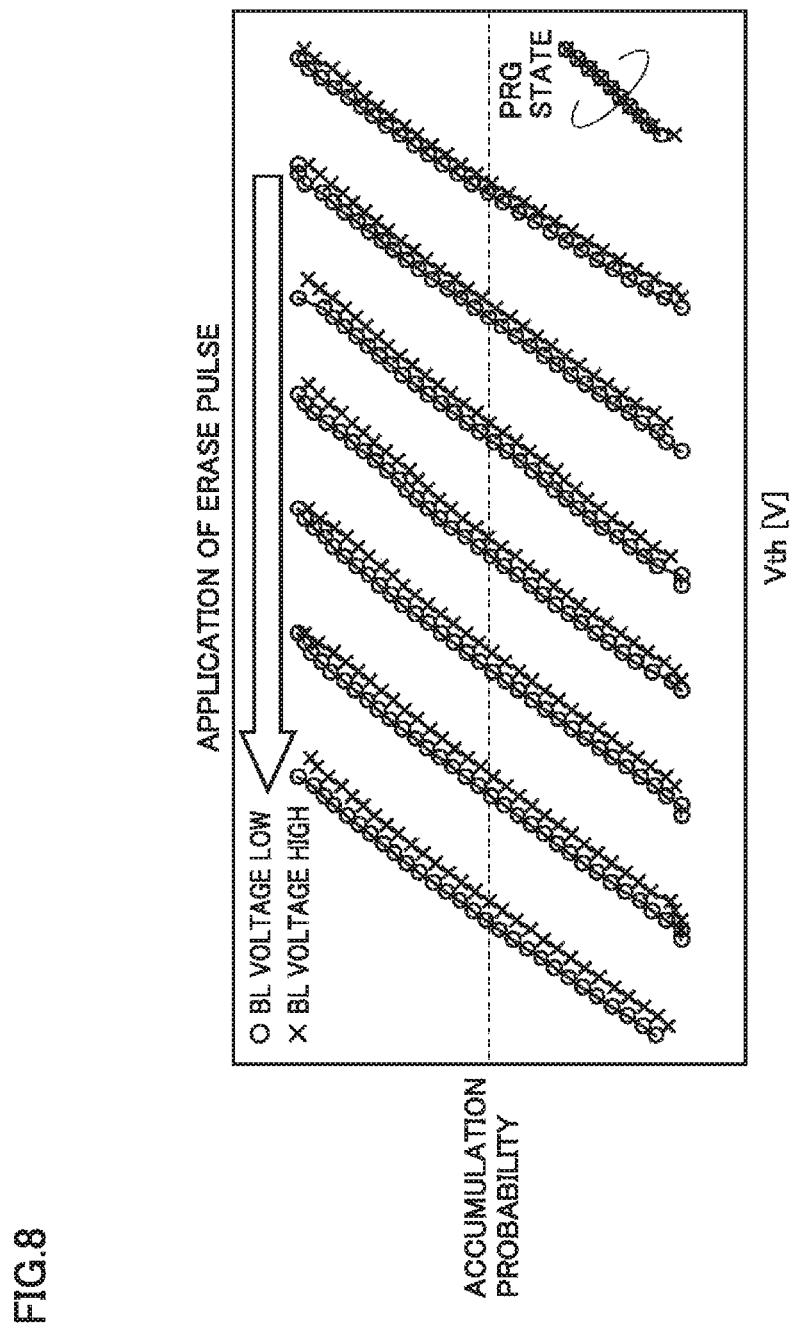
FIG. 8 is a diagram illustrating the relationship between the voltage of a bit line and the erasing speed of a memory cell.

As an example such experimental results illustrated in FIG. 8, it is found that as the voltage applied to bit line BL decreases, the decreasing rate of threshold voltage Vth increases.

FIG. 9(a) is a diagram illustrating a sequence of erasing the twin cell data "0" when the voltage applied to bit line BL which is connected to positive cell MC1 is lower than the voltage of bit line BL which is connected to negative cell MC2.

As illustrated in FIG. 9(a), during the erasure of the twin cell data "0", both cells are turned into the initialization state where both cells hold the cell data "1". Before erasure of twin cell data, threshold voltage Vth of positive cell MC1 is higher than threshold voltage Vth of negative cell MC2. However, since the erasing speed (in other words, the decreasing rate of threshold voltage Vth) of positive cell MC1 is faster that of negative cell MC2, after the erasure, the relationship on the threshold voltage is inverted. When a read-out is performed under this condition, the data will be read out as "1" which is different from the previously existed twin cell data "0".

FIG. 9(b) is a diagram illustrating a sequence of erasing the twin cell data "1" when the voltage applied to bit line BL which is connected to positive cell MC1 is lower than the voltage of bit line BL which is connected to negative cell MC2.

As illustrated in FIG. 9(b), during the erasure of the twin cell data "1", both cells are turned into the initialization state where both cells hold the cell data "1". Before erasure of twin cell data, threshold voltage Vth of negative cell MC2 is higher than threshold voltage Vth of positive cell MC1. However, since the erasing speed (in other words, the decreasing rate of threshold voltage Vth) of positive cell MC1 is faster that of negative cell MC2, after the erasure, the relationship on the threshold voltage is maintained. When a read-out is performed under this condition, the previously existed twin cell data "1" will be read out.

Thus, either in the case where the twin cell data is "0" or in the case where the twin cell data is "1", after erasure of twin cell data, the data will be read out as "1", which makes it impossible to identify the data previously stored in the twin cell.

In the twin cell representatively illustrated in FIG. 4, memory gate MG of memory cell MC1 and memory gate MG of memory cell MC2 are connected to a common memory gate selection line MGL, control gate CG of memory cell MC1 and control gate CG of memory cell MC2 are connected to a common word line WL. Practically, a number of twin cells are arranged in matrix and connected to memory gate selection line MGL and word line WL corresponding to each other in row units.

Memory cells MC1 and MC2 are connected in column units to a sub-bit line SBL, and connected to a writing system main bit line WMBL through the intermediary of a sub-bit line selector 20. A plurality of sub-bit lines SBL are hierarchized by sub-bit line selector 20 and connected to each writing system main bit line WMBL. Each hierarchized unit in sub-bit line SBL is called a memory mat. Source line SL is connected to ground voltage Vss. Sub-bit line SBL connecting memory cells MC1 in each memory mat is connected to one input terminal of a hierarchical sense amplifier SA through the intermediary of a read column selector 22. Sub-bit line SBL connecting memory cells MC2 in each memory mat is connected to the other input terminal of hierarchical sense amplifier SA through the intermediary of read column selector 22.

Word line WL is selected by a first row decoder (RDEC1) 24. Memory gate selection line MGL and sub-bit line selector 20 are selected by a second row decoder (RDEC2) 25. The selection operation by first row decoder 24 and second row decoder 25 is performed based on address information provided to a HACSP thereof during data-reading operation or based on address information provided to a LACSP thereof during data-writing operation and data-initialization operation. The output terminal of hierarchical sense amplifier SA is connected to a data bus HBUS_D which is a sort of high-speed bus HBUS through the intermediary of an output buffer (OBUF) 26.

Writing system main bit line WMBL is configured to selectively flow a writing current in accordance with latch data from a main bit line voltage control circuit 51. Main bit line voltage control circuit 51 is selected by a rewrite column selector 28. Writing system main bit line WMBL selected by rewrite column selector 28 is connected to a verify sense amplifier VSA. The output terminal of verify sense amplifier VSA and main bit line voltage control circuit 51 are connected to an I/O circuit (IOBUS) 29 which is interfaced to a data bus (PBUS_D) which is a sort of peripheral bus PBUS.

Rewrite column selector 28 is selected by a column decoder (CDEC) 30. The selection operation by column decoder 30 is performed based on address information supplied to a LACSP thereof.

Power supply circuit (VPG) 31 generates various operating voltages required for reading, writing and initialization. Among a plurality of the generated voltages, a power supply voltage VDD is a voltage supplied to a MOS circuit in the semiconductor device with the other components excluded specifically herein (in other words, the voltage is supplied to the source of a PMOS transistor and to the drain of an NMOS transistor).

A timing generator (TMG) 32 generates an internal control signal for defining an internal operation timing according to an access strobe signal supplied from CPU 2 or the like to a HACSP thereof or an access command supplied from FSQC 7 to a LACSP thereof.

The control unit of a flash memory is constituted by FSQC 7 and timing generator 32.

(Reading of Twin Cell Data)

Figure 10:
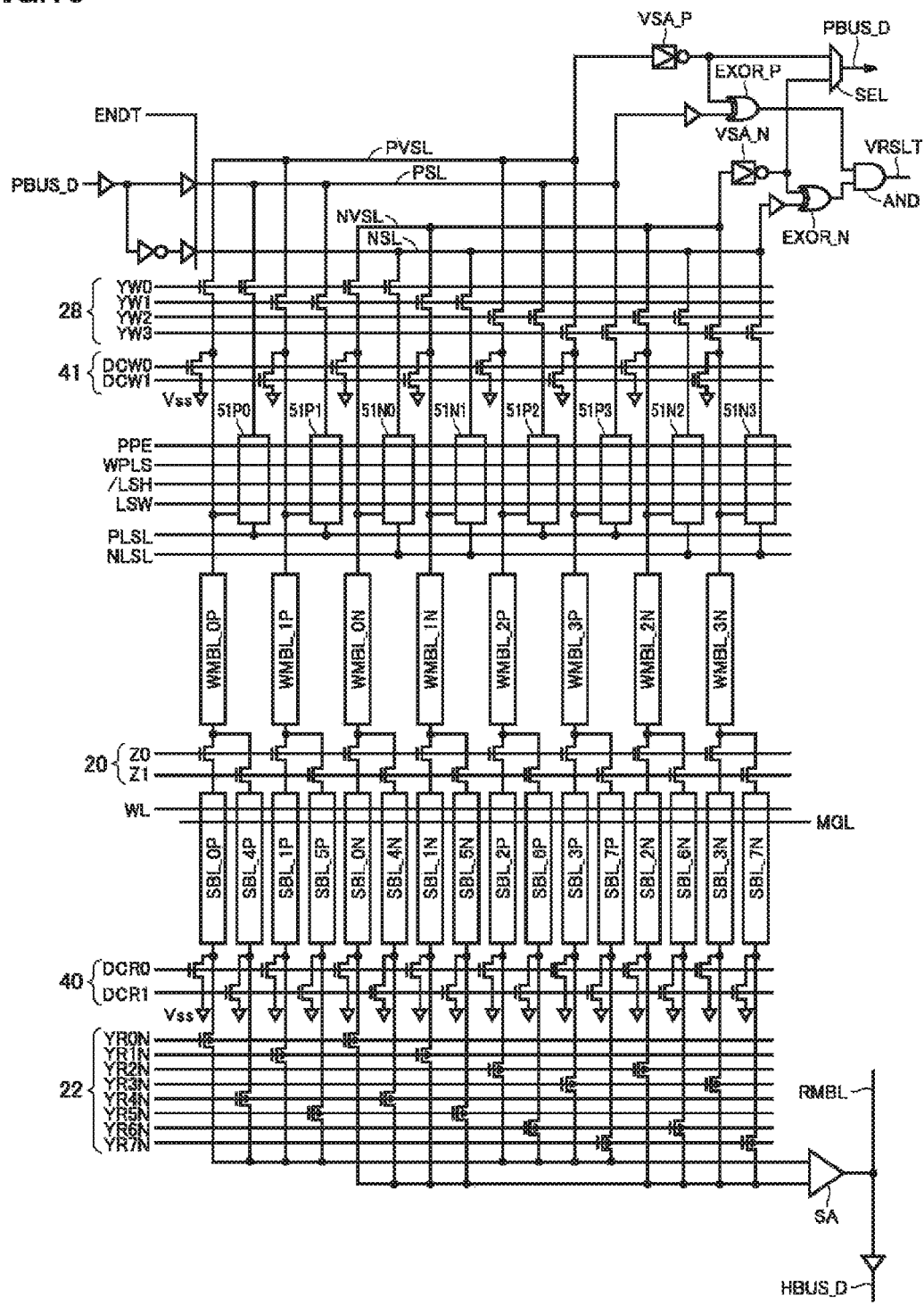
FIG. 10 is a diagram illustrating a detailed circuit configuration of a reading system, a writing system and an erasing system for the twin cell data according to a second embodiment.

FIG. 10 is a diagram illustrating a detailed circuit configuration of a reading system, a writing system and an erasing system for the twin cell data according to the second embodiment. 8 lines of WMBL_0P to WMBL_3P and WMBL_0N to WMBL_3N are illustrated as the main bit lines of the writing system, and 1 piece of memory mat is illustrated as the memory mat connected to the main bit lines. Without any particular limitation, lines SBL_0P to SBL_7P and SBL_0N to SBL_7N are disposed as the sub-bit lines, and every 2 sub-bit lines SBL are allocated to 1 writing system main bit line WMBL.

For memory cells MC1 and MC2, although not illustrated in the drawings, the numeric suffix in each reference numeral assigned to each sub-bit line SBL represents the column number of a twin cell, the alphabetical suffix P means that the sub-bit line is connected to one memory cell MC1 (positive cell) of the twin cell, and the alphabetical suffix N means that the sub-bit line is connected to the other memory cell MC2 (negative cell) of the twin cell. The alphabetical suffix P in each reference numeral assigned to each writing main bit line WMBL means that the writing main bit line is connected to positive cell MC1 of the twin cell, the alphabetical suffix N means that the writing main bit line is connected to negative cell MC2 of the twin cell, and the numeric suffix means a smaller column number of the corresponding twin cell.

Based on the selection signals YR0N to YR7N for controlling the switching of read column selector 22, a pair of sub-bit lines SBL with equal twin cell column numbers are selected, the selected sub-bit line SBL_iP for the positive cell and the selected sub-bit line SBL_iN for the negative cell are connected to the differential input terminal of hierarchical sense amplifier SA. Hierarchical sense amplifier SA is provided with a current source transistor (not shown) connected to each differential input terminal, and the current source transistor is activated during a reading operation. When a twin cell is selected during a reading operation based on the word line, positive cell MC1 and negative cell MC2 of the selected twin cell operate complementarily in accordance with the stored twin cell data, and thereby form a potential difference between the differential input terminals of hierarchical sense amplifier SA. The potential difference is amplified by hierarchical sense amplifier SA so as to output the twin cell data in the twin cell to reading system main bit line RMBL.

According to the column number arrangement of the twin cell and the selection of sub-bit lines by read column selector 22, it is possible to arrange between a pair of sub-bit lines selected by read column selector 22 the other sub-bit lines which are not selected at the same moment.

A reading system discharge circuit 40 is a circuit configured to selectively connect a sub-bit line SBL to ground voltage Vss and a sub-bit line SBL which is not selected by sub-bit line selector 20 to ground voltage Vss in accordance with discharge signals DCR0 and DCR1.

(Writing of Twin Cell Data)

Main bit line voltage control circuits 51Pi and 51Ni passes a writing current according to the magnitude of a writing pulse WPLS.

The write-in data provided from data bus PBUS_D to a non-inverted signal line PSL is selected by rewrite column selector 28 and supplied to main bit line voltage control circuit 51Pi corresponding to main bit lines WMBL_iP (i=0 to 3) allocated to the positive cell.

The inverted write-in data provided from data bus PBUS_D to an inverted signal line NSL is selected by rewrite column selector 28 and supplied to main bit line voltage control circuit 51Ni corresponding to main bit lines WMBL_iN (i=0 to 3) allocated to negative cell MC2. An ENDT signal is an input gate signal for providing the write-in data to signal lines PSL and NSL.

Main bit lines WMBL_iP (i=0 to 3) allocated to the positive cell are connected in common to a non-inverted verification signal line PVSL through the intermediary of rewrite column selector 28. Main bit lines WMBL_iN (i=0 to 3) allocated to negative cell MC2 are connected in common to an inverted verification signal line NVSL through the intermediary of rewrite column selector 28.

Based on write-selection signals YW0 to YW3 for controlling the switching of read column selector 22, a pair of main bit lines WMBL_jP and WMBL_jN (j=0 to 3) with equal twin cell column numbers are connected to signal lines PSL and NSL, and main bit line voltage control circuits 51Pj and 51Nj corresponding to the pair of main bit lines are connected to signal lines PSL and NSL.

In the writing operation, the write-in data inputted from data bus PBUS_D is input to signal lines PSL and NSL as complementary data, and is latched in the pair of main bit line voltage control circuits 51Pj and 51Nj selected by rewrite column selector 28. One circuit of main bit line voltage control circuits 51Pj and 51Nj latches the data to "1", and the other circuit latches the data to "0". The writing current from source line SL is prevented from flowing in main bit line WMBL corresponding to the latch data "1", meanwhile a writing current from source line SL flows through main bit line WMBL corresponding to the latch data "0", and as a result, the cell data "1" is written to one memory cell of the selected twin cell (i.e., by increasing threshold voltage Vth), and the cell data "0" is written to the other memory cell (i.e., without changing threshold voltage Vth).

In the write verification operation, the information stored in a twin cell that has been selected in the writing operation is read into a pair of corresponding main bit lines WMBL_jP and WMBL_jN (j is any number from 0 to 3), and transmitted by rewrite column selector 28 to verification signal lines PVSL and NVSL, and then amplified by verify sense amplifiers VSA_P and VSA_N which are configured to obtain an inverted amplified output in a single end. Similarly, in the writing operation, the write-in data that is stored in main bit line voltage control circuits 51Pj and 51Nj is transmitted via rewrite column selector 28 to signal lines PSDL and NSL. Thereby, it is possible to verify the data written state of the positive cell by examining the matching condition of the output from verify sense amplifier VSA_P and the non-inverted write-in data of signal line PSL by using an exclusive OR gate EXOR_P. Similarly, it is possible to verify the data writing state of negative cell MC2 by examining the matching condition of the output from verify sense amplifier VSA_N and the non-inverted write-in data of inverted signal line NSL by using an exclusive OR gate EXOR_N. The logical product of the outputs from exclusive OR gate EXPR_P EXOR_N is obtained by using an AND gate, the result of the logical product serves as a verification result VRSLT for the 1-bit write-in data. In the case where the write-in data is of plural bits, the logical product is obtained as the write-in verification result for all the outputs of the exclusive OR gates corresponding to the plural bits. Verification result VRSLT is supplied to flash sequencer 7.

In addition, the outputs from verify sense amplifiers VSA_P and VSA_N can be output selectively to peripheral data bus PBUS_D via a data selector SEL. This read-out path functions to amplify at a single end the information stored in negative cell MC2 of the twin cell or the information stored in positive cell MC1 thereof and output the same to peripheral data bus PBUS_D.

A writing system discharge circuit 41 is a circuit for selectively connecting main bit lines WMBL to ground voltage Vss based on discharge signals DCW0 and DCW1, and connecting those main bit lines WMBL which are not selected by rewrite column selector 28 to ground voltage Vss.

Main bit line voltage control circuits 51P0 to 51P3, during not only the writing (including the pre-writing) of the twin cell data but also the application of erase pulse to erase the twin cell data, control the voltage of each of main bit lines WMBL_0P to WMBL_3P. Main bit line voltage control circuits 51N0 to 51N3, during not only the writing (including the pre-writing) of the twin cell data but also the application of erase pulse to erase the twin cell data, control the voltage of each of main bit lines WMBL_0N to WMBL_3N.

(Main Bit Line Voltage Control Circuit)

Figure 11:
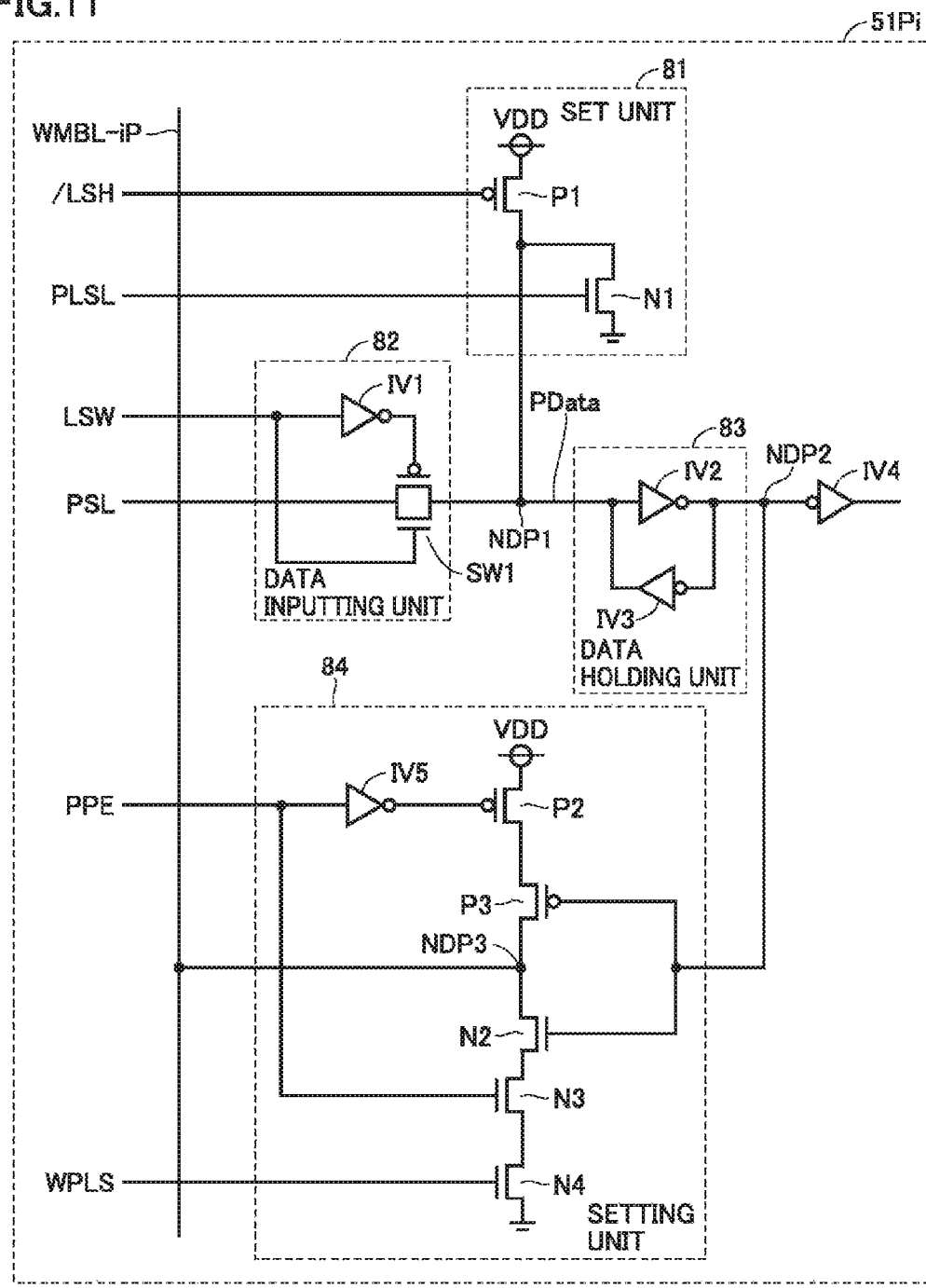
FIG. 11 is a diagram illustrating the configuration of a positive-side main bit line voltage control circuit according to the second embodiment.

FIG. 11 is a diagram illustrating the configuration of main bit line voltage control circuit 51Pi (i=0 to 3) according to the second embodiment. As illustrated in FIG. 11, main bit line voltage control circuit 51Pi includes a set unit 81, a data inputting unit 82, a data holding unit 83, a setting unit 84, and an inverter IV4.

Set unit 81 includes a P-channel MOS transistor P1 and an N-channel MOS transistor N1. P-channel MOS transistor P1 is provided between a line of power supply voltage VDD and a node NDP1. The gate of P-channel MOS transistor P1 is configured to receive an inverted latch-setting high signal /LSH. N-channel MOS transistor N1 is provided between node NDP1 and the line of ground voltage Vss. The gate of N-channel MOS transistor N1 is configured to receive a positive latch-setting low signal PLSL.

Data inputting unit 82 includes an inverter IV1 and a switch SW1. Inverter IV1 is configured to receive a latch switching signal LSW. Switch SW1 is configured to receive non-inverted data which is transmitted via a non-inverted signal line PSL, and is controlled by latch switching signal LSW and an output (i.e., an inverted signal of latch switching signal LSW) from inverter IV1. When latch switching signal LSW is at the "H" level, switch SW1 transmits the non-inverted data received via non-inverted signal line PSL to node NDP1.

Data holding unit 83 includes an inverter IV2 and an inverter IV3 connected to each other. The input terminal of inverter IV3 and the output terminal of inverter IV2 are connected to node NDP1, and the output terminal of inverter IV2 and the input terminal of inverter IV3 are connected to node NDP2.

The input terminal of inverter IV4 is connected to node NDP2.

Setting unit 84 includes P-channel MOS transistors P2 and P3, N-channel MOS transistors N2, N3 and N4, and an inverter IV5 provided between the line of power supply voltage VDD and the line of ground voltage Vss. Inverter IV5 is configured to receive a programmed pulse-validating signal PPE. The gate of P-channel MOS transistor P2 is connected to the output terminal of inverter IV5. The gate of P-channel MOS transistor P3 and the gate of N-channel MOS transistor N2 are connected to node NDP2. The gate of N-channel MOS transistor N3 is configured to receive a programmed pulse-validating signal PPE. The gate of N-channel MOS transistor N4 is configured to receive a writing pulse WPLS. Node NDP3 provided between P-channel MOS transistor P3 and N-channel MOS transistor N2 is connected to main bit line WMBL_iP.

During the writing of twin cell data "1", data is sent through non-inverted signal line PSL at the "H" level, and thereby, the level of the data from node NDP1, i.e. the write-in latch data is set to the "H" level, and the voltage of main bit line WMBL_iP is set equal to VDD.

On the other hand, during the writing of twin cell data "0", data is sent through non-inverted signal line PSL at the "L" level, the level of the data from node NDP1, i.e. the write-in latch data is set to the "L" level, and during period where writing pulse WPLS is in activation, main bit line WMBL_iP is connected to ground voltage Vss, and thereby, a writing current flows into main bit line WMBL_iP.

During the pre-writing, a positive latch-setting low signal PLSL is set to the "H" level and an inverted latch-setting high signal /LSH is set to the "H" level, and thereby, the data from node NDP1, i.e., the write-in latch data is set to the "L" level. During period where writing pulse WPLS is in activation, main bit line WMBL_iP is connected to ground voltage Vss, and thereby, a writing current flows into main bit line WMBL_iP.

Figure 12:
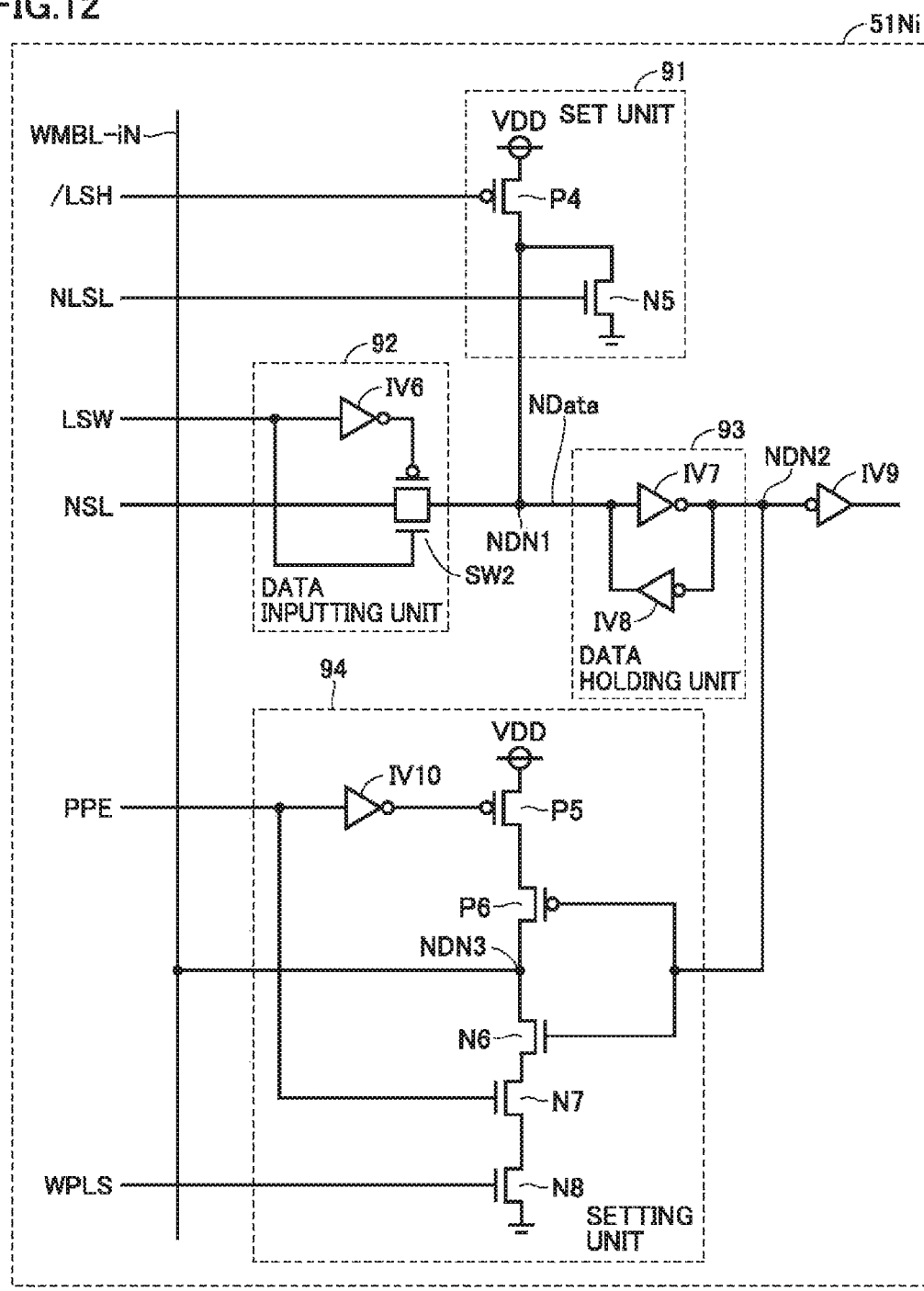
FIG. 12 is a diagram illustrating the configuration of a positive-side main bit line voltage control circuit according to the second embodiment.

FIG. 12 is a diagram illustrating the configuration of main bit line voltage control circuit 51Ni (i=0 to 3) according to the second embodiment. As illustrated in FIG. 12, main bit line voltage control circuit 51Ni includes a set unit 91, a data inputting unit 92, a data holding unit 93, a setting unit 94, and an inverter IV9.

Set unit 91 includes a P-channel MOS transistor P4 and an N-channel MOS transistor N5. P-channel MOS transistor P4 is provided between the line of power supply voltage VDD and node NDN1. The gate of P-channel MOS transistor P4 is configured to receive inverted latch-setting high signal /LSH. N-channel MOS transistor N5 is provided between node NDN1 and the line of ground voltage Vss. The gate of N-channel MOS transistor N5 is configured to receive a negative latch-setting low signal NLSL.

Data inputting unit 92 includes an inverter IV6 and a switch SW2. Inverter IV6 is configured to receive latch switching signal LSW. Switch SW2 is configured to receive non-inverted data which is transmitted via inverted signal line NSL, and is controlled by latch switching signal LSW and an output (i.e., an inverted signal of latch switching signal LSW) from inverter IV6. When latch switching signal LSW is at the "H" level, switch SW2 transmits the non-inverted data received via inverted signal line NSL to node NDN1.

Data holding unit 93 includes an inverter IV7 and an inverter IV8 connected to each other. The input terminal of inverter IV7 and the output terminal of inverter IV8 are connected to node NDN1, and the output terminal of inverter IV2 and the input terminal of inverter IV3 are connected to node NDN2.

The input terminal of inverter IV9 is connected to node NDN2.

Setting unit 94 includes P-channel MOS transistors P5 and P6, N-channel MOS transistors N6, N7 and N8, and an inverter IV10 provided between the line of power supply voltage VDD and the line of ground voltage Vss. Inverter IV10 is configured to receive a programmed pulse-validating signal PPE. The gate of P-channel MOS transistor P5 is connected to the output terminal of inverter IV10. The gate of P-channel MOS transistor P6 and the gate of N-channel MOS transistor N6 are connected to node NDN2. The gate of N-channel MOS transistor N7 is configured to receive a programmed pulse-validating signal PPE. The gate of N-channel MOS transistor N8 is configured to receive a writing pulse WPLS. Node NDN3 provided between P-channel MOS transistor P6 and N-channel MOS transistor N6 is connected to main bit line WMBL_iN.

During the writing of twin cell data "1", data is sent through inverted signal line NSL at the "L" level, the level of the data from node NDN1, i.e. the write-in latch data is set to the "L" level, and during period where writing pulse WPLS is in activation, main bit line WMBL_iN is connected to ground voltage Vss, and thereby, a writing current flows into main bit line WMBL_iN.

On the other hand, during the writing of twin cell data "0", data is sent through inverted signal line NSL at the "H" level, the level of the data from node NDN1, i.e. the write-in latch data is set to the "H" level, and the voltage of main bit line WMBL_iN is set equal to VDD.

During the pre-writing, a negative latch-setting low signal NLSL is set to the "H" level and inverted latch-setting high signal /LSH is set to the "H" level, and thereby, the data from node NDN1, i.e., the write-in latch data is set to the "L" level. During period where writing pulse WPLS is in activation, main bit line WMBL_iN is connected to ground voltage Vss, and thereby, a writing current flows into main bit line WMBL_iN.

(Operation Timing)

Figure 13:
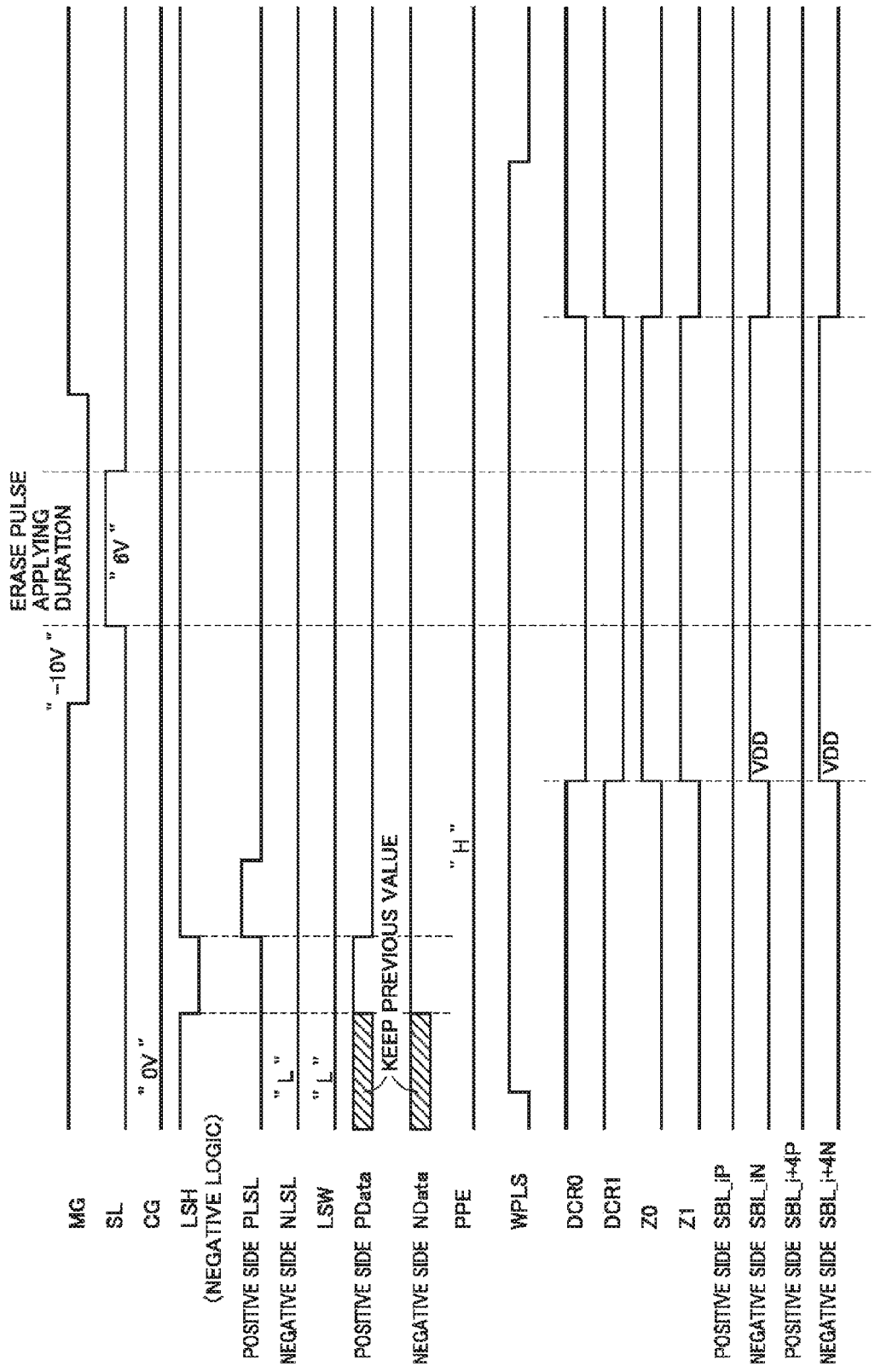
FIG. 13 is a diagram illustrating the operation timing where an erase pulse is applied to the twin cell data according to the second embodiment.

FIG. 13 is a diagram illustrating the operation timing of applying an erase pulse to the twin cell data according to the second embodiment.

Flash sequencer 7 sets ZMOS selection signals Z0 and Z1 to the "L" level, and sets discharge signals DCR0 and DCR1 to the "H" level. Thus, sub-bit lines SBL_0P to SBL_0P and SBL_0N to SBL_7N are connected to the line of ground voltage Vss.

Flash sequencer 7 sets programmed pulse-validating signal PPE to the "H" level, sets writing pulse WPLS to the "H" level, and sets latch-setting high signal LSH to the "L" level temporarily and then to the "H" level. Subsequently, flash sequencer 7 sets positive latch-setting low signal PLSL to the "H" level temporarily and then to the "L" level, and maintains negative latch-setting low signal NLSL at the "L" level and latch switching signal LSW at the "L" level.

Thus, in main bit line voltage control circuits 51P0 to 51P3, latch data PData from node NDP1 is set to the "L" level, node NDP2 is set to the "H" level, N-channel MOS transistors N2, N3 and N4 are turned on, P-channel MOS transistor P3 is turned off, and node NDP3 is set to the "L" level. As a result, the voltage of each of main bit lines WMBL_0P to WMBL_3P is equal to ground voltage Vss.

Meanwhile in main bit line voltage control circuits 51N0 to 51N3, latch data NData from node NDN1 is set to the "H" level, node NDN2 is set to the "L" level, N-channel MOS transistor N6 is turned off, P-channel MOS transistors P5 and P6 are turned on, and node NDN3 is set to the "H" level. As a result, the voltage of each of main bit lines WMBL_0N to WMBL_3N is equal to VDD.

Then, flash sequencer 7 sets discharge signals DCR0 and DCR1 to the "L" level. Thereby, sub-bit lines SBL_0P to SBL_7P and SBL_0N to SBL_7N are disconnected from the line of ground voltage Vss.

Flash sequencer 7 sets ZMOS selection signals Z0 and Z1 to the "H" level. Thus, main bit lines WMBL_iP (i=0 to 3) are connected to sub-bit lines SBL_iP and SBL_i+4P, and thereby, the voltage of each of sub-bit line SBL_iP and SBL_i+4P is maintained at ground voltage Vss. Meanwhile, main bit lines WMBL_iN (i=0 to 3) are connected to sub-bit lines SBL_iN and SBL_i+4N, and thereby, the voltage of each of sub-bit lines SBL_iN and SBL_i+4N is equal to VDD.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT (Band To Band Tunneling) erasure. Since the voltage of each of sub-bit lines SBL_0P to SBL_7P which are connected to positive cell MC1 is equal to ground voltage Vss and the voltage of each of sub-bit lines SBL_0N to SBL_7N which are connected to negative cell MC2 is equal to VDD, the erasing speed of positive cell MC1 is faster than that of negative cell MC2. Due to the different erasing speeds, the difference in threshold voltage Vth between twin cells MC1 and MC2 after erasure is independent on the twin cell data before erasure.

Then, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Next, flash sequencer 7 sets discharge signals DCR0 and DCR1 to the "H" level, and sets ZMOS selection signals Z0 and Z1 to the "L" level.

Thereby, main bit lines WMBL_iP (i=0 to 3) are disconnected from sub-bit lines SBL_iP and SBL_i+4P, and main bit lines WMBL_iN (i=0 to 3) are disconnected from sub-bit lines SBL_iN and SBL_i+4N. Meanwhile, sub-bit lines SBL_0P to SBL_7P and SBL_0N to SBL_7N are connected to the line of ground voltage Vss, and thereby, the voltage of each of sub-bit lines SBL_0N to SBL_7N is restored to ground voltage Vss.

As described above, in the present embodiment, the main bit line voltage control circuit sets the voltage of a bit line connected to the positive cell to Vss and the voltage of a bit line connected to the negative cell to VDD during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

In the present embodiment, the latch-setting signals are separated into a positive latch-setting low signal and a negative latch-setting low signal, but it is not limited thereto. The same latch data can be applied to a structure configured to separate the latch-setting signals into a positive latch-setting high signal and a negative latch-setting high signal.

Third Embodiment

Figure 14:
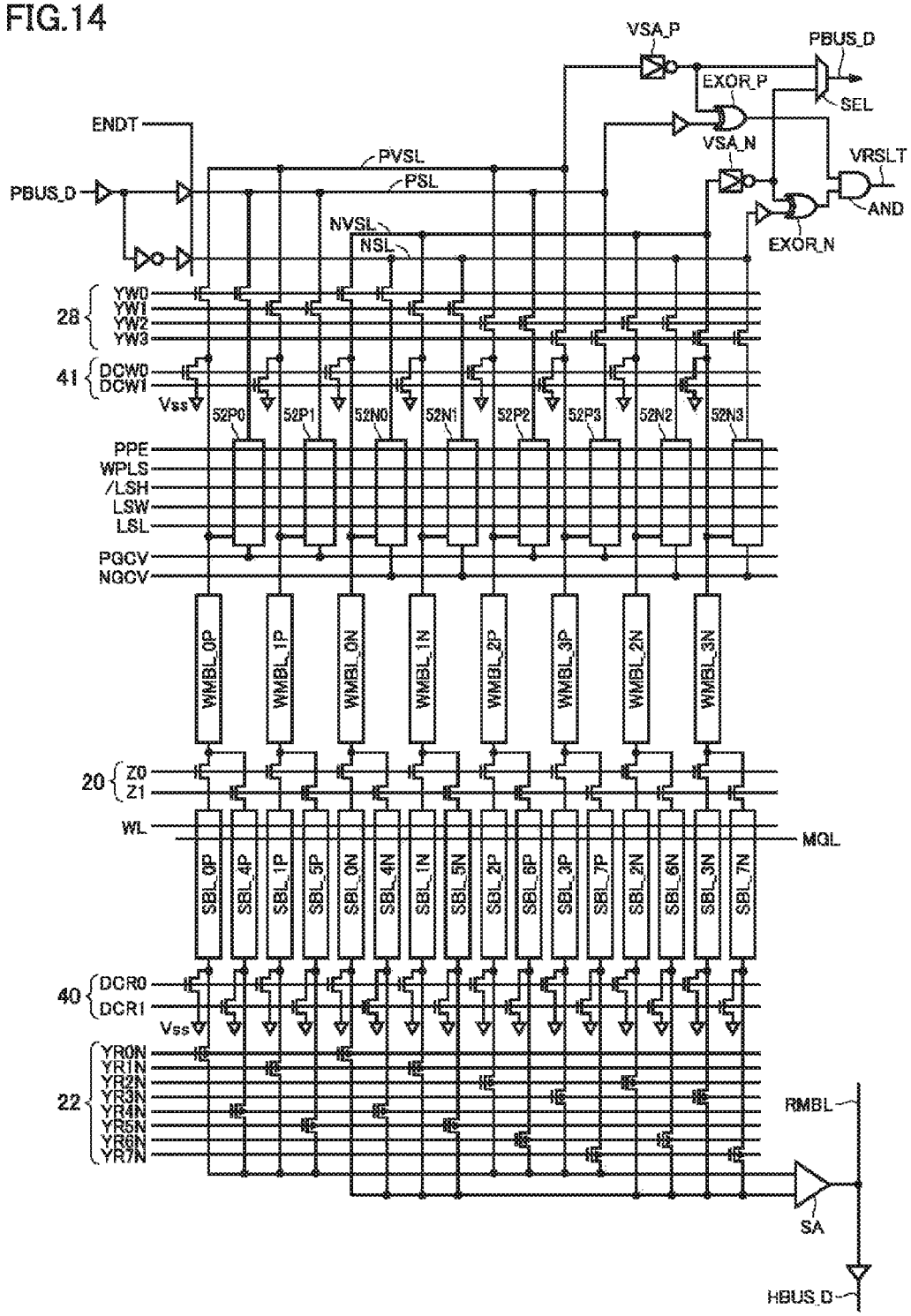
FIG. 14 is a diagram illustrating a detailed circuit configuration for reading, writing and erasing the twin cell data according to a third embodiment.

FIG. 14 is a diagram illustrating a detailed circuit configuration for reading, writing and erasing the twin cell data according to a third embodiment. Main bit line voltage control circuits 51P0 to 51P3 and 51N0 to 51N3 in the circuit configuration of FIG. 10 are replaced by main bit line voltage control circuits 52P0 to 52P3 and 52N0 to 52N3 in the circuit configuration of FIG. 14.

Figure 15:
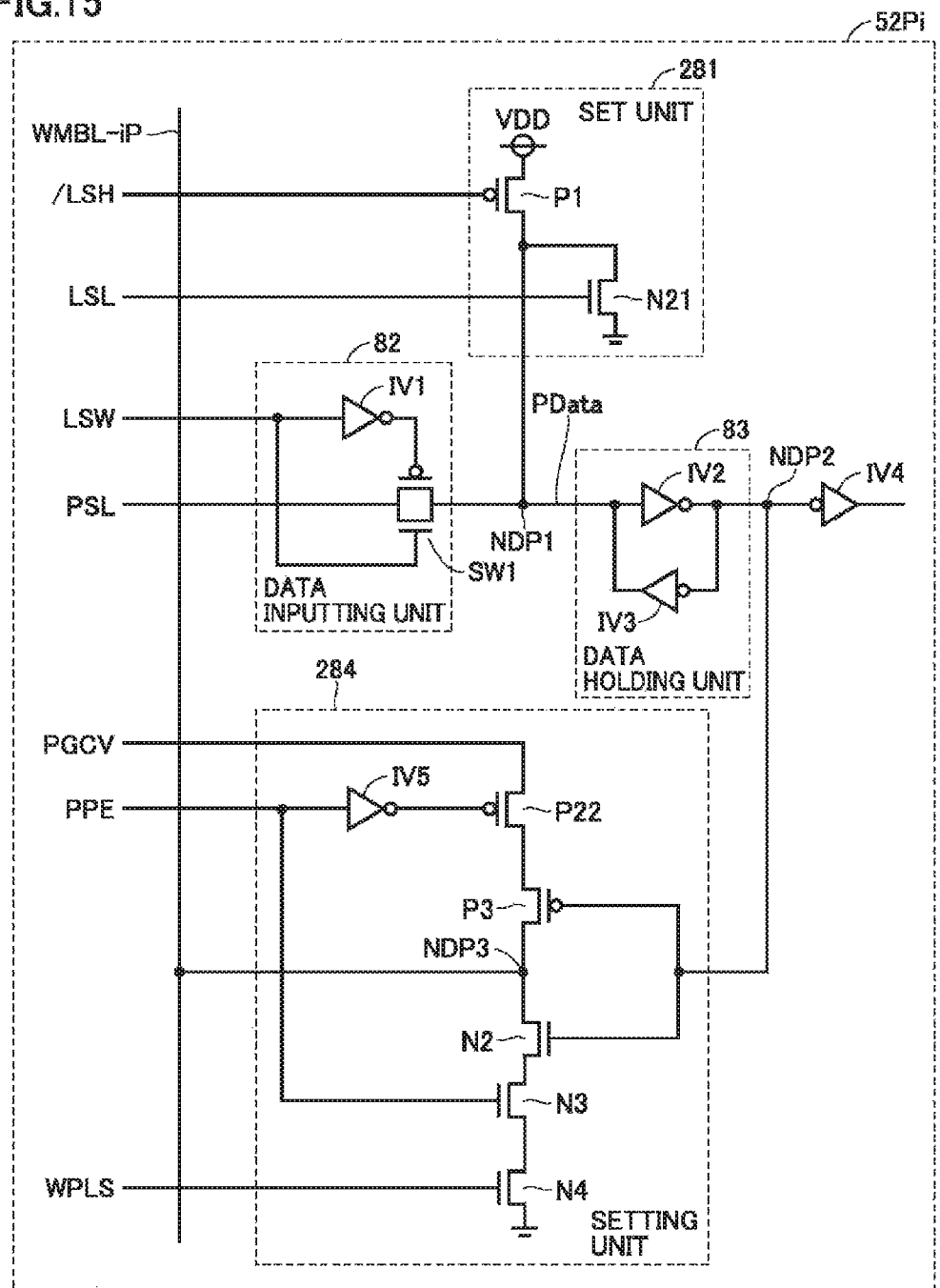
FIG. 15 is a diagram illustrating the configuration of a positive-side main bit line voltage control circuit according to the third embodiment.

FIG. 15 is a diagram illustrating the configuration of main bit line voltage control circuit 52Pi (i=0 to 3) according to the third embodiment. Main bit line voltage control circuit 52Pi of FIG. 15 differs from main bit line voltage control circuit 51Pi of FIG. 11 on the following points.

Set unit 81 of FIG. 11 is provided with a N-channel MOS transistor N1, but set unit 281 of FIG. 15 is provided with a N-channel MOS transistor N21. Similar to N-channel MOS transistor N1, N-channel MOS transistor N21 is provided between node NDP1 and the line of ground voltage Vss. The gate of N-channel MOS transistor N21 receives a common latch-setting low signal LSL on both the positive side and the negative side.

Moreover, setting unit 84 in FIG. 11 is provided with a P-channel MOS transistor P2, but setting unit 284 in FIG. 15 is provided with a P-channel MOS transistor P22. P-channel MOS transistor P2 is connected to the line of power supply voltage VDD, but P-channel MOS transistor P22 is connected to a positive-side charge voltage line PGCV. In the present embodiment, normally the voltage applied to charge voltage line PGCV is set equal to VDD, and it is set to Va (≠Vb (the voltage applied to charge voltage line NGCV)) during the period of applying an erase pulse and a period before applying the erase pulse and a period after applying the erase pulse. In the present embodiment, the description will be carried out on a condition where Va<Vb.

Figure 16:
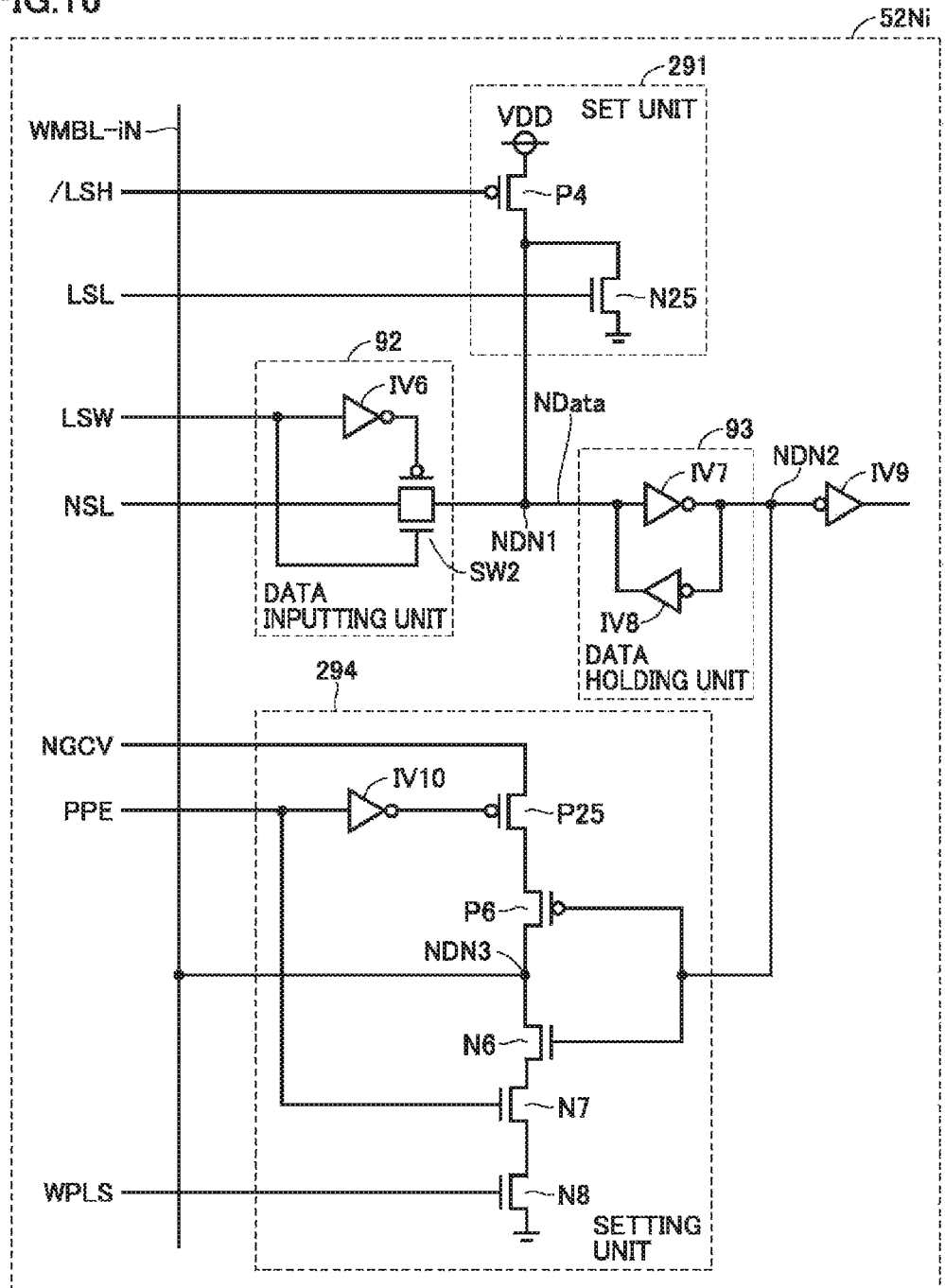
FIG. 16 is a diagram illustrating the configuration of a negative-side main bit line voltage control circuit of the third embodiment.

FIG. 16 is a diagram illustrating the configuration of main bit line voltage control circuit 52Ni (i=0 to 3) according to the third embodiment. Main bit line voltage control circuit 52Ni of FIG. 16 differs from main bit line voltage control circuit 51Ni of FIG. 12 on the following points.

Set unit 91 of FIG. 12 is provided with a N-channel MOS transistor N5, but set unit 291 of FIG. 16 is provided with a N-channel MOS transistor N25. Similar to N-channel MOS transistor N2, N-channel MOS transistor N25 is provided between node NDP1 and the line of ground voltage Vss. The gate of N-channel MOS transistor N21 receives a common latch-setting low signal LSL on both the positive side and the negative side.

Moreover, setting unit 94 in FIG. 12 is provided with a P-channel MOS transistor P5, but setting unit 294 in FIG. 16 is provided with a P-channel MOS transistor P25. P-channel MOS transistor P5 is connected to the line of power supply voltage VDD, but P-channel MOS transistor P25 is connected to a negative-side charge voltage line NGCV. In the present embodiment, the voltage applied to charge voltage line NGCV is Vb. In the present embodiment, the description will be carried out on a condition where Vb=VDD.

(Operation Timing)

Figure 17:
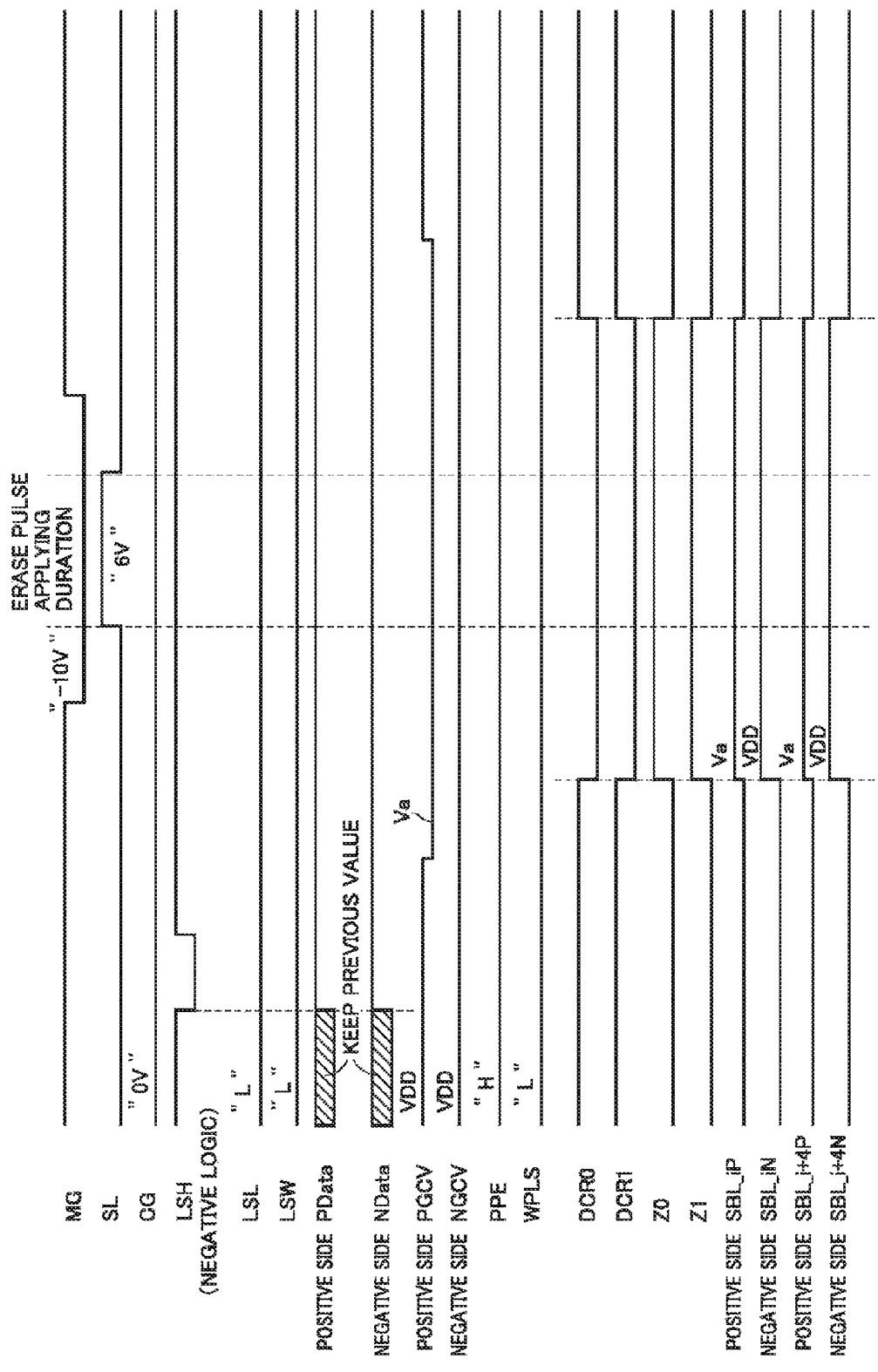
FIG. 17 is a diagram illustrating the operation timing where an erase pulse is applied to the twin cell data according to the third embodiment.

FIG. 17 is a diagram illustrating the operation timing of applying an erase pulse to the twin cell data according to the second embodiment.

Flash sequencer 7 sets ZMOS selection signals Z0 and Z1 to the "L" level, and sets discharge signals DCR0 and DCR1 to the "H" level. Thus, sub-bit lines SBL_0P to SBL_0P and SBL_0N to SBL_7N are connected to the line of ground voltage Vss.

Flash sequencer 7 sets programmed pulse-validating signal PPE to the "H" level, maintains writing pulse WPLS at the "L" level, and sets latch-setting high signal LSH to the "L" level temporarily and then to the "H" level. Subsequently, flash sequencer 7 maintains latch-setting low signal LSL at the "L" level and latch switching signal LSW at the "L" level.

Furthermore, flash sequencer 7 changes the voltage applied to positive-side charge voltage line PGCV from VDD to Va (0<Va<VDD), and maintains the voltage applied to the negative-side charge voltage line NGCV at VDD.

Thus, in main bit line voltage control circuits 52P0 to 52P3, latch data PData from node NDP1 is set to the "H" level, node NDP2 is set to the "L" level, N-channel MOS transistors N2 is turned off, P-channel MOS transistors P22 and P3 are turned on, and node NDP3 is set to the "H" level. As a result, the voltage of each of main bit lines WMBL_0P to WMBL_3P is equal to Va.

Meanwhile in main bit line voltage control circuits 52N0 to 52N3, latch data NData from node NDN1 is set to the "H" level, node NDN2 is set to the "L" level, N-channel MOS transistor N6 is turned off, P-channel MOS transistors P25 and P6 are turned on, and node NDN3 is set to the "H" level. As a result, the voltage of each of main bit lines WMBL_0N to WMBL_3N is equal to VDD.

Then, flash sequencer 7 sets discharge signals DCR0 and DCR1 to the "L" level. Thereby, sub-bit lines SBL_0P to SBL_7P and SBL_0N to SBL_7N are disconnected from the line of ground voltage Vss.

Flash sequencer 7 sets ZMOS selection signals Z0 and Z1 to the "H" level. Thus, main bit lines WMBL_iP (i=0 to 3) are connected to sub-bit lines SBL_iP and SBL_i+4P, and thereby the voltage of each of sub-bit line SBL_iP and SBL_i+4P is equal to Va (0<Va<VDD). Meanwhile, main bit lines WMBL_iN (i=0 to 3) are connected to sub-bit lines SBL_iN and SBL_i+4N, and thereby the voltage of each of sub-bit lines SBL_iN and SBL_i+4N is equal to VDD.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT erasure. Since the voltage of each of sub-bit lines SBL_0P to SBL_7P which are connected to positive cell MC1 is equal to Va (0<Va<VDD) and the voltage of each of sub-bit lines SBL_0N to SBL_7N which are connected to negative cell MC2 is equal to VDD, the erasing speed of positive cell MC1 is faster than that of negative cell MC2. Due to the different erasing speeds, the difference in threshold voltage Vth between twin cells MC1 and MC2 after erasure is independent on the twin cell data before erasure.

Then, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Next, flash sequencer 7 sets discharge signals DCR0 and DCR1 to the "H" level, and sets ZMOS selection signals Z0 and Z1 to the "L" level.

Thereby, main bit lines WMBL_iP (i=0 to 3) are disconnected from sub-bit lines SBL_iP and SBL_i+4P, and main bit lines WMBL_iN (i=0 to 3) are disconnected from sub-bit lines SBL_iN and SBL_i+4N. Meanwhile, sub-bit lines SBL_0P to SBL_7P and SBL_0N to SBL_7N are connected to the line of ground voltage Vss, and thus the voltage of each of sub-bit lines SBL_0N to SBL_7N is restored to ground voltage Vss.

Then, flash sequencer 7 restores the voltage applied to positive-side charge voltage line PGCV from Va to VDD.

As described above, in the present embodiment, the main bit line voltage control circuit sets the voltage of a bit line connected to the positive cell to Va and the voltage of a bit line connected to the negative cell to Vb (Vb=VDD) during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

Fourth Embodiment

Figure 18:
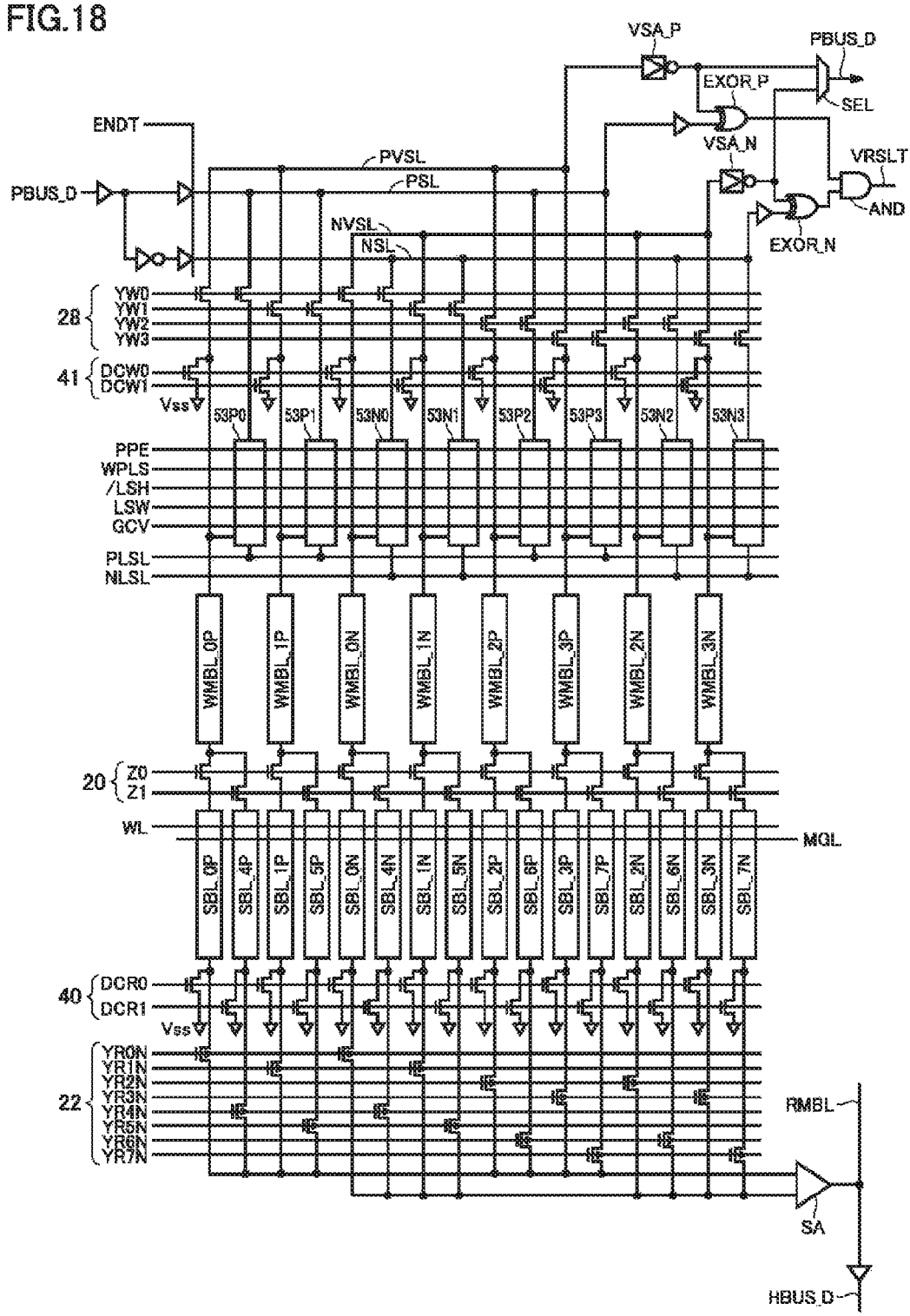
FIG. 18 is a diagram illustrating a detailed circuit configuration for reading, writing and erasing the twin cell data according to a fourth embodiment.

FIG. 18 is a diagram illustrating a detailed circuit configuration for reading, writing and erasing the twin cell data according to a fourth embodiment. Main bit line voltage control circuits 51P0 to 51P3 and 51N0 to 51N3 in the circuit configuration of FIG. 10 are replaced by main bit line voltage control circuits 53P0 to 53P3 and 53N0 to 53N3 in the circuit configuration of FIG. 18.

Figure 19:
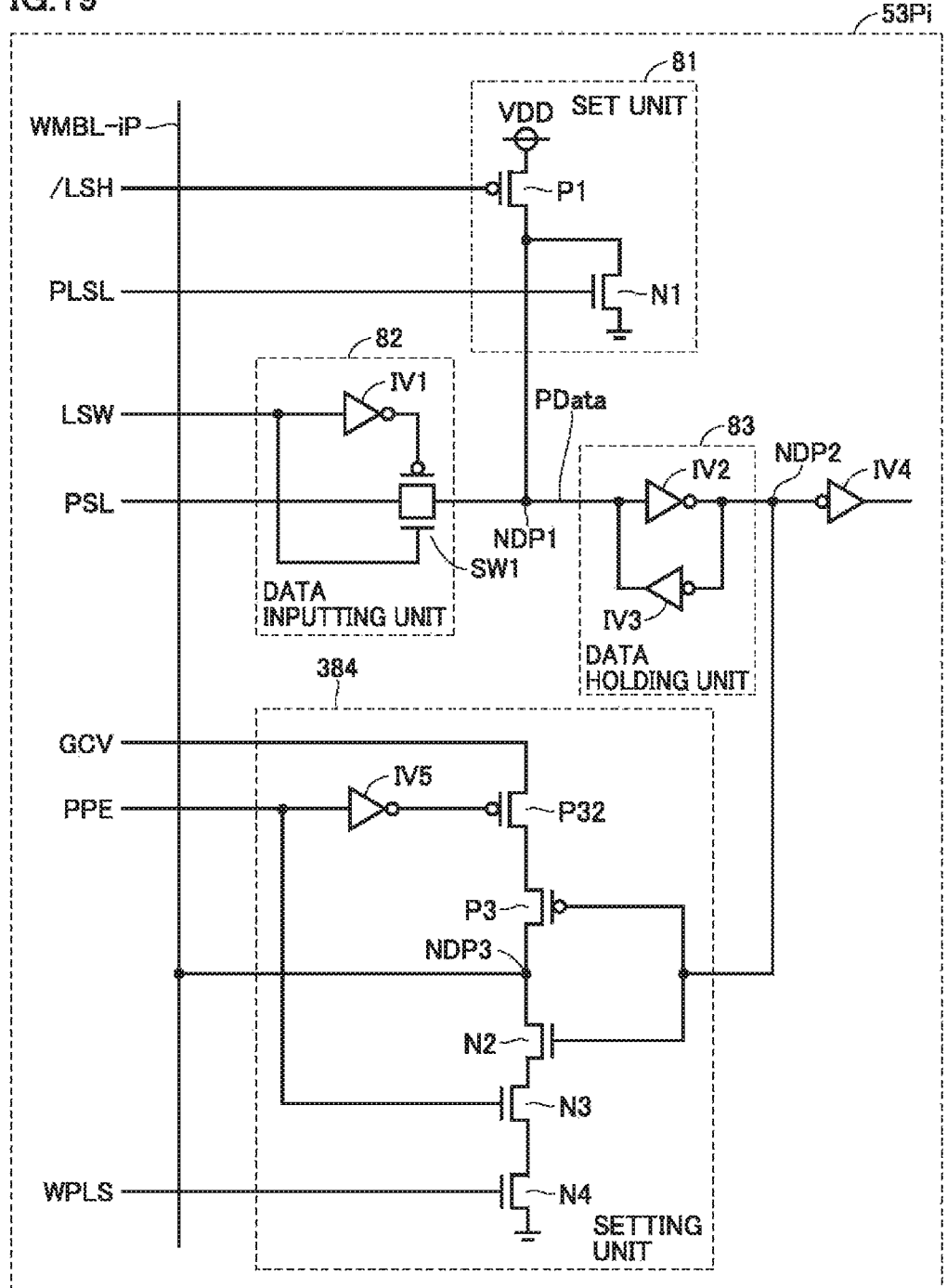
FIG. 19 is a diagram illustrating the configuration of a positive-side main bit line voltage control circuit according to the fourth embodiment.

FIG. 19 is a diagram illustrating the configuration of main bit line voltage control circuit 53Pi (i=0 to 3) according to the fourth embodiment. Main bit line voltage control circuit 53Pi of FIG. 19 differs from main bit line voltage control circuit 51Pi of FIG. 11 on the following points.

Setting unit 84 in FIG. 11 is provided with a P-channel MOS transistor P2, but setting unit 384 in FIG. 19 is provided with a P-channel MOS transistor P32. P-channel MOS transistor P2 is connected to the line of power supply voltage VDD, but P-channel MOS transistor P32 is connected to a charge voltage line GCV common on the positive side and the negative side. In the present embodiment, normally the voltage applied to charge voltage line GCV is set equal to VDD, and it is set to Va (≠VDD) during the period of applying an erase pulse and a period before applying the erase pulse and a period after applying the erase pulse.

Figure 20:
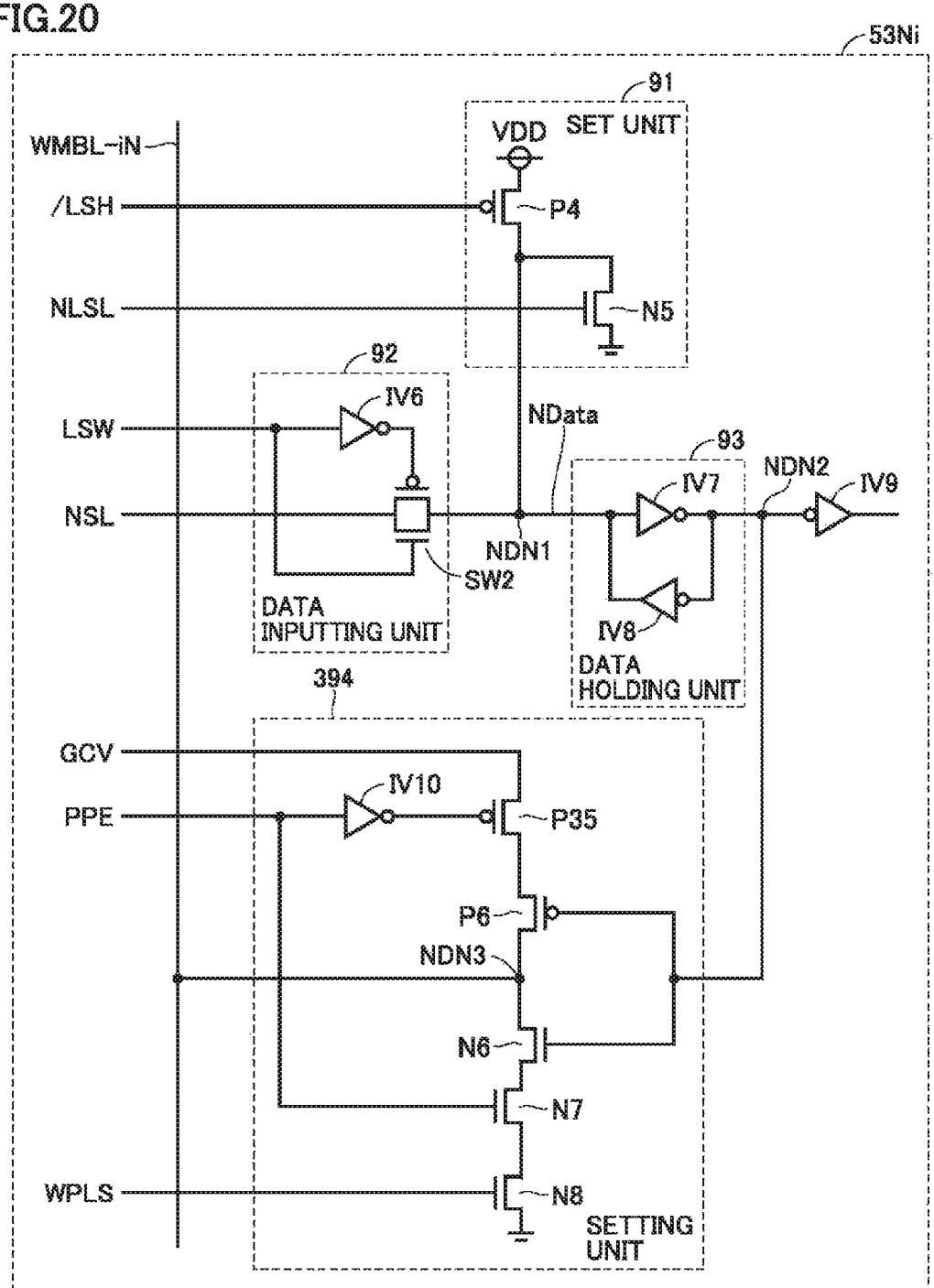
FIG. 20 is a diagram illustrating the configuration of a negative-side main bit line voltage control circuit according to the fourth embodiment.

FIG. 20 is a diagram illustrating the configuration of main bit line voltage control circuit 53Ni (i=0 to 3) according to the fourth embodiment. Main bit line voltage control circuit 53Ni of FIG. 20 differs from main bit line voltage control circuit 51Ni of FIG. 12 on the following points.

Setting unit 94 in FIG. 12 is provided with a P-channel MOS transistor P5, but setting unit 394 in FIG. 20 is provided with a P-channel MOS transistor P35. P-channel MOS transistor P5 is connected to the line of power supply voltage VDD, but P-channel MOS transistor P35 is connected to charge voltage line GCV. In the present embodiment, normally the voltage applied to charge voltage line GCV is set equal to VDD, and it is set to Va (≠VDD) during the period of applying an erase pulse and a period before applying the erase pulse and a period after applying the erase pulse.

(Operation Timing)

Figure 21:
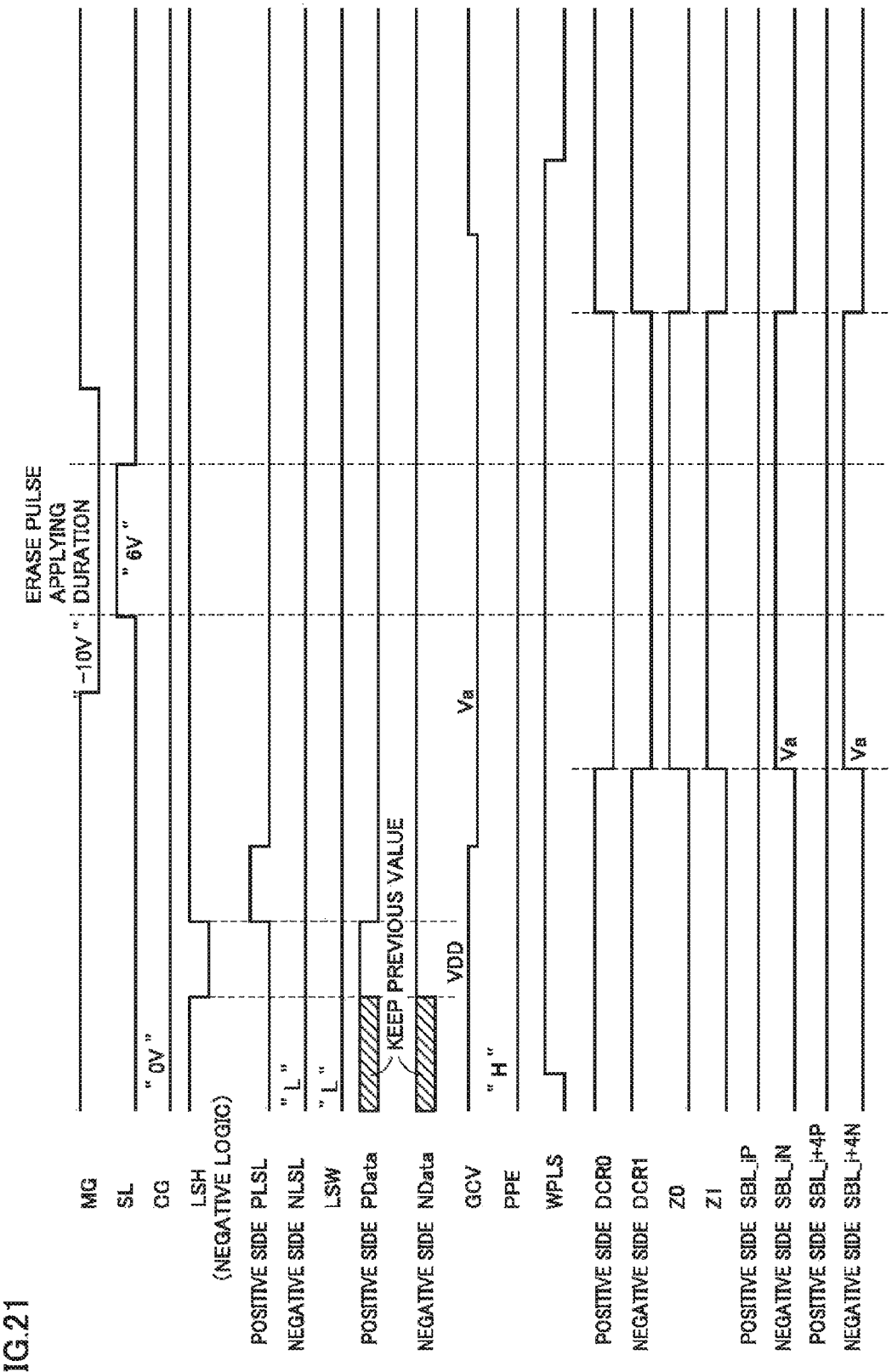
FIG. 21 is a diagram illustrating the operation timing where an erase pulse is applied to the twin cell data according to the fourth embodiment.

FIG. 21 is a diagram illustrating the operation timing of applying an erase pulse to the twin cell data according to the fourth embodiment.

Flash sequencer 7 sets ZMOS selection signals Z0 and Z1 to the "L" level, and sets discharge signals DCR0 and DCR1 to the "H" level. Thus, sub-bit lines SBL_0P to SBL_0P and SBL_0N to SBL_0N are connected to the line of ground voltage Vss.

Flash sequencer 7 sets programmed pulse-validating signal PPE to the "H" level, sets writing pulse WPLS to the "H" level, and sets latch-setting high signal LSH to the "L" level temporarily and then to the "H" level. Subsequently, flash sequencer 7 sets positive latch-setting low signal PLSL to the "H" level temporarily and then to the "L" level, and maintains negative latch-setting low signal NLSL at the "L" level and latch switching signal LSW at the "L" level.

Furthermore, flash sequencer 7 changes the voltage applied to charge voltage line GCV connected to P-channel MOS transistors P32 and P35 from VDD to Va (0<Va<VDD).

Thus, in main bit line voltage control circuits 53P0 to 53P3, latch data PData from node NDP1 is set to the "L" level, node NDP2 is set to the "H" level, N-channel MOS transistors N2, N3 and N4 are turned on, P-channel MOS transistor P3 is turned off, and node NDP3 is set to the "L" level. As a result, the voltage of each of main bit lines WMBL_0P to WMBL_3P is equal to ground voltage Vss.

Meanwhile in main bit line voltage control circuits 53N0 to 53N3, latch data NData from node NDN1 is set to the "H" level, node NDN2 is set to the "L" level, N-channel MOS transistor N6 is turned off, P-channel MOS transistors P35 and P6 are turned on, and node NDN3 is set to the "H" level. As a result, the voltage of each of main bit lines WMBL_0N to WMBL_3N is equal to Va.

Then, flash sequencer 7 sets discharge signals DCR0 and DCR1 to the "L" level. Thereby, sub-bit lines SBL_0P to SBL_7P and SBL_0N to SBL_7N are disconnected from the line of ground voltage Vss.

Flash sequencer 7 sets ZMOS selection signals Z0 and Z1 to the "H" level. Thus, main bit lines WMBL_iP (i=0 to 3) are connected to sub-bit lines SBL_iP and SBL_i+4P, and thereby, the voltage of each of sub-bit line SBL_iP and SBL_i+4P is equal to ground voltage Vss. Meanwhile, main bit lines WMBL_iN (i=0 to 3) are connected to sub-bit lines SBL_iN and SBL_i+4N, and thereby, the voltage of each of sub-bit lines SBL_iN and SBL_i+4N is equal to Va.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT erasure. Since the voltage of each of sub-bit lines SBL_0P to SBL_7P which are connected to positive cell MC1 is equal to ground voltage Vss and the voltage of each of sub-bit lines SBL_0N to SBL_7N which are connected to negative cell MC2 is equal to Va, the erasing speed of positive cell MC1 is faster than that of negative cell MC2. Due to the different erasing speeds, the difference in threshold voltage Vth between twin cells MC1 and MC2 after erasure is independent on the twin cell data before erasure.

Then, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Next, flash sequencer 7 sets discharge signals DCR0 and DCR1 to the "H" level, and sets ZMOS selection signals Z0 and Z1 to the "L" level.

Thus, main bit lines WMBL_iP (i=0 to 3) are disconnected from sub-bit lines SBL_iP and SBL_i+4P, and main bit lines WMBL_iN (i=0 to 3) are disconnected from sub-bit lines SBL_iN and SBL_i+4N. Meanwhile, sub-bit lines SBL_0P to SBL_7P and SBL_0N to SBL_7N are connected to the line of ground voltage Vss, and thereby, the voltage of each of sub-bit lines SBL_0N to SBL_7N is restored to ground voltage Vss.

Then, flash sequencer 7 restores the voltage applied to charge voltage line GCV from Va to VDD.

As described above, in the present embodiment, the main bit line voltage control circuit sets the voltage of a bit line connected to the positive cell to Vss and the voltage of a bit line connected to the negative cell to Va (0<Va<VDD) during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

Fifth Embodiment

Figure 22:
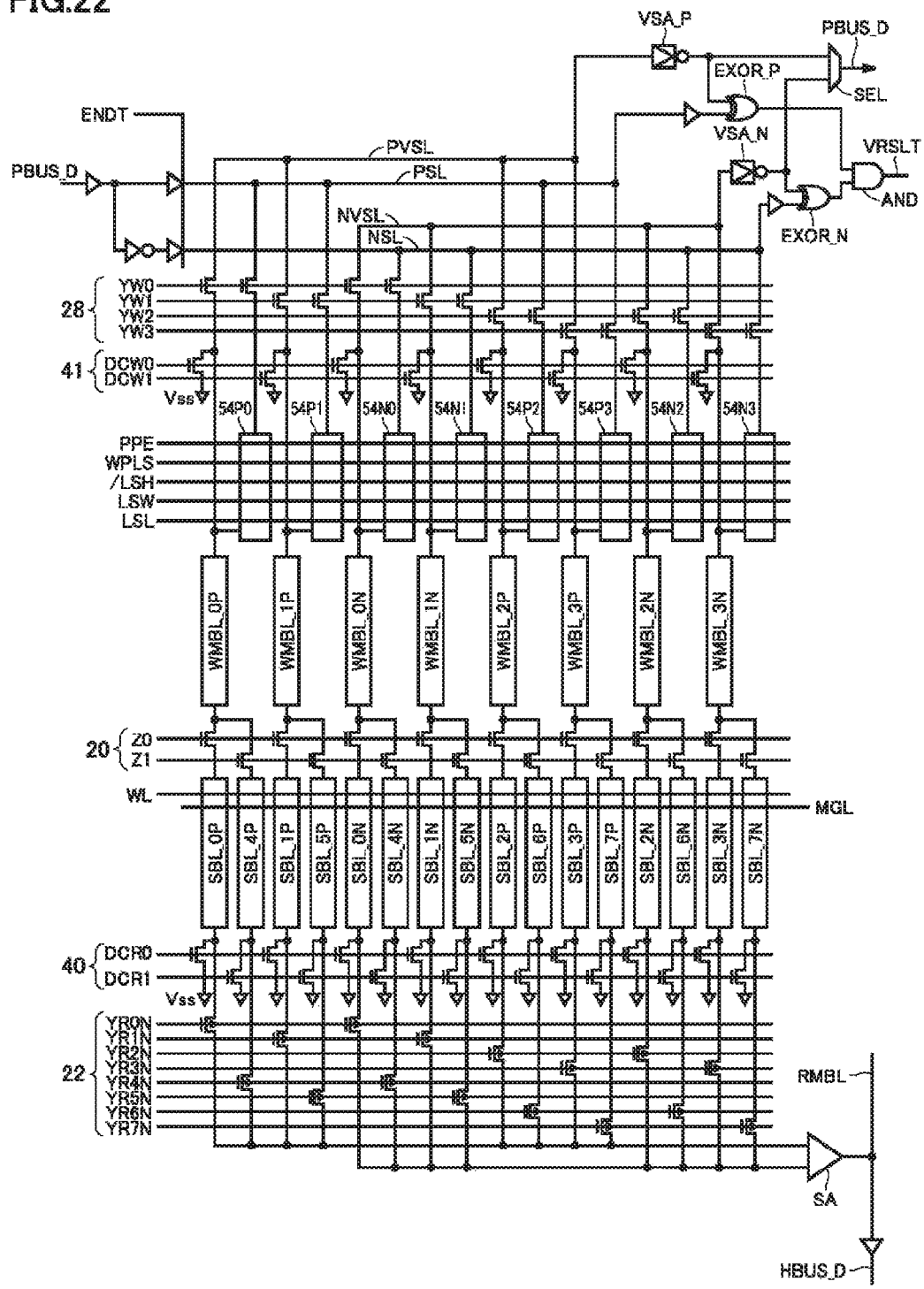
FIG. 22 is a diagram illustrating a detailed circuit configuration for reading, writing and erasing the twin cell data according to a fifth embodiment.

FIG. 22 is a diagram illustrating a detailed circuit configuration for reading, writing and erasing the twin cell data according to a fifth embodiment. Main bit line voltage control circuits 51P0 to 51P3 and 51N0 to 51N3 in the circuit configuration of FIG. 10 are replaced by main bit line voltage control circuits 54P0 to 54P3 and 54N0 to 54N3 in the circuit configuration of FIG. 22.

Figure 23:
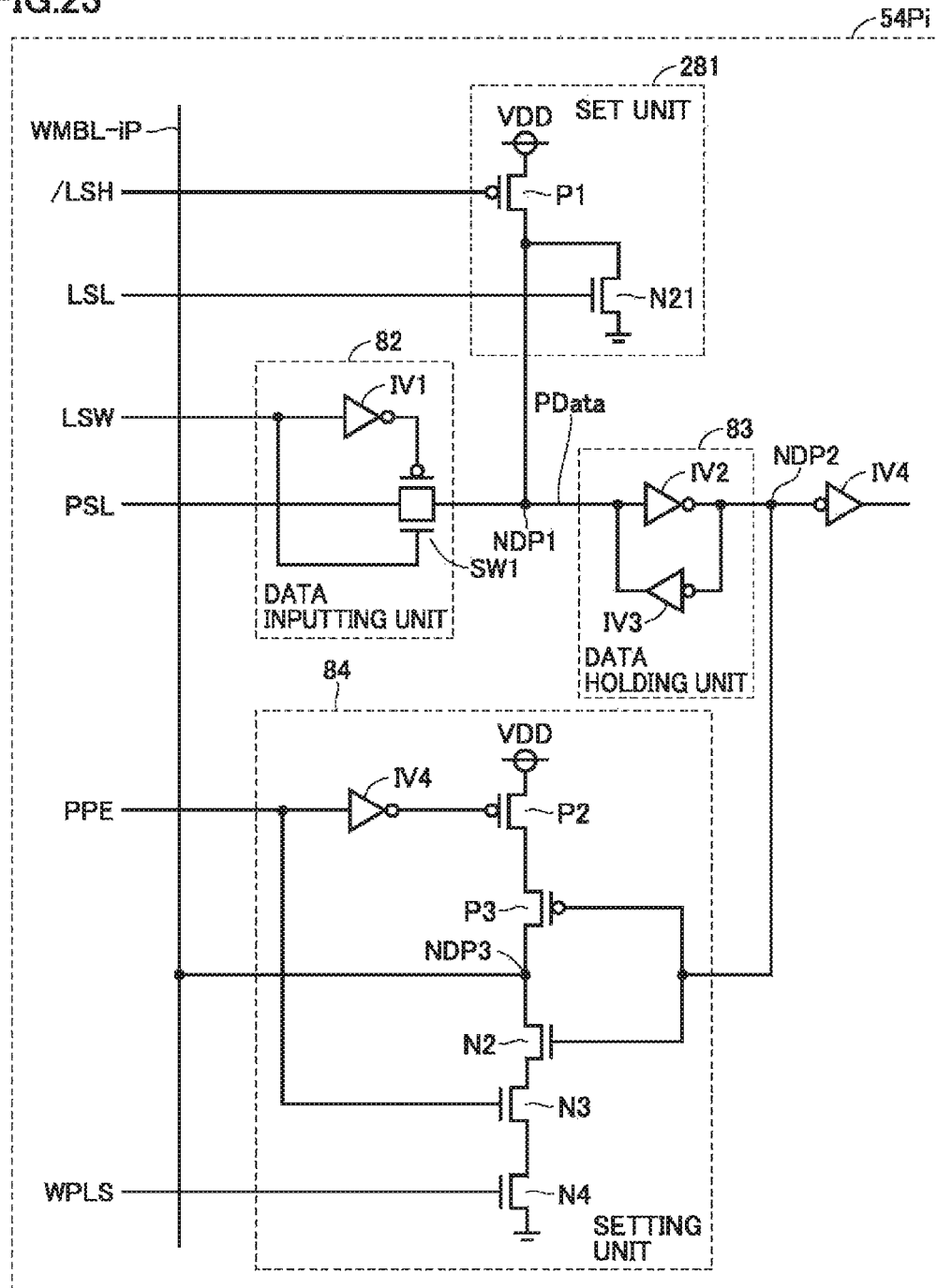
FIG. 23 is a diagram illustrating the configuration of a positive-side main bit line voltage control circuit according to the fifth embodiment.

FIG. 23 is a diagram illustrating the configuration of main bit line voltage control circuit 54Pi (i=0 to 3) according to the fifth embodiment. Main bit line voltage control circuit 54Pi of FIG. 23 differs from main bit line voltage control circuit 51Pi of FIG. 11 on the following points.

Set unit 81 in FIG. 11 is provided with a N-channel MOS transistor N1, but set unit 281 in FIG. 23 is provided with a N-channel MOS transistor N21. Similar to N-channel MOS transistor N1, N-channel MOS transistor N21 is provided between node NDP1 and the line of ground voltage Vss. The gate of N-channel MOS transistor N21 receives a common latch-setting low signal LSL on both the positive side and the negative side.

Figure 24:
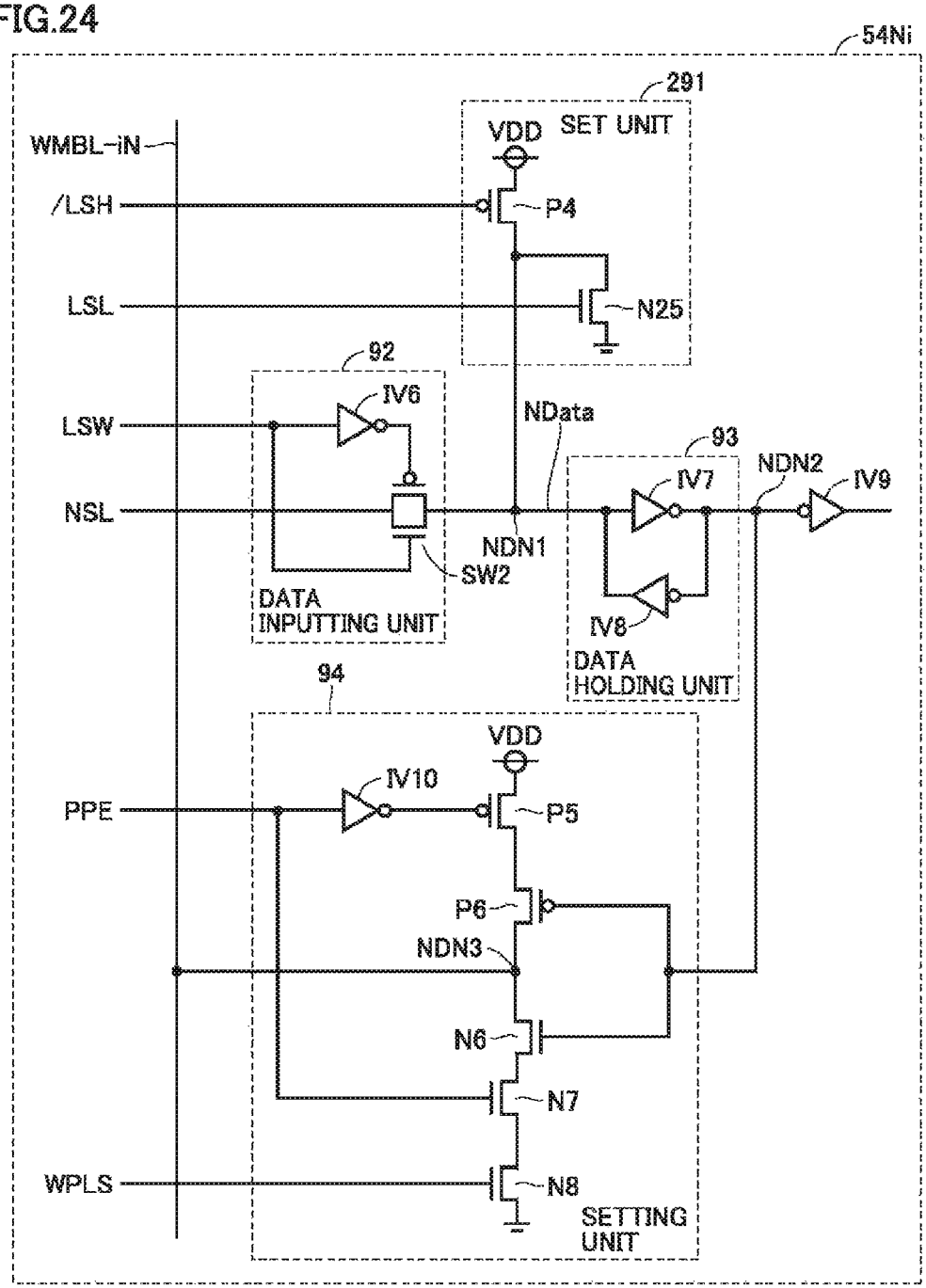
FIG. 24 is a diagram illustrating the configuration of a positive-side main bit line voltage control circuit according to the fifth embodiment.

FIG. 24 is a diagram illustrating the configuration of main bit line voltage control circuit 54Ni (i=0 to 3) according to the fifth embodiment. Main bit line voltage control circuit 54Ni of FIG. 24 differs from main bit line voltage control circuit 51Ni of FIG. 12 on the following points.

Set unit 91 in FIG. 12 is provided with a N-channel MOS transistor N5, but set unit 291 in FIG. 24 is provided with a N-channel MOS transistor N25. Similar to N-channel MOS transistor N2, N-channel MOS transistor N25 is provided between node NDP1 and the line of ground voltage Vss. The gate of N-channel MOS transistor N21 receives a common latch-setting low signal RSL on both the positive side and the negative side.

(Operation Timing)

Figure 25:
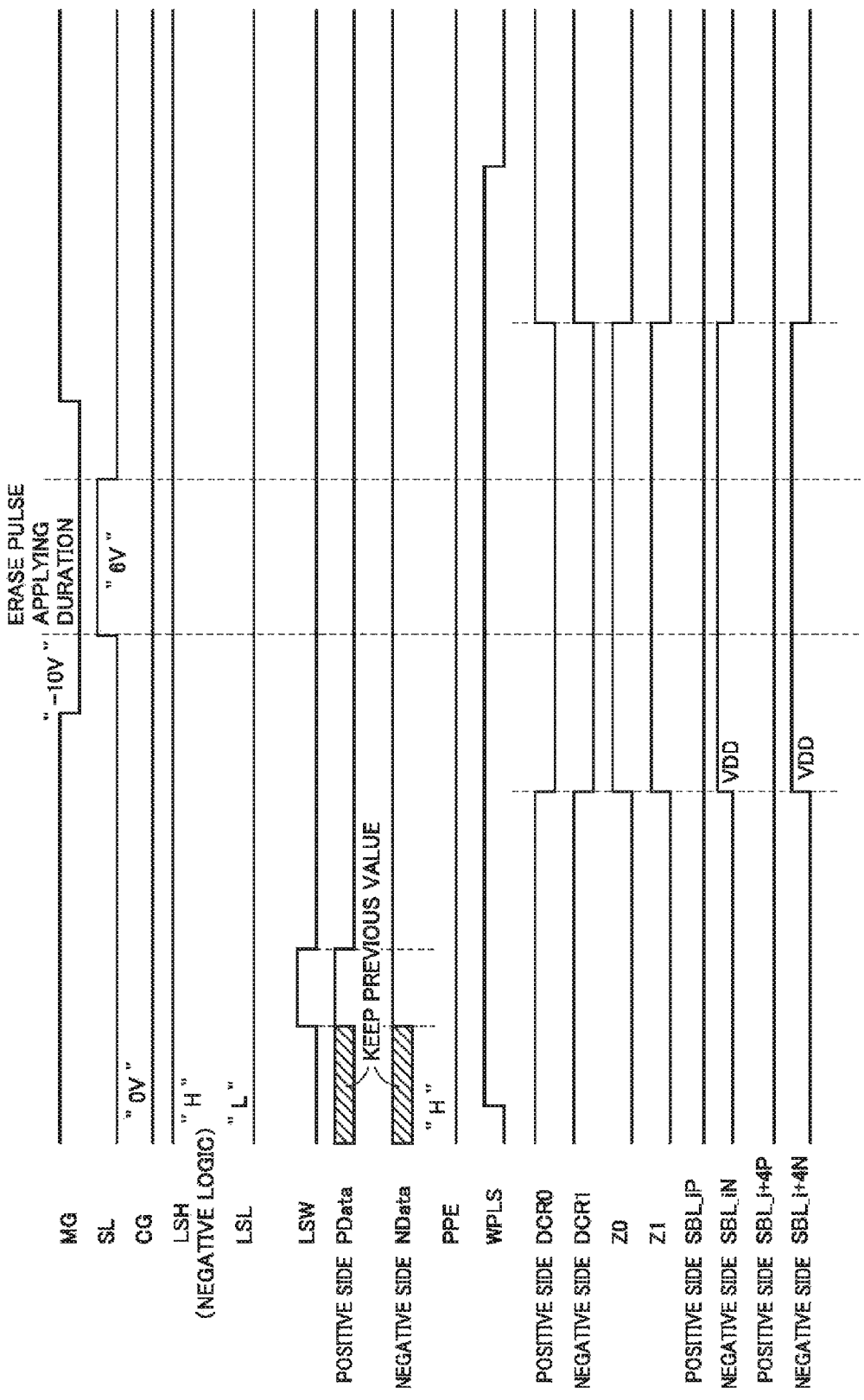
FIG. 25 is a diagram illustrating the operation timing where an erase pulse is applied to the twin cell data according to the fifth embodiment.

FIG. 25 is a diagram illustrating the operation timing of applying an erase pulse to the twin cell data according to the fifth embodiment.

Flash sequencer 7 sets ZMOS selection signals Z0 and Z1 to the "L" level, and sets discharge signals DCR0 and DCR1 to the "H" level. Thus, sub-bit lines SBL_0P to SBL_0P and SBL_0N to SBL_7N are connected to the line of ground voltage Vss.

Flash sequencer 7 sets programmed pulse-validating signal PPE to the "H" level and writing pulse WPLS to the "L" level, and maintains latch-setting high signal LSH at the "H" level temporarily and latch-setting low signal LSL at the "L" level.

Moreover, flash sequencer 7 sets latch switching signal LSW temporarily to the "H" level. Furthermore, flash sequencer 7 outputs the data of the "L" level to data bus PBUS_D so as to transmit the "L" level to main bit line voltage control circuits 54P0 to 54P3 through non-inverted signal line PSL and transmit the "H" level to main bit line voltage control circuits 54N0 to 54N3 through inverted signal line NSL.

Thus, in main bit line voltage control circuits 54P0 to 54P3, switch SW1 is turned on, latch data PData from node NDP1 is set to the "L" level, node NDP2 is set to the "H" level, N-channel MOS transistors N2, N3 and N4 are turned on, P-channel MOS transistor P3 is turned off, and node NDP3 is set to the "L" level. As a result, the voltage of each of main bit lines WMBL_0P to WMBL_3P is equal to ground voltage Vss.

Meanwhile in main bit line voltage control circuits 51N0 to 51N3, switch SW2 is turned on, latch data NData from node NDN1 is set to the "H" level, node NDN2 is set to the "L" level, N-channel MOS transistor N6 is turned off, P-channel MOS transistors P5 and P6 are turned on, and node NDN3 is set to the "H" level. As a result, the voltage of each of main bit lines WMBL_0N to WMBL_3N is equal to VDD.

The subsequent operations are the same as those in the second embodiment, and the descriptions thereof will not be repeated.

As described above, according to the present embodiment, similar to the second embodiment, it is possible to prevent the data previously stored in the twin cell from being read out after erasure.

Sixth Embodiment

Figure 26:
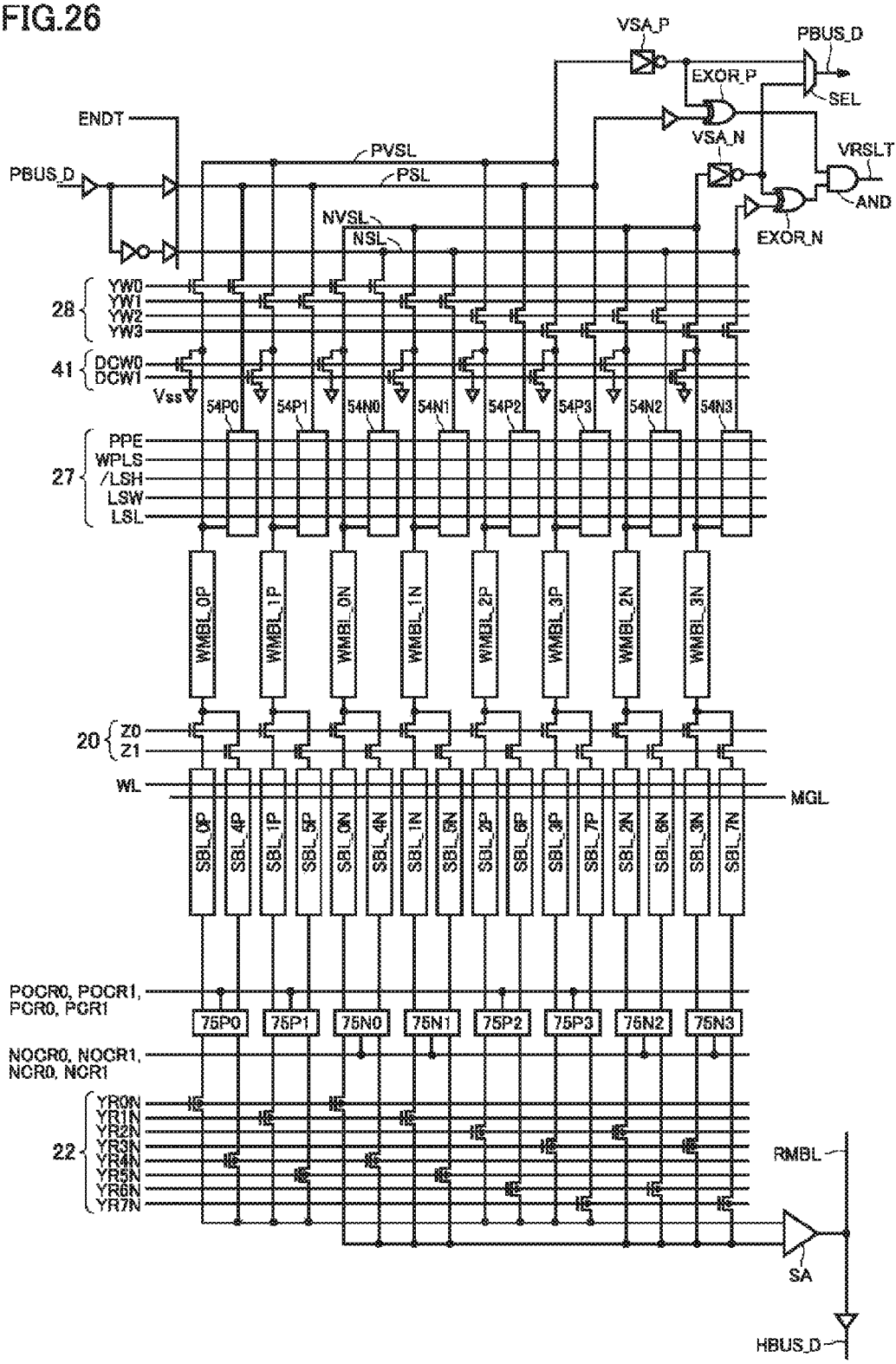
FIG. 26 is a diagram illustrating a detailed circuit configuration for reading, writing and erasing the twin cell data according to a sixth embodiment.

FIG. 26 is a diagram illustrating a detailed circuit configuration for reading, writing and erasing the twin cell data according to a sixth embodiment.

Reading system discharge circuit 40 in the circuit configuration of FIG. 22 is replaced by main bit line voltage control circuits 75P0 to 75P3 and 75N0 to 75N3 in the circuit configuration of FIG. 26.

Sub-bit line voltage control circuit 75Pi, during the reading and during the application of erase pulse to the twin cell data, controls the voltage of sub-bit line SBL_iP and the voltage of sub-bit line SBL_i+4P. Sub-bit line voltage control circuit 75Ni, during the reading and during the application of erase pulse to the twin cell data, controls the voltage of sub-bit line SBL_iN and the voltage of sub-bit line SBL_i+4N.

Figure 27:
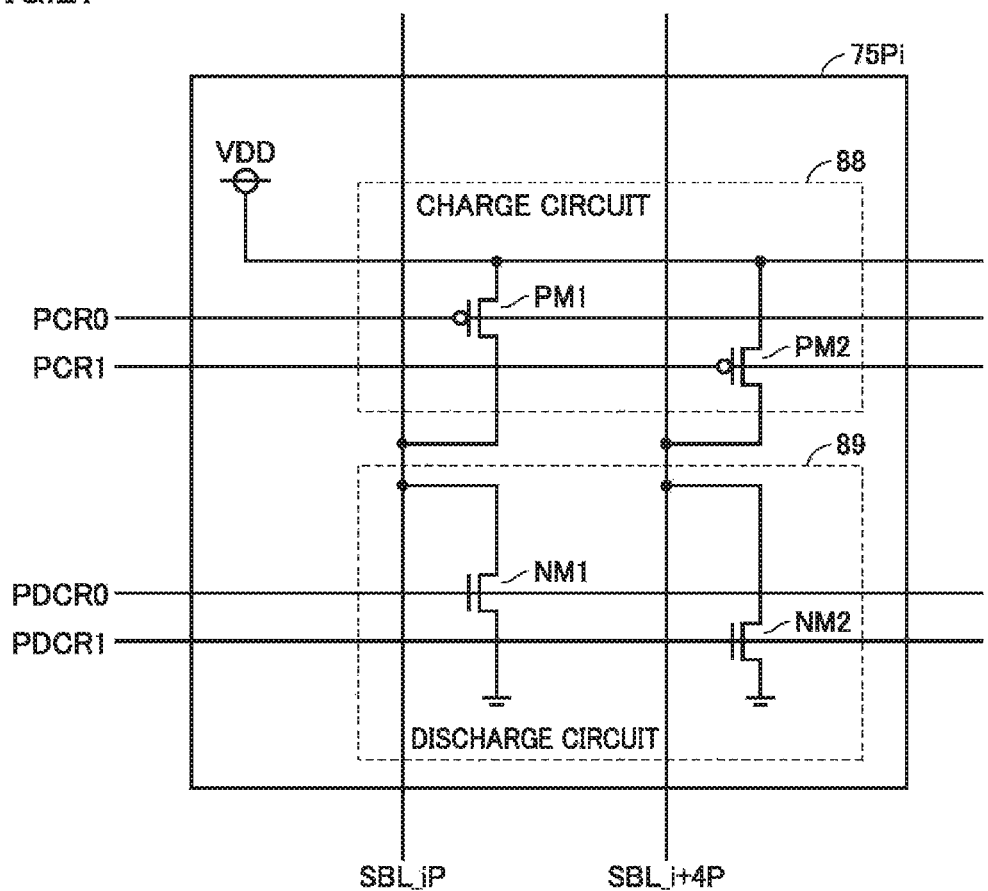
FIG. 27 is a diagram illustrating the configuration of a positive-side sub-bit line voltage control circuit according to the sixth embodiment.

FIG. 27 is a diagram illustrating the configuration of sub-bit line voltage control circuit 75Pi (i=0 to 3) according to the sixth embodiment. Sub-bit line voltage control circuit 75Pi includes a charge circuit 88 and a discharge circuit 89.

Charge circuit 88 is provided with P-channel MOS transistors PM1 and PM2. P-channel MOS transistor PM1 is provided between a line of power supply voltage VDD and sub-bit line SBL_iP. The gate of P-channel MOS transistor PM1 is configured to receive a positive charge signal PCR0. P-channel MOS transistor PM2 is provided between a line of power supply voltage VDD and sub-bit line SBL_i+4P. The gate of P-channel MOS transistor PM2 is configured to receive a positive charge signal PCR1.

Discharge circuit 89 is provided with N-channel MOS transistors NM1 and NM2. N-channel MOS transistor NM1 is provided between sub-bit line SBL_iP and the line of ground voltage Vss. The gate of N-channel MOS transistor NM1 is configured to receive a positive discharge signal PDCR0. N-channel MOS transistor NM2 is provided between sub-bit line SBL_i+4P and the line of ground voltage Vss. The gate of N-channel MOS transistor NM2 is configured to receive a positive discharge signal PDCR1.

During the reading of the twin cell data, sub-bit line voltage control circuit 75Pi selectively connects sub-bit lines SBL_iP and/or SBL_i+4P which are not selected by sub-bit line selector 20 to ground voltage Vss in accordance with positive discharge signals PDCR0 and PDCR1.

Figure 28:
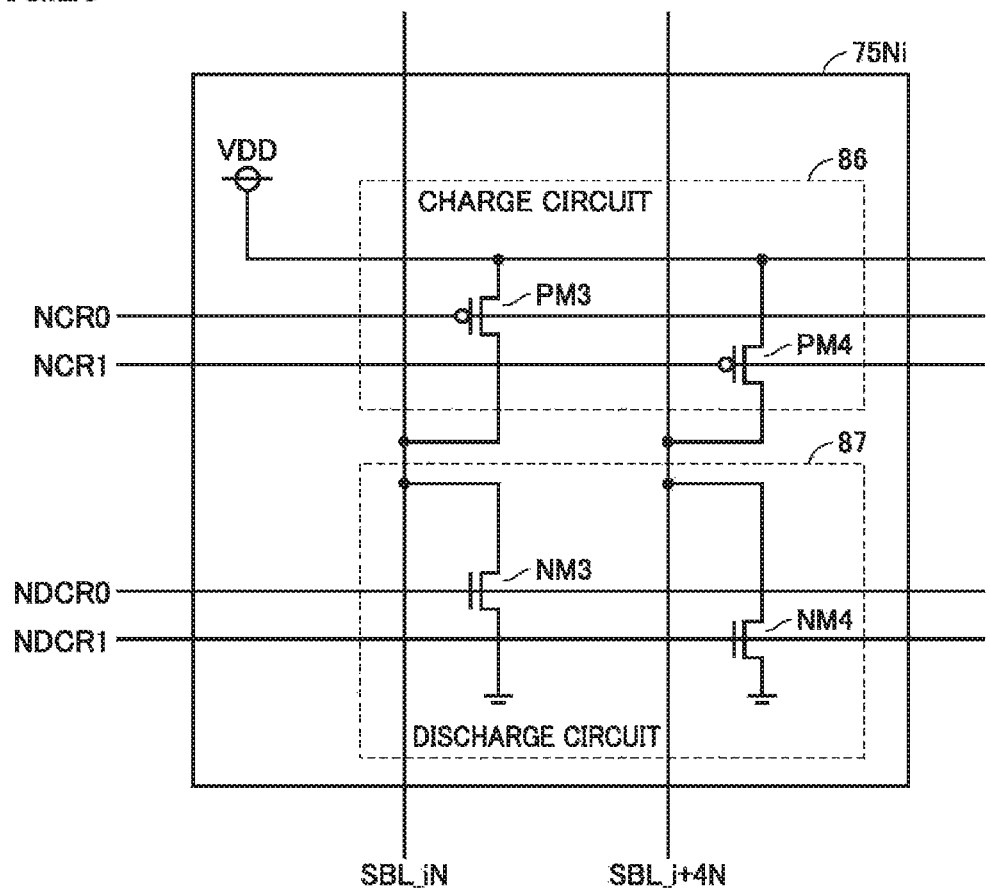
FIG. 28 is a diagram illustrating the configuration of a negative-side sub-bit line voltage control circuit according to the sixth embodiment.

FIG. 28 is a diagram illustrating the configuration of sub-bit line voltage control circuit 75Ni (i=0 to 3) according to the sixth embodiment. Sub-bit line voltage control circuit 75Ni includes a charge circuit 86 and a discharge circuit 87.

Charge circuit 86 is provided with P-channel MOS transistors PM3 and PM4. P-channel MOS transistor PM3 is provided between a line of power supply voltage VDD and sub-bit line SBL_iN. The gate of P-channel MOS transistor PM3 is configured to receive a negative charge signal NCR0. P-channel MOS transistor PM4 is provided between a line of power supply voltage VDD and sub-bit line SBL_i+4N. The gate of P-channel MOS transistor PM4 is configured to receive a negative charge signal NCR1.

Discharge circuit 87 is provided with N-channel MOS transistors NM3 and NM4. N-channel MOS transistor NM3 is provided between sub-bit line SBL_iN and the line of ground voltage Vss. The gate of N-channel MOS transistor NM3 is configured to receive a negative discharge signal NDCR0. N-channel MOS transistor NM4 is provided between sub-bit line SBL_i+4N and the line of ground voltage Vss. The gate of N-channel MOS transistor NM4 is configured to receive a negative discharge signal NDCR1.

During the reading of the twin cell data, sub-bit line voltage control circuit 75Ni selectively connects sub-bit lines SBL_iN and/or SBL_i+4N which are not selected by sub-bit line selector 20 to ground voltage Vss in accordance with negative discharge signals NDCR0 and NDCR1.

(Operation Timing)

Figure 29:
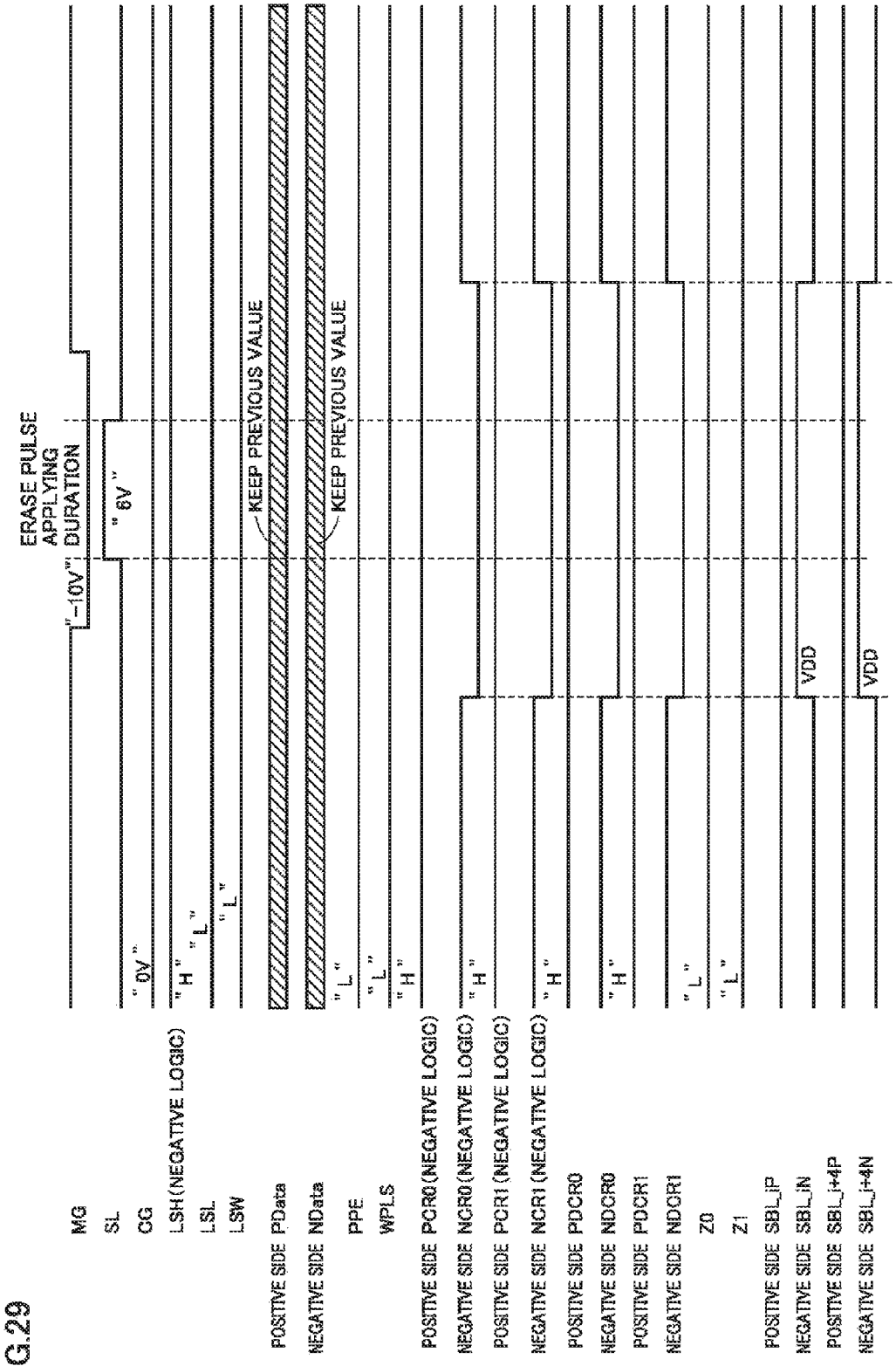
FIG. 29 is a diagram illustrating the operation timing where an erase pulse is applied to the twin cell data according to the sixth embodiment.

FIG. 29 is a diagram illustrating the operation timing of applying an erase pulse to the twin cell data according to the sixth embodiment.

Flash sequencer 7 sets programmed pulse-validating signal PPE to the "L" level and writing pulse WPLS to the "H" level, maintains latch-setting high signal LSH at the "H" level and latch-setting low signal LSL at the "L" level, and maintains latch switching signal LSW at the "L" level and ZMOS selection signals Z0 and Z1 at the "L" level.

Flash sequencer 7 maintains positive charge signals PCR0 and PCR1 at the "H" level, and sets negative charge signals NCR0 and NCR1 to the "L" level. Moreover, flash sequencer 7 maintains positive discharge signals PDCR0 and PDCR1 at the "H" level, and sets negative discharge signals NDCR0 and NDCR1 to the "L" level.

Thus, in sub-bit line voltage control circuits 75P0 to 75P3, P-channel MOS transistors PM1 and PM2 are turned off, and N-channel MOS transistors NM1 and NM2 are turned off. As a result, the voltage of each of sub-bit lines SBL_iP and SBL_i+4P is equal to ground voltage Vss.

Meanwhile in sub-bit line voltage control circuits 75N0 to 75N3, P-channel MOS transistors PM3 and PM4 are turned on, and N-channel MOS transistors NM3 and NM4 are turned off. As a result, the voltage of each of sub-bit lines SBL_iN and SBL_i+4N is equal to VDD.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT erasure. Since the voltage of each of sub-bit lines SBL_0P to SBL_7P which are connected to positive cell MC1 is equal to ground voltage Vss and the voltage of each of sub-bit lines SBL_0N to SBL_7N which are connected to negative cell MC2 is equal to VDD, the erasing speed of positive cell MC1 is faster than that of negative cell MC2. Due to the different erasing speeds, the difference in threshold voltage Vth between twin cells MC1 and MC2 after erasure is independent on the twin cell data before erasure.

Next, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Then, flash sequencer 7 restores negative charge signals NCR0 and NCR1 to the "H" level, and restores negative discharge signals NDCR0 and NDCR1 to the "H" level. As a result, sub-bit lines SBL_0P to SBL_7P and SBL_0N to SBL_7N are connected to the line of ground voltage Vss, and thereby the voltage of each of sub-bit lines SBL_0N to SBL_7N is restored to ground voltage Vss.

As described above, in the present embodiment, the sub-bit line voltage control circuit sets the voltage of a bit line connected to the positive cell to Vss and the voltage of a bit line connected to the negative cell to VDD during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

Seventh Embodiment

Figure 30:
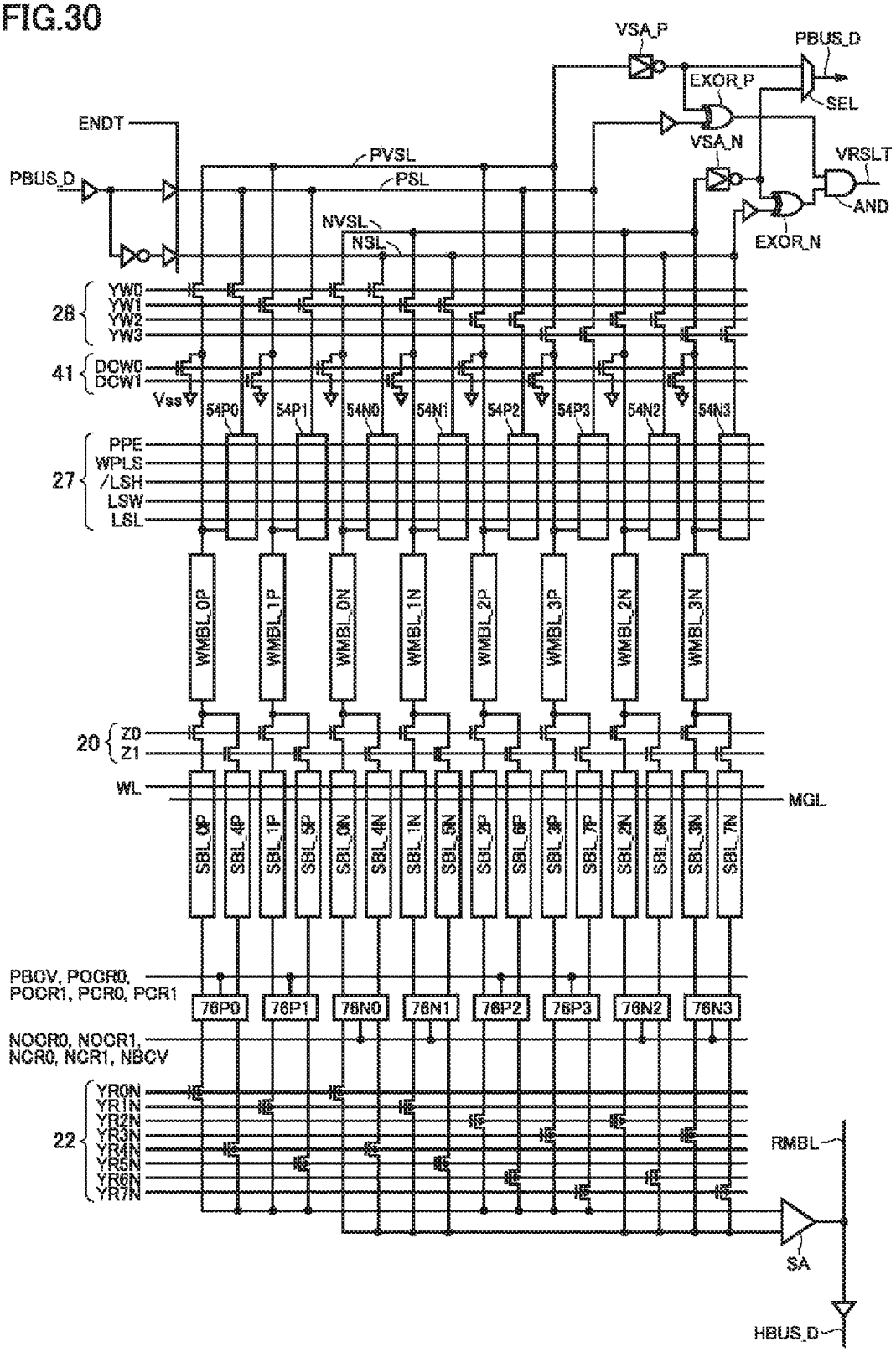
FIG. 30 is a diagram illustrating a detailed circuit configuration for reading, writing and erasing the twin cell data according to a seventh embodiment.

FIG. 30 is a diagram illustrating a detailed circuit configuration for reading, writing and erasing the twin cell data according to a seventh embodiment. Sub-bit line voltage control circuits 75P0 to 75P3 and 75N0 to 75N3 in the circuit configuration of FIG. 26 are replaced by sub-bit line voltage control circuits 76P0 to 76P3 and 76N0 to 76N3 in the circuit configuration of FIG. 30.

Figure 31:
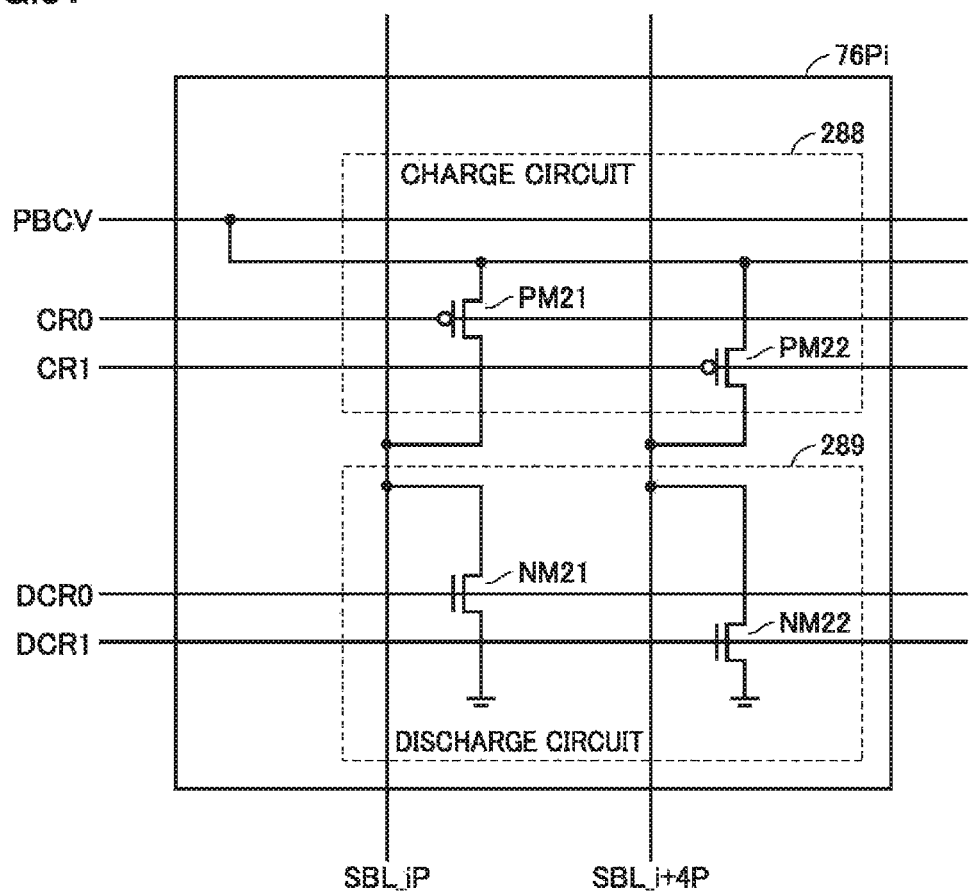
FIG. 31 is a diagram illustrating the configuration of a positive-side sub-bit line voltage control circuit according to the seventh embodiment.

FIG. 31 is a diagram illustrating the configuration of sub-bit line voltage control circuit 76Pi (i=0 to 3) according to the seventh embodiment. Sub-bit line voltage control circuit 76Pi includes a charge circuit 288 and a discharge circuit 289.

Charge circuit 288 is provided with P-channel MOS transistors PM21 and PM22. P-channel MOS transistor PM21 is provided between a positive-side charge voltage line PBCV and sub-bit line SBL_iP. The gate of P-channel MOS transistor PM21 is configured to receive a common charge signal CR0 on both the positive side and the negative side. P-channel MOS transistor PM22 is provided between positive-side charge voltage line PBCV and sub-bit line SBL_i+4P. The gate of P-channel MOS transistor PM2 is configured to receive a common charge signal CR1 on both the positive side and the negative side. In the present embodiment, normally the voltage applied to charge voltage line PBCV is set equal to VDD, and it is set to Va (≠VDD) during the period of applying an erase pulse and a period before applying the erase pulse and a period after applying the erase pulse.

Discharge circuit 289 is provided with N-channel MOS transistors NM21 and NM22. N-channel MOS transistor NM21 is provided between sub-bit line SBL_iP and the line of ground voltage Vss. The gate of N-channel MOS transistor NM21 is configured to receive a common discharge signal DCR0 on both the positive side and the negative side. N-channel MOS transistor NM22 is provided between sub-bit line SBL_i+4P and the line of ground voltage Vss. The gate of N-channel MOS transistor NM22 is configured to receive a common discharge signal DCR1 on both the positive side and the negative side.

Figure 32:
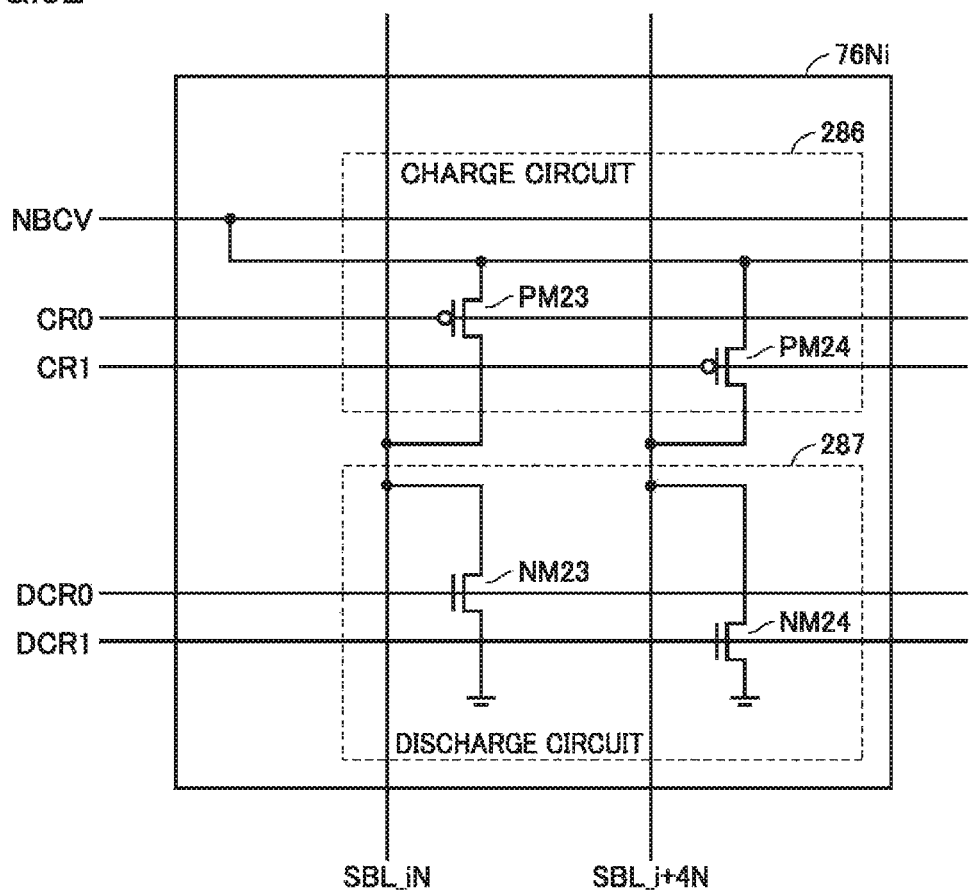
FIG. 32 is a diagram illustrating the configuration of a negative-side sub-bit line voltage control circuit according to the seventh embodiment.

FIG. 32 is a diagram illustrating the configuration of sub-bit line voltage control circuit 76Ni (i=0 to 3) according to the seventh embodiment. Sub-bit line voltage control circuit 76Ni includes a charge circuit 286 and a discharge circuit 287.

Charge circuit 286 is provided with P-channel MOS transistors PM23 and PM24. P-channel MOS transistor PM23 is provided between a negative charge voltage line NBCV and sub-bit line SBL_iN. The gate of P-channel MOS transistor PM23 is configured to receive a common charge signal CR0 on both the positive side and the negative side. P-channel MOS transistor PM24 is provided between a negative charge voltage line NBCV and sub-bit line SBL_i+4N. The gate of P-channel MOS transistor PM24 is configured to receive a common charge signal CR1 on both the positive side and the negative side. In the present embodiment, the voltage applied to charge voltage line NBCV is VDD. In the present embodiment, the description will be carried out on a condition where Vb=VDD.

Discharge circuit 287 is provided with N-channel MOS transistors NM23 and NM24. N-channel MOS transistor NM23 is provided between sub-bit line SBL_iN and the line of ground voltage Vss. The gate of N-channel MOS transistor NM23 is configured to receive a common discharge signal DCR0 on both the positive side and the negative side. N-channel MOS transistor NM24 is provided between sub-bit lines SBL_i+4N and the line of ground voltage Vss. The gate of N-channel MOS transistor NM24 is configured to receive a common discharge signal DCR1 on both the positive side and the negative side.

(Operation Timing)

Figure 33:
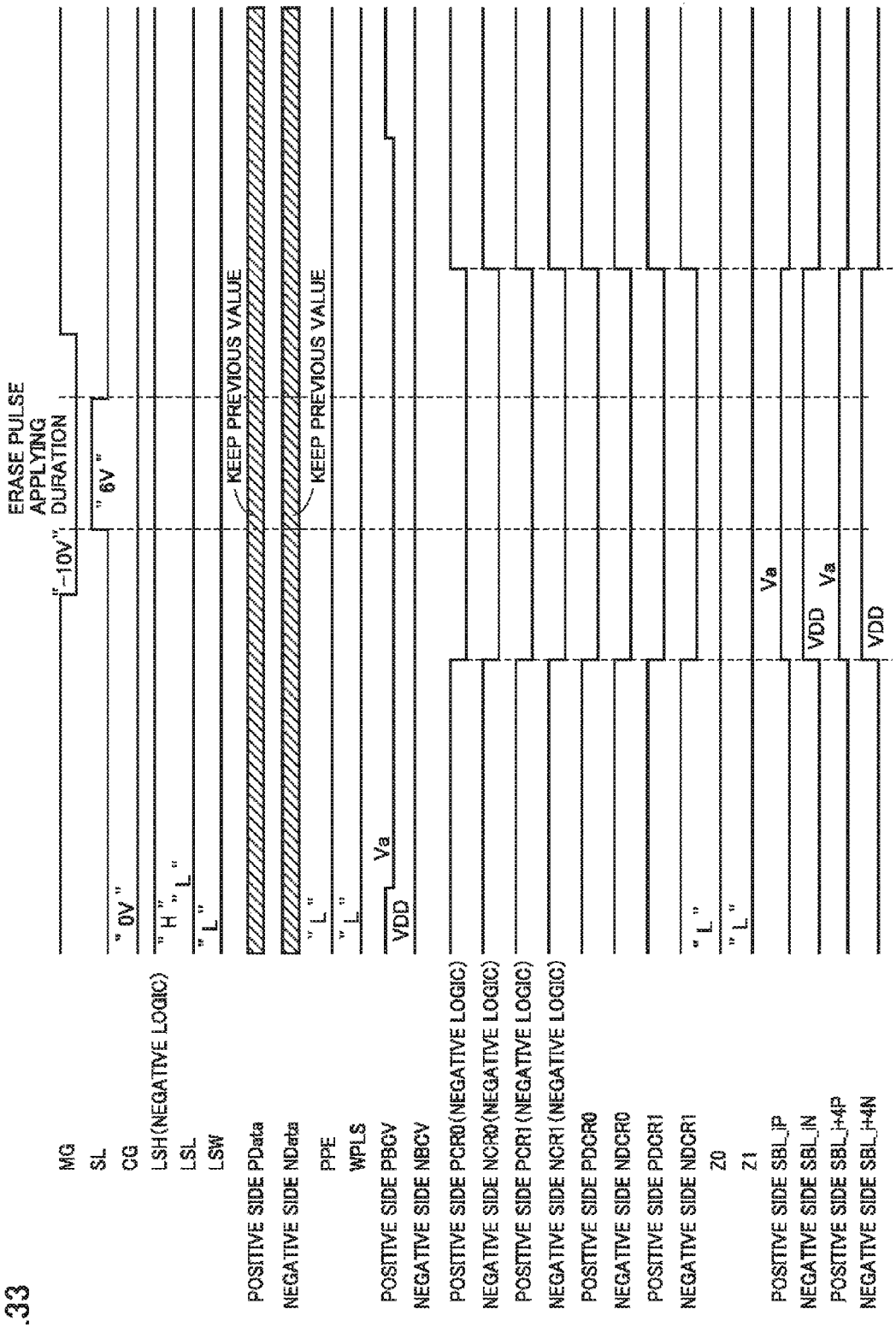
FIG. 33 is a diagram illustrating the operation timing where an erase pulse is applied to the twin cell data according to the seventh embodiment.

FIG. 33 is a diagram illustrating the operation timing of applying an erase pulse to the twin cell data according to the seventh embodiment.

Flash sequencer 7 sets programmed pulse-validating signal PPE to the "L" level, maintains writing pulse WPLS at the "L" level, maintains latch-setting high signal LSH at the "H" level, maintains latch-setting low signal LSL at the "L" level, and maintains latch switching signal LSW at the "L" level and ZMOS selection signals Z0 and Z1 at the "L" level.

Flash sequencer 7 changes the voltage applied to positive-side charge voltage line PBCV from VDD to Va (0<Va<VDD), and maintains the voltage applied to negative-side charge voltage line NBCV at VDD.

Then, flash sequencer 7 sets positive charge signals PCR0 and PCR1 to the "L" level, and sets negative charge signals NCR0 and NCR1 to the "L" level. Moreover, flash sequencer 7 sets positive discharge signals PDCR0 and PDCR1 to the "L" level, and sets negative discharge signals NDCR0 and NDCR1 to the "L" level.

Thus, in the sub-bit line voltage control circuits 76P0 to 76P3, P-channel MOS transistors PM21 and PM22 are turned on, N-channel MOS transistors NM21 and NM22 are turned off. As a result, the voltage of sub-bit lines SBL_iP and SBL_i+4P is equal to Va.

Meanwhile in sub-bit line voltage control circuits 76N0 to 76N3, P-channel MOS transistors PM23 and PM24 are turned on, and N-channel MOS transistors NM23 and NM24 are turned off. As a result, the voltage of each of sub-bit lines SBL_iN and SBL_i+4N is equal to VDD.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT erasure. Since the voltage of each of sub-bit lines SBL_0P to SBL_7P which are connected to positive cell MC1 is equal to Va and the voltage of each of sub-bit lines SBL_0N to SBL_7N which are connected to negative cell MC2 is equal to VDD, the erasing speed of positive cell MC1 is faster than that of negative cell MC2. Due to the different erasing speeds, the difference in threshold voltage Vth between twin cells MC1 and MC2 after erasure is independent on the twin cell data before erasure.

Next, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Then, flash sequencer 7 restores both positive charge signals PCR0 and PCR1 and negative charge signals NCR0 and NCR1 to the "H" level, and restores both positive discharge signals PDCR0 and PDCR1 and negative discharge signals NDCR0 and NDCR1 to the "H" level. As a result, each of sub-bit lines SBL_0P to SBL_0P and SBL_0N to SBL_7N is connected to the line of ground voltage Vss, and thereby the voltage of each of sub-bit lines SBL_0N to SBL_7N is restored to ground voltage Vss.

Thereafter, flash sequencer 7 restores the voltage applied to positive-side charge voltage line PBCV from Va to VDD.

As described above, in the present embodiment, the sub-bit line voltage control circuit sets the voltage of a bit line connected to the positive cell to Va (0<Va<VDD) and the voltage of a bit line connected to the negative cell to VDD during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

Eighth Embodiment

Figure 34:
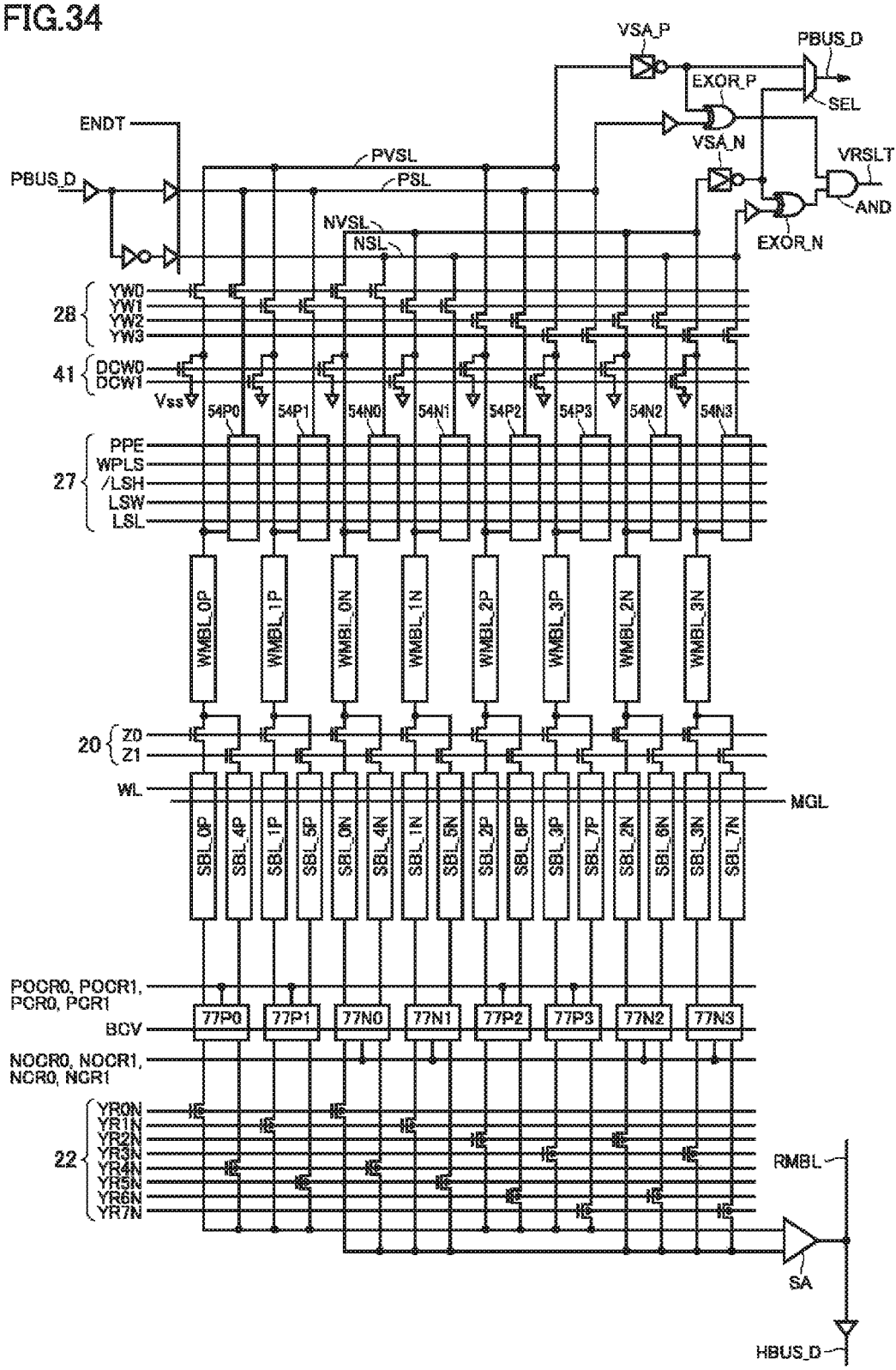
FIG. 34 is a diagram illustrating a detailed circuit configuration for reading, writing and erasing the twin cell data according to an eighth embodiment.

FIG. 34 is a diagram illustrating a detailed circuit configuration for reading, writing and erasing the twin cell data according to an eighth embodiment.

Sub-bit line voltage control circuits 75P0 to 75P3 and 75N0 to 75N3 in the circuit configuration of FIG. 26 are replaced by sub-bit line voltage control circuits 77P0 to 77P3 and 77N0 to 77N3 in the circuit configuration of FIG. 34.

Figure 35:
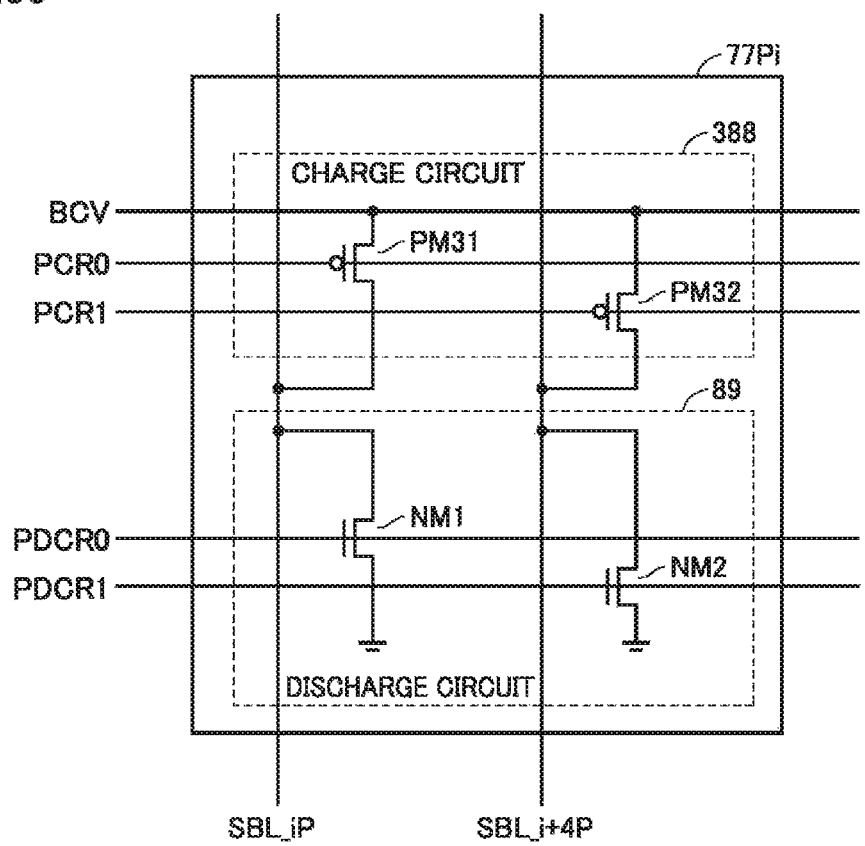
FIG. 35 is a diagram illustrating the configuration of a positive-side sub-bit line voltage control circuit according to the eighth embodiment.

FIG. 35 is a diagram illustrating the configuration of sub-bit line voltage control circuit 77Pi (i=0 to 3) according to the eighth embodiment. Sub-bit line voltage control circuit 77Pi of FIG. 35 differs from sub-bit line voltage control circuit 75Pi of FIG. 27 on the following points.

Charge circuit 88 in FIG. 27 is provided with P-channel MOS transistors PM1 and PM2, but charge circuit 388 in FIG. 35 is provided with P-channel MOS transistors PM31 and PM32. P-channel MOS transistor PM31 is provided between a common charge voltage line BCV on both the positive side and the negative side and sub-bit line SBL_iP. The gate of P-channel MOS transistor PM31 is configured to receive a positive charge signal PCR0. P-channel MOS transistor PM32 is provided between a common charge voltage line BCV on both the positive side and the negative side and sub-bit line SBL_i+4P. The gate of P-channel MOS transistor PM32 is configured to receive a positive charge signal PCR1. In the present embodiment, normally the voltage applied to charge voltage line BCV is set equal to VDD, and it is set to Va (0<Va<VDD) during the period of applying an erase pulse and a period before applying the erase pulse and a period after applying the erase pulse.

Figure 36:
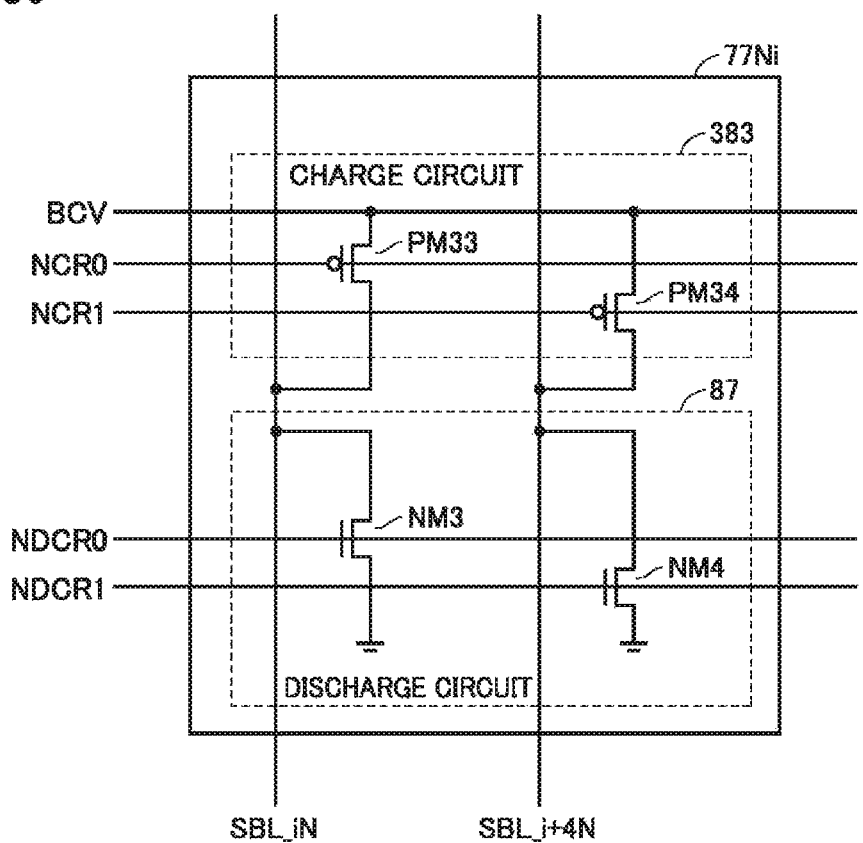
FIG. 36 is a diagram illustrating the configuration of a negative-side sub-bit line voltage control circuit according to the eighth embodiment.

FIG. 36 is a diagram illustrating the configuration of sub-bit line voltage control circuit 77Ni (i=0 to 3) according to the eighth embodiment. Sub-bit line voltage control circuit 77Ni of FIG. 36 differs from sub-bit line voltage control circuit 75Ni of FIG. 28 on the following points.

Charge circuit 86 in FIG. 28 is provided with P-channel MOS transistors PM3 and PM4, but charge circuit 383 in FIG. 36 is provided with P-channel MOS transistors PM33 and PM34. P-channel MOS transistor PM33 is provided between a common charge voltage line BCV on both the positive side and the negative side and sub-bit line SBL_iN.

The gate of P-channel MOS transistor PM33 is configured to receive a negative charge signal NCR0. P-channel MOS transistor PM34 is provided between a common charge voltage line BCV on both the positive side and the negative side and sub-bit lines SBL_i+4N. The gate of P-channel MOS transistor PM34 is configured to receive a negative charge signal NCR1.

(Operation Timing)

Figure 37:
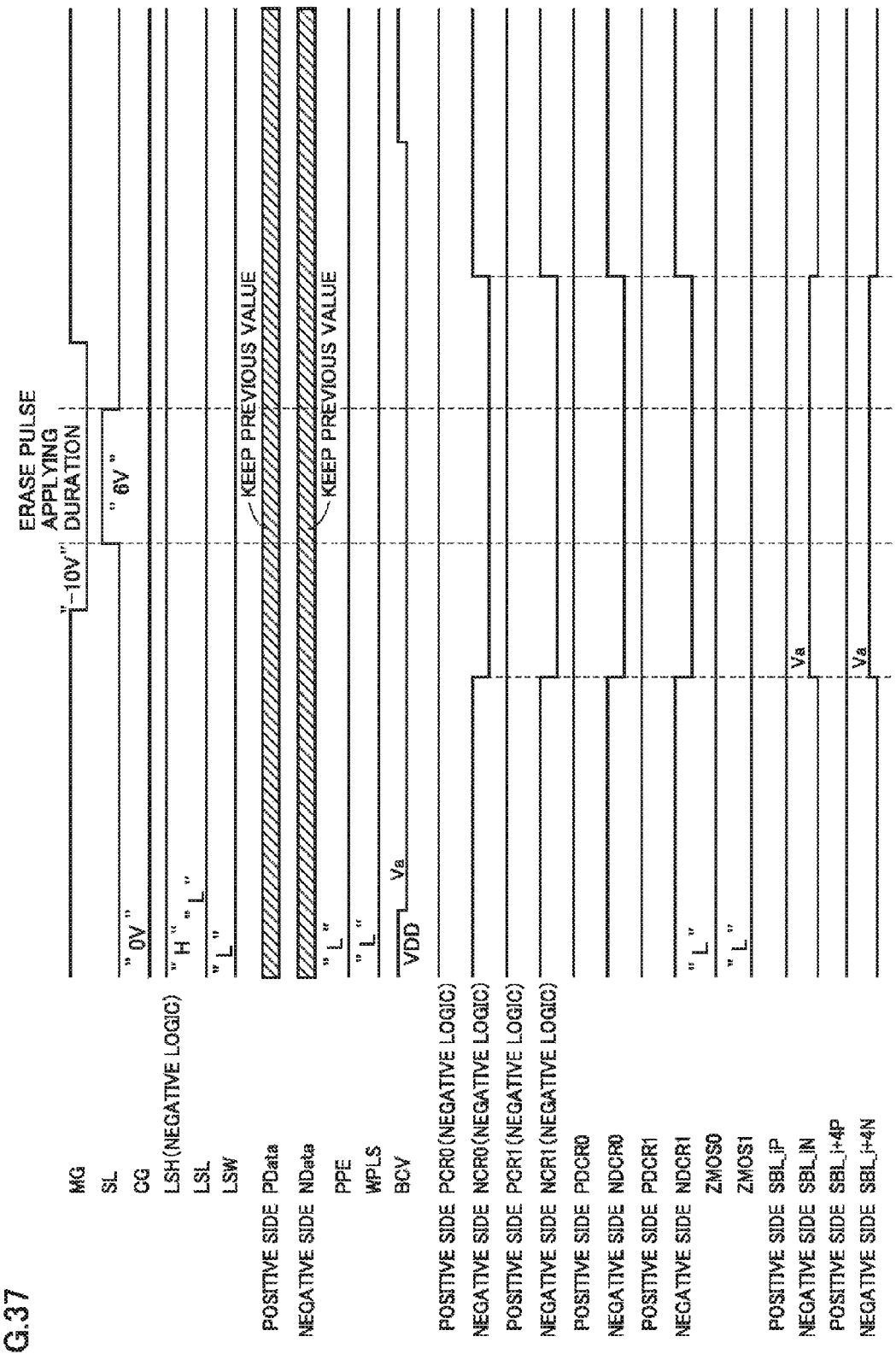
FIG. 37 is a diagram illustrating the operation timing where an erase pulse is applied to the twin cell data according to the eighth embodiment.

FIG. 37 is a diagram illustrating the operation timing of applying an erase pulse to the twin cell data according to the eighth embodiment.

Flash sequencer 7 sets programmed pulse-validating signal PPE to the "L" level, maintains writing pulse WPLS at the "L" level, maintains latch-setting high signal LSH at the "H" level, maintains latch-setting low signal LSL at the "L" level, and maintains latch switching signal LSW at the "L" level and ZMOS selection signals Z0 and Z1 at the "L" level.

Then, flash sequencer 7 changes the voltage applied to charge voltage line BCV connected to P-channel MOS transistors PM31, PM32, PM33, PM34 and P35 from VDD to Va (0<Va<VDD).

Next, flash sequencer 7 maintains positive charge signals PCR0 and PCR1 at the "H" level, and sets negative charge signals NCR0 and NCR1 to the "L" level. Moreover, flash sequencer 7 maintains positive discharge signals PDCR0 and PDCR1 at the "H" level, sets negative discharge signals NDCR0 and NDCR1 to the "L" level.

Thus, in sub-bit line voltage control circuits 77P0 to 77P3, P-channel MOS transistors PM31 and PM32 are turned off, and N-channel MOS transistors NM1 and NM2 are turned off. As a result, the voltage of each of sub-bit lines SBL_iP and SBL_i+4P is equal to ground voltage Vss.

Meanwhile in the sub-bit line voltage control circuits 77N0 to 77N3, P-channel MOS transistors PM33 and PM34 are turned on, and N-channel MOS transistors NM3 and NM4 are turned off. As a result, the voltage of each of sub-bit lines SBL_iN and SBL_i+4N is equal to Va.

Then, flash sequencer 7 sets the voltage of memory gate MG to the erase pulse applying voltage (−10V) and the voltage of source line SL to the erase pulse applying voltage (6V), and maintains the voltage of control gate CG at 0V.

Thus, an erase pulse is applied to memory cells MC1 and MC2 to initialize a BTBT erasure. Since the voltage of each of sub-bit lines SBL_0P to SBL_7P which are connected to positive cell MC1 is equal to Vss and the voltage of each of sub-bit lines SBL_0N to SBL_7N which are connected to negative cell MC2 is equal to Va (0<Va<VDD), the erasing speed of positive cell MC1 is faster than that of negative cell MC2. Due to the different erasing speeds, the difference in threshold voltage Vth between twin cells MC1 and MC2 after erasure is independent on the twin cell data before erasure.

Next, flash sequencer 7 restores the voltage of source line SL to the voltage when it is not selected (0V). Thus, the application of erase pulse to memory cells MC1 and MC2 is finished, and the BTBT erasure is finished. Meanwhile, flash sequencer 7 restores the voltage of memory gate MG to the voltage when it is not selected (0V).

Thereafter, flash sequencer 7 restores negative charge signals NCR0 and NCR1 to the "H" level, and restores negative discharge signals NDCR0 and NDCR1 to the "H" level. As a result, sub-bit lines SBL_0P to SBL_0P and SBL_0N to SBL_7N are connected to the line of ground voltage Vss, and thereby, the voltage of each of sub-bit lines SBL_0N to SBL_7N is restored to ground voltage Vss.

Then, flash sequencer 7 restores the voltage applied to charge voltage line BCV from Va to VDD.

As described above, in the present embodiment, the sub-bit line voltage control circuit sets the voltage of a bit line connected to the positive cell to Vss and the voltage of a bit line connected to the negative cell to Va (0<Va<VDD) during the application of erase pulse for erasing the twin cell data, the erasing speed (the decreasing rate of threshold voltage Vth) of the positive cell is faster than the erasing speed of the negative cell. Thereby, it is possible to prevent the data previously stored in the twin cell from being read out after erasure.

Ninth Embodiment

In the first embodiment to the eighth embodiment, the voltage of control gate CG during the application of erase pulse is set to 0V, however, in the present embodiment, the voltage of control gate CG during the application of erase pulse is set to Vb (0<Vb<VDD).

In the present embodiment, Vb (0<Vb<VDD) is applied to control gate CG. During the application of erase pulse, control gate CG is turned on partially, and the voltage of bit line SBL is transmitted effectively to the bottom of memory gate MG. As a result, the effects of the potential difference between sub-bit lines SBL_iP and SBL_iN on the difference in the erasing speed between memory cells MC1 and MC2 can be increased.

(Operation Timing)

Figure 38:
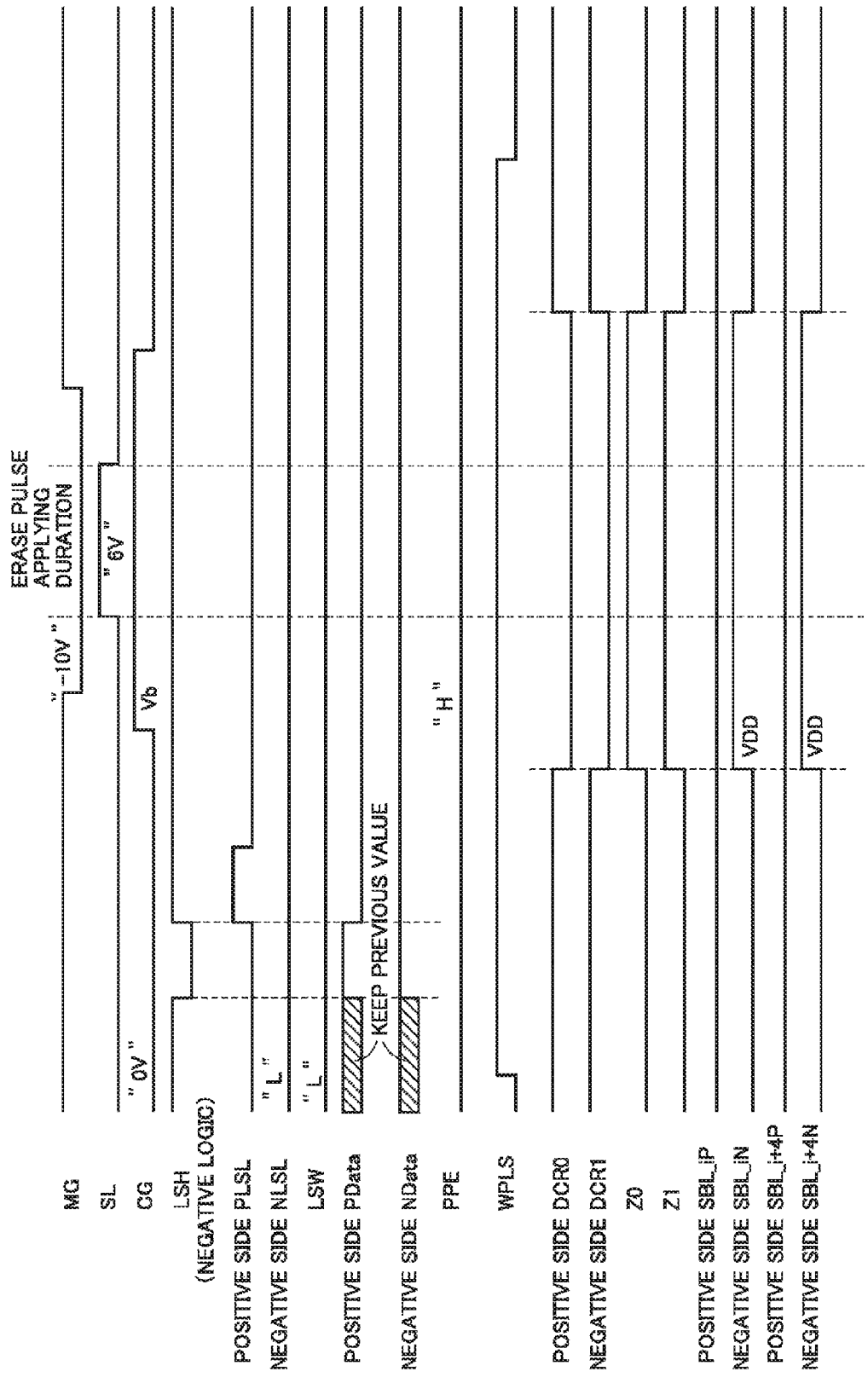
FIG. 38 is a diagram illustrating the operation timing where an erase pulse is applied to the twin cell data according to a ninth embodiment.

FIG. 38 is a diagram illustrating the operation timing where an erase pulse is applied to the twin cell data according to the ninth embodiment. The present embodiment is described as a modification of the second embodiment, the same modification may be applied to the other embodiments.

FIG. 38 differs from the operation timing in FIG. 13 according to the second embodiment in that flash sequencer 7 sets the voltage of control gate CG to Vb (0<Vb<VDD) during the application of erase pulse in FIG. 38. Thereby, as described above, the difference in the erasing speed between memory cells MC1 and MC2 can be increased, making it possible to enhance the security.

The present invention is not limited to the above modification, it may include the following modifications.

(1) Switching Control

In the present modification, upon receiving a request for erasing the twin cell data, the voltage of sub-bit line SBL_iP which is connected to positive cell MC1 is made different from the voltage of sub-bit line SBL_iN which is connected to negative cell MC2, but the present invention is not limited thereto.

For example, the semiconductor device may include a function to make the voltage of sub-bit line SBL_iP different from the voltage of sub-bit line SBL_iN connected to negative cell MC2 as described above and a function to make the voltage of sub-bit line SBL_iP identical to the voltage of sub-bit line SBL_iN connected to negative cell MC2, and may switch to one of the two functions upon receiving a request for erasing the twin cell data.

(2) Voltage Applied to Bit Line

In the present modification, the voltage applied to a sub-bit line connected to positive cell MC1 is made lower than the voltage applied to a sub-bit line connected to negative cell MC2 so as to make the erasing speed of positive cell MC1 faster than that of negative cell MC2, but the present invention is not limited thereto.

FIG. 39(*a*) is a diagram illustrating a sequence of erasing the twin cell data "0" when the voltage applied to a bit line BL which is connected to positive cell MC1 is higher than the voltage of a bit line BL which is connected to negative cell MC2.

As illustrated in FIG. 39(*a*), during the erasure of the twin cell data "0", both cells are turned into the initialization state where both cells hold the cell data "1". Before erasure of the twin cell data, threshold voltage Vth of positive cell MC1 is higher than threshold voltage Vth of negative cell MC2. Since the erasing speed (that is, the decreasing rate of threshold voltage Vth) of negative cell MC2 is faster than that of positive cell MC1, and such relation will be maintained even after the erasure, if a read-out is performed under this condition, the previously existed twin cell data "0" will be read out.

FIG. 39(*b*) is a diagram illustrating a sequence of erasing the twin cell data "1" when the voltage applied to a bit line BL which is connected to positive cell MC1 is higher than the voltage of a bit line BL which is connected to negative cell MC2.

As illustrated in FIG. 39(*b*), during the erasure of the twin cell data "0", both cells are turned into the initialization state where both cells hold the cell data "1". Before erasure of the twin cell data, threshold voltage Vth of negative cell MC2 is higher than threshold voltage Vth of positive cell MC1. However, since the erasing speed (that is, the decreasing rate of threshold voltage Vth) of negative cell MC2 is faster than that of positive cell MC1, and after the erasure, such relation will be inverted. If a read-out is performed under this condition, the data will be read out as "0" which is different from the previously existed twin cell data "1".

Thus, either in the case where the twin cell data is "0" or in the case where the twin cell data is "1", after erasure of the twin cell data, data "0" will be read out, which makes it impossible to identify the data previously held in the twin cell.

Therefore, during the application of erase pulse, if the voltage of sub-bit line SBL_iP which is connected to positive cell MC1 is made different from the voltage of sub-bit line SBL_iN which is connected to negative cell MC2, despite whether sub-bit line SBL_iP or sub-bit line SBL_iN has the larger voltage, it is possible to ensure the security of the twin cell data which has been erased. In addition, the relation whether sub-bit line SBL_iP or sub-bit line SBL_iN has the larger voltage is not fixed, it may be set randomly. The relation which one has a large voltage may be set fixedly or randomly for each pair of a plurality of twin cells.

Furthermore, as illustrated in FIG. 8, the embodiments of the present invention are made based on the observation result that the lower the voltage applied to a bit line BL is, the faster the rate at which threshold voltage Vth decreases will be. However, even in the case where the higher the voltage applied to a bit line BL is, the faster the rate at which threshold voltage Vth decreases will be, the configuration and method for erasing the twin cell data described in any embodiment of the present invention is applicable. This is because that the configuration and method of erasing the twin cell data according to an embodiment of the present invention simply differentiate the voltage of sub-bit line SBL_iP and the voltage of sub-bit line SBL_iN to ensure the security of the twin cell data regardless of which one is greater.

(3) CMOS Switch Configuration

Figure 40:
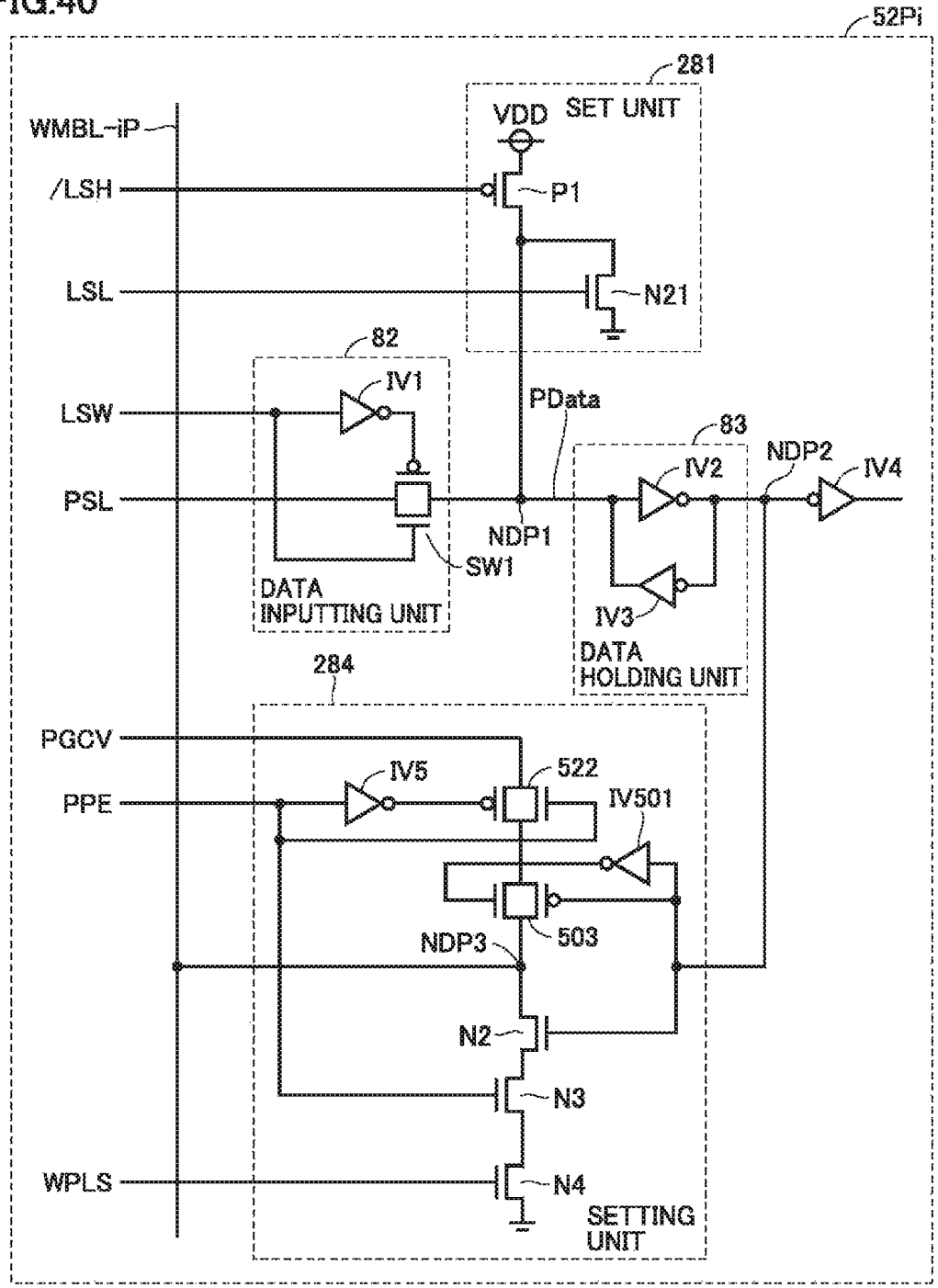
FIG. 40 is a diagram illustrating a modified configuration of the positive-side main bit line voltage control circuit according to the third embodiment.

P-channel MOS transistors P22 and P3 in FIG. 15 used in a condition where a set voltage Va is lower than a threshold voltage |Vthp| of P-channel MOS transistors P22 and P3 each is replaced by a CMOS switch configuration as illustrated in FIG. 40. In other words, a CMOS transfer gate 522 is used to replace P-channel MOS transistor P22, and a CMOS transfer gate 503 is used to replace P-channel MOS transistor P3.

The gate of a P-channel MOS transistor constituting CMOS transfer gate 522 receives an output from inverter IV5, and the gate of a N-channel MOS transistor constituting CMOS transfer gate 522 receives a programmed pulse-validating signal PPE.

The gate of a P-channel MOS transistor constituting CMOS transfer gate 503 receives a voltage from node NDP2, and the gate of a N-channel MOS transistor constituting CMOS transfer gate 503 receives an output from inverter IV501 configured to invert the voltage from node NDP2.

Similarly, P-channel MOS transistors P25 and P6 in FIG. 16 used in a condition where a set voltage Vb is lower than a threshold voltage |Vthp| of P-channel MOS transistors P25 and P6 each is replaced by a CMOS switch configuration.

Similarly, P-channel MOS transistors P32 and P3 in FIG. 19 used in a condition where a set voltage Va is lower than a threshold voltage |Vthp| of P-channel MOS transistors P32 and P3 each is replaced by a CMOS switch configuration.

Similarly, P-channel MOS transistors P35 and P6 in FIG. 20 used in a condition where a set voltage Va is lower than a threshold voltage |Vthp| of P-channel MOS transistors P35 and P6 each is replaced by a CMOS switch configuration.

Similarly, P-channel MOS transistors PM21 and PM22 in FIG. 31 used in a condition where a set voltage Va is lower than a threshold voltage |Vthp| of P-channel MOS transistors PM21 and PM22 each is replaced by a CMOS switch configuration. 233 Similarly, P-channel MOS transistors PM23 and PM24 in FIG. 32 used in a condition where a set voltage Va is lower than a threshold voltage |Vthp| of P-channel MOS transistors PM23 and PM24 each is replaced by a CMOS switch configuration.

Although the present invention made by the inventors has been concretely described based on the embodiments, it is needless to say that the present invention is not limited to the embodiments, and it may be modified within the scope without departing from the gist thereof.

REFERENCE SIGNS LIST

1: microcomputer (MCU); 2: central processing unit (CPU); 3: Direct memory access controller (DMAC); 4: bus interface circuit (BIF); 5: random access memory (RAM); 6: flash memory module (FMDL); 7: flash sequencer (FSQC); 8, 9: external I/O port (PRT); 10: timer (TMR); 11: clock pulse generator (CPG); 19, 100: memory array (MARY); 20: sub-bit line selector; 22: read column selector; 24: first row decoder (RDEC1); 25: second row decoder (RDEC2); 28: rewrite column selector; 29: I/O circuit (IOBUS); 30: column decoder (CDEC); 31: power supply circuit (VPG); 32: timing generator (TMG); 40: reading system discharge circuit; 41: writing system discharge circuit; 81, 91, 281, 291: set unit; 82, 92: data inputting unit; 83, 93: data holding unit; 84, 94, 284, 294, 384, 394: setting unit; 86, 88, 286, 288, 386, 388: charge circuit; 87, 89, 287, 289: discharge circuit; 100: semiconductor device; 101: memory array; 102: first memory element; 103: second memory element; 104: twin cell; 105: voltage control circuit; 51Pi, 51Ni, 52Pi, 52Ni, 53Pi, 53Ni, 54Pi, 54Ni: main bit line voltage control circuit; 75Pi, 75Ni, 76Pi, 76Ni, 77Pi, 77Ni: sub-bit line voltage control circuit; P1 to P6, P22, P25, P32, P35, PM1 to PM4, PM21 to PM24, PM31 to PM34: P-channel MOS transistor; N1 to N8, N21, N25, NM1 to NM4, NM21 to NM24: N-channel MOS transistor; IV1 to IV10, IV501: inverter; SW1, SW2 switch; VSA_P, VSA_N: verify sense amplifier; PVSL, NVSL: verification signal line; PSL, NSL: signal line; HACSP: high-speed access port; LACSP: low-speed access port; MC1, MC2: non-volatile memory cell; WMBL: writing main bit line; WMBL_0P to WMBL_3P: main bit line on positive cell side; WMBL_0N to WMBL_3N: main bit line on negative cell side; SBL: sub-bit line; SBL_0P to SBL_0P: sub-bit line on positive cell side; SBL_0N to SBL_ON: sub-bit line on negative cell side; WL: word line; MGL: memory gate selection line; HBUS: high-speed bus; HBUS_D: high-speed data bus; PBUS: peripheral bus; PBUS_D: peripheral data bus; 503, 531: CMOS transfer gate

The invention claimed is:

1. A semiconductor device comprising:
a memory array including a plurality of twin cells, each of which is composed of a first memory element and a second memory element which are each electrically rewritable and configured to memorize binary data according to a difference in threshold voltages therebetween; and
a voltage control circuit configured to increase, upon receiving a request for erasing data in a twin cell, both the threshold voltage of the first memory element and the threshold voltage of the second memory element during the pre-writing, and after the pre-writing, differentiate the voltage of a first bit line which is connected to the first memory element and the voltage of a second bit line which is connected to the second memory element during the application of erase pulse.

2. The semiconductor device according to claim 1, wherein
the voltage control circuit includes
a first bit line voltage control circuit configured to latch write-in data provided from the external side during the writing of the twin cell data, and supply a writing current to the first bit line so as to change the threshold voltage of the first memory element based on the latched value, and
a second bit line voltage control circuit configured to latch inverted write-in data provided from the external side during the writing of the twin cell data, and supply a writing current to the second bit line so as to change the threshold voltage of the second memory element based on the latched value,
the first bit line voltage control circuit sets the voltage of the first bit line to a ground voltage during the application of erase pulse,
the second bit line voltage control circuit sets the voltage of the second bit line to a power supply voltage VDD during the application of erase pulse.

3. The semiconductor device according to claim 2, further comprising a first main bit line connected to a plurality of the first bit lines, and a second main bit line connected to a plurality of the second bit lines, wherein
the first bit line voltage control circuit includes
a first set unit configured to receive a first latch-setting signal,
a first holding unit configured to hold a level in response to the level of the first latch-setting signal, and
a first setting unit configured to set the voltage of the first main bit line to the power supply voltage VDD or the ground voltage based on the level held in the first holding unit, the first latch-setting signal is at a level where the voltage of the first main bit line is set to the ground voltage during the application of erase pulse, the second bit line voltage control circuit includes
a second set unit configured to receive a second latch-setting signal,
a second holding unit configured to hold a level in response to the level of the second latch-setting signal, and
a second setting unit configured to set the voltage of the second main bit line to the power supply voltage VDD or the ground voltage based on the level held in the second holding unit,
the second latch-setting signal is at a level where the voltage of the second main bit line is set to the power supply voltage VDD during the application of erase pulse.

4. The semiconductor device according to claim 2, further comprising a first main bit line connected to a plurality of the first bit lines, and a second main bit line connected to a plurality of the second bit lines, wherein
the first bit line voltage control circuit includes
a first holding unit configured to hold a level in response to the level of an input first data, and
a first setting unit configured to set the voltage of the first main bit line to the power supply voltage VDD or the ground voltage based on the level held in the first holding unit,
the first data is at a level where the voltage of the first main bit line is set to the ground voltage during the application of erase pulse,
the second bit line voltage control circuit includes
a second holding unit configured to hold a level in response to the level of an input second data which is reverse to the level of the first data, and
a second setting unit configured to set the voltage of the second main bit line to the power supply voltage VDD or the ground voltage based on the level held in the second holding unit,
the second data is at a level where the voltage of the second main bit line is set to the power supply voltage VDD during the application of erase pulse.

5. The semiconductor device according to claim 1, wherein
the voltage control circuit includes
a first bit line voltage control circuit configured to latch write-in data provided from the external side during the writing of the twin cell data, and supply a writing current to the first bit line so as to change the threshold voltage of the first memory element based on the latched value, and
a second bit line voltage control circuit configured to latch write-in data provided from the external side during the writing of the twin cell data, and supply a writing current to the second bit line so as to change the threshold voltage of the second memory element based on the latched value,
the first bit line voltage control circuit sets the voltage of the first bit line to a first voltage which is lower than a power supply voltage VDD and higher than the ground voltage during the application of erase pulse,
the second bit line voltage control circuit sets the voltage of the second bit line to the power supply voltage VDD during the application of erase pulse.

6. The semiconductor device according to claim 5, further comprising a first main bit line connected to a plurality of the first bit lines, and a second main bit line connected to a plurality of the second bit lines, wherein
the first bit line voltage control circuit includes
a first set unit configured to receive a latch-setting signal, a first holding unit configured to hold a level in response to the level of the latch-setting signal, and
a first setting unit configured to set the voltage of the first main bit line to the first voltage or the ground voltage based on the level held in the first holding unit,
the second bit line voltage control circuit includes
a second set unit configured to receive a latch-setting signal,
a second holding unit configured to hold a level in response to the level of the latch-setting signal, and
a second setting unit configured to set the voltage of the second main bit line to the power supply voltage VDD or the ground voltage based on the level held in the second holding unit,
the latch-setting signal is at a level where the voltage of the first main bit line is set to the first voltage and the voltage of the second main bit line is set to the power supply voltage VDD during the application of erase pulse.

7. The semiconductor device according to claim 1, wherein
the voltage control circuit includes
a first bit line voltage control circuit configured to latch write-in data provided from the external side during the writing of the twin cell data, and supply a writing current to the first bit line so as to change the threshold voltage of the first memory element based on the latched value, and
a second bit line voltage control circuit configured to latch write-in data provided from the external side during the writing of the twin cell data, and supply a writing current to the second bit line so as to change the threshold voltage of the second memory element based on the latched value,
the first bit line voltage control circuit sets the voltage of the first bit line to a ground voltage during the application of erase pulse,
the second bit line voltage control circuit sets the voltage of the second bit line to a first voltage which is lower than the power supply voltage VDD and higher than the ground voltage during the application of erase pulse.

8. The semiconductor device according to claim 7, further comprising a first main bit line connected to a plurality of the first bit lines, and a second main bit line connected to a plurality of the second bit lines, wherein
the first bit line voltage control circuit includes
a first set unit configured to receive a first latch-setting signal,
a first holding unit configured to hold a level in response to the level of the first latch-setting signal, and
a first setting unit configured to set the voltage of the first main bit line to the first voltage or the ground voltage based on the level held in the first holding unit,
the first latch-setting signal is at a level where the voltage of the first main bit line is set to the ground voltage during the application of erase pulse,
the second bit line voltage control circuit includes
a second set unit configured to receive a second latch-setting signal, a second holding unit configured to hold a level in response to the level of the second latch-setting signal, and a second setting unit configured to set the voltage of the second main bit line to the first voltage or the ground voltage based on the level held in the second holding unit, the second latch-setting signal is at a level where the voltage of the second main bit line is set to the first voltage during the application of erase pulse.

9. The semiconductor device according to claim 1, wherein the voltage control circuit includes a first bit line voltage control circuit configured to set the voltage of a first bit line which is not selected yet to the ground voltage during the reading of the twin cell data, and a second bit line voltage control circuit configured to set the voltage of a second bit line which is not selected yet to the ground voltage during the reading of the twin cell data, the first bit line voltage control circuit sets the voltage of the first bit line to the ground voltage during the application of erase pulse, and the second bit line voltage control circuit sets the voltage of the second bit line to the power supply voltage VDD during the application of erase pulse.

10. The semiconductor device according to claim 1, wherein the voltage control circuit includes a first bit line voltage control circuit configured to set the voltage of a first bit line which is not selected yet to the ground voltage during the reading of the twin cell data, and a second bit line voltage control circuit configured to set the voltage of a second bit line which is not selected yet to the ground voltage during the reading of the twin cell data, the first bit line voltage control circuit sets the voltage of the first bit line to a first voltage which is lower than the power supply voltage VDD and higher than the ground voltage during the application of erase pulse, and the second bit line voltage control circuit sets the voltage of the second bit line to the power supply voltage VDD during the application of erase pulse.

11. The semiconductor device according to claim 1, wherein the voltage control circuit includes a first bit line voltage control circuit configured to set the voltage of a first bit line which is not selected yet to the ground voltage during the reading of the twin cell data, and a second bit line voltage control circuit configured to set the voltage of a second bit line which is not selected yet to the ground voltage during the reading of the twin cell data, the first bit line voltage control circuit sets the voltage of the first bit line to the ground voltage during the application of erase pulse, and the second bit line voltage control circuit sets the voltage of the first bit line to a first voltage which is lower than the power supply voltage VDD and higher than the ground voltage during the application of erase pulse.

12. The semiconductor device according to claim 1, further comprising a power supply circuit configured to supply a voltage to a memory gate, a control gate and a source line of each of the first memory element and the second memory element, wherein the power supply circuit supplies a voltage which is higher than the ground voltage and lower than the power supply voltage VDD to the control gate during the application of erase pulse.

* * * * *